US009679651B2

(12) United States Patent
Shirakawa

(10) Patent No.: US 9,679,651 B2
(45) Date of Patent: Jun. 13, 2017

(54) SEMICONDUCTOR MEMORY DEVICE CAPABLE OF DETERMINING AN INITIAL PROGRAM CONDITION FOR DIFFERENT MEMORY CELLS

(71) Applicant: KABUSHIKI KAISHA TOSHIBA, Tokyo (JP)

(72) Inventor: Masanobu Shirakawa, Chigasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/633,033

(22) Filed: Feb. 26, 2015

(65) Prior Publication Data

US 2016/0078948 A1    Mar. 17, 2016

(30) Foreign Application Priority Data

Sep. 12, 2014   (JP) .................................. 2014-187040

(51) Int. Cl.
*G11C 16/10*   (2006.01)
*G11C 16/04*   (2006.01)
*G11C 11/56*   (2006.01)

(52) U.S. Cl.
CPC .......... *G11C 16/10* (2013.01); *G11C 11/5628* (2013.01); *G11C 16/0483* (2013.01)

(58) Field of Classification Search
CPC ............ G11C 16/0483; G11C 16/3427; G11C 16/3418; G11C 16/12; G11C 16/34; G11C 16/10
See application file for complete search history.

(56) References Cited

U.S. PATENT DOCUMENTS

| 7,515,499 B2* | 4/2009 | Saito | G11C 16/10 365/185.09 |
| 8,570,802 B2* | 10/2013 | Shirakawa | G11C 16/0483 365/185.03 |
| 2008/0062765 A1 | 3/2008 | Tu et al. | |
| 2008/0062785 A1 | 3/2008 | Li et al. | |
| 2012/0287710 A1 | 11/2012 | Shirakawa | |
| 2013/0058166 A1 | 3/2013 | Maejima | |

FOREIGN PATENT DOCUMENTS

| JP | 2012-238363 A | 12/2012 |
| TW | 200937430 A | 9/2009 |

OTHER PUBLICATIONS

TW Office Action dated May 25, 2016 for Application No. 104106894.
English Translation of TW Office Action dated May 25, 2016 for Application No. 104106894.

* cited by examiner

*Primary Examiner* — Andrew Q Tran
(74) *Attorney, Agent, or Firm* — Patterson & Sheridan, LLP

(57) ABSTRACT

A semiconductor memory device includes a first memory string including a first memory cell and a second memory cell, a second memory string including a third memory cell, a bit line connected to both one end of the first memory string and one end of the second memory string, a first word line connected to gates of the first and third memory cells, a second word line connected to a gate of the second memory cell, and a control circuit configured to determine a program condition of the first memory cell that have been selected for a write operation, and perform the write operation for the third memory cell based on the program condition of the first memory cell.

15 Claims, 37 Drawing Sheets

FIG. 33

| | Lower page | Upper page |
|---|---|---|
| WL127 | Page 253 — 422c: FLAG DATA CORRESPONDING TO PAGE 253 / 422d: FLAG DATA CORRESPONDING TO PAGE 251 | Page 255 — 422c: FLAG DATA CORRESPONDING TO PAGE 253 / 422d: FLAG DATA CORRESPONDING TO PAGE 251 |
| WL126 | Page 251 — 422c: FLAG DATA CORRESPONDING TO PAGE 251 / 422d: FLAG DATA CORRESPONDING TO PAGE 249 | Page 254 — 422c: FLAG DATA CORRESPONDING TO PAGE 253 / 422d: FLAG DATA CORRESPONDING TO PAGE 251 |
| WL125 | Page 249 — 422c: FLAG DATA CORRESPONDING TO PAGE 249 / 422d: FLAG DATA CORRESPONDING TO PAGE 247 | Page 252 — 422c: FLAG DATA CORRESPONDING TO PAGE 251 / 422d: FLAG DATA CORRESPONDING TO PAGE 249 |
| ..... | ..... | ..... |
| WL3 | Page 5 — 422c: FLAG DATA CORRESPONDING TO PAGE 5 / 422d: FLAG DATA CORRESPONDING TO PAGE 3 | Page 8 — 422c: FLAG DATA CORRESPONDING TO PAGE 7 / 422d: FLAG DATA CORRESPONDING TO PAGE 5 |
| WL2 | Page 3 — 422c: FLAG DATA CORRESPONDING TO PAGE 3 / 422d: FLAG DATA CORRESPONDING TO PAGE 1 | Page 6 — 422c: FLAG DATA CORRESPONDING TO PAGE 5 / 422d: FLAG DATA CORRESPONDING TO PAGE 3 |
| WL1 | Page 1 — 422c: FLAG DATA CORRESPONDING TO PAGE 1 / 422d: FLAG DATA CORRESPONDING TO PAGE 0 | Page 4 — 422c: FLAG DATA CORRESPONDING TO PAGE 3 / 422d: FLAG DATA CORRESPONDING TO PAGE 1 |
| WL0 | Page 0 — 422c: FLAG DATA CORRESPONDING TO PAGE 0 / 422d: FF | Page 2 — 422c: FLAG DATA CORRESPONDING TO PAGE 1 / 422d: FLAG DATA CORRESPONDING TO PAGE 0 |

SEMICONDUCTOR MEMORY DEVICE CAPABLE OF DETERMINING AN INITIAL PROGRAM CONDITION FOR DIFFERENT MEMORY CELLS

CROSS-REFERENCE TO RELATED APPLICATION

This application is based upon and claims the benefit of priority from Japanese Patent Application No. 2014-187040, filed Sep. 12, 2014, the entire contents of which are incorporated herein by reference.

FIELD

Embodiments described herein relate generally to a semiconductor memory device.

BACKGROUND

In recent years, as an approach to improve a bit density of a NAND flash memory, a three-dimensional stacked NAND flash memory in which a memory cell transistor is stacked above a semiconductor substrate, that is, a bit-cost scalable (BiCS) flash memory is suggested.

DESCRIPTION OF THE DRAWINGS

FIG. 33 is a diagram showing the outline of a program operation according to the fourth embodiment.

DETAILED DESCRIPTION

Figure 1:
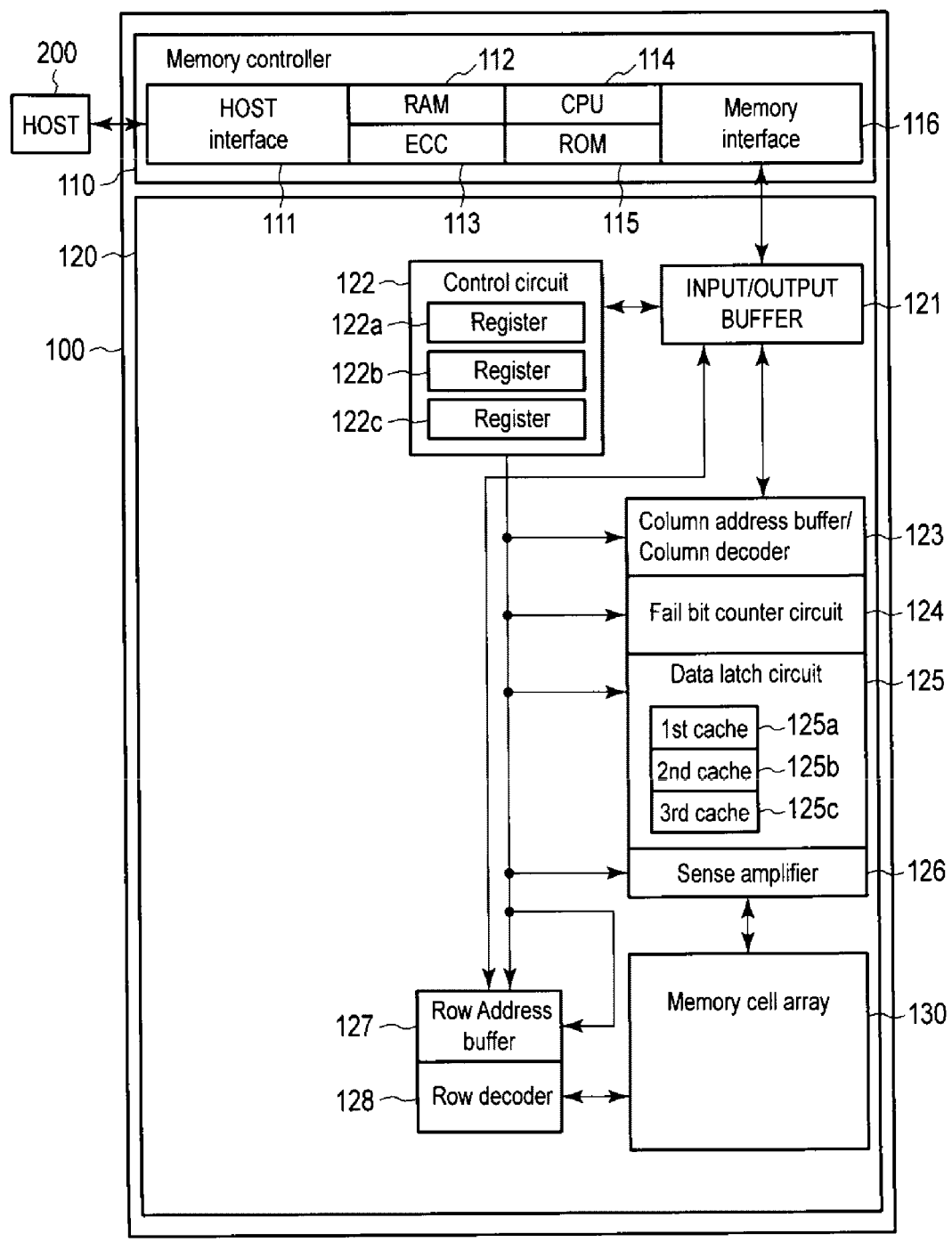
FIG. 1 is a block diagram showing a memory system according to a first embodiment.

The present embodiment now will be described more fully hereinafter with reference to the accompanying drawings, in which various embodiments are shown. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to limit the scope of the invention. As used herein, the singular forms "a," "an" and "the" are intended to include the plurality of forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross section and perspective illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Embodiments provide a high-quality semiconductor memory device.

In general, according to one embodiment, a semiconductor memory device includes a first memory string including a first memory cell and a second memory cell, a second memory string including a third memory cell, a bit line connected to both one end of the first memory string and one end of the second memory string, a first word line connected to gates of the first and third memory cells, a second word line connected to a gate of the second memory cell, and a control circuit configured to determine a program condition of the first memory cell that have been selected for a write operation, and perform the write operation for the third memory cell based on the program condition of the first memory cell. According to one embodiment, a memory system includes a memory device including a first memory string including a first memory cell and a second memory cell, a second memory string including a third memory cell, a bit line connected to both one end of the first memory string and one end of the second memory string, a first word line connected to gates of the first and third memory cells, a second word line connected to a gate of the second memory cell, and a first controller configured to determine a program condition of the first memory cell when the device receives a first command and a first address before receiving a write command for the third memory cell, the first address corresponding to the first memory cell, the first controller being configured to perform the write operation for the third memory cell based on the program condition of the first memory cell, and a second controller configured to output the first command and the first address before receiving the write command for the third memory cell.

Embodiments will be described below referring to the drawings. The structural elements having substantially the same functions and configurations will be given the same notations, and duplicate description will be provided only when necessary. In addition, each embodiment described below illustrates devices and methods to embody the technical idea of this embodiment, and the technical idea of the embodiment is not limited to the following component materials, shapes, structures, dispositions or the like. The technical idea of the embodiment may be modified in various forms within the scope of the claims.

Hereinafter, respective embodiments will be described as to a three-dimensional stacked NAND flash memory as an example of a NAND flash memory.

First Embodiment

Memory System

A memory system according to a first embodiment will be described referring to FIG. 1.

A memory system 100 of the first embodiment has a memory controller 110 and a NAND flash memory (nonvolatile semiconductor memory device) 120. The memory system 100 may include a host device 200.

Memory Controller

A memory controller 110 includes a host interface 111, a random access memory (RAM) 112, an error correcting code (ECC) circuit 113, a central processing unit (CPU) 114, a read only memory (ROM) 115, and a flash memory interface 116.

The memory controller 110 outputs a command or the like necessary for the operation of the NAND flash memory 120, to the NAND flash memory 120. The memory controller 110 outputs the command to the NAND flash memory 120 to read data from the NAND flash memory 120, to write data in the NAND flash memory 120 (a write operation includes a plurality of loops and one loop includes a program operation and a program verify operation), to erase data of the NAND flash memory 120, or the like.

The host interface 111 is connected to a host device (simply referred to as a host or the like) 200, such as a personal computer, through a data bus. Data transmission and reception and the like are performed between the host device 200 and the memory system 100 through the host interface 111.

The RAM 112 is, for example, a volatile memory, and stores, for example, an operation program for the CPU 114.

When receiving data from the host device 200, the ECC circuit 113 attaches an error correcting code to the received data. The ECC circuit 113 supplies data attached with the error correcting code to, for example, the flash memory interface 116. The ECC circuit 113 receives data supplied from the NAND flash memory 120 through the flash memory interface 116. The ECC circuit 113 performs error correction on the received data from the NAND flash memory 120 using the error correcting code. The ECC circuit 113 supplies data subjected to error correction to the host interface 111.

The CPU 114 controls the overall operation of the memory system 100. The CPU 114 controls the NAND flash memory 120 based on data stored in the RAM 112 and the ROM 115. As described above, even when the host device 200 is included in the memory system 100, the CPU 114 controls the overall operation of the memory system 100.

The ROM 115 is a nonvolatile memory, and stores, for example, an operation program for the CPU 114.

The NAND flash memory 120 is connected to the flash memory interface 116 through the data bus.

NAND Flash Memory

The NAND flash memory 120 includes an input/output buffer 121, a control circuit 122, a column address buffer/column decoder 123, a fail bit counter circuit 124, a data latch circuit 125, a sense amplifier 126, a row address buffer 127, a row decoder 128, and a memory cell array 130.

The memory cell array 130 is a three-dimensional nonvolatile semiconductor memory device in which a plurality of nonvolatile memory cell transistors are stacked on a semiconductor substrate in a vertical direction. The detailed configuration of the memory cell array 130 will be described below.

The sense amplifier 126 senses data from a memory cell transistor in a bit line at a SEN node (not shown) during a data read operation. The sense amplifier 126 sets a program voltage according to program data in the SEN node of the sense amplifier during a data write operation. Data read and write to the memory cell array 130 are performed in units of a plurality of memory cell transistors (in the unit of a page described below). The sense amplifier 126 receives a bit line selection signal input from the column address buffer/column decoder 123 and selects and drives any of bit lines BL through a bit line selection transistor (not shown).

The write operation includes a program voltage application operation (referred to as a program operation or the like) to inject electric charges into a charge storage layer of a memory cell transistor MT to increase a threshold value, and a program verify operation to confirm change in threshold distribution as the result of the program voltage application operation.

The data latch circuit 125 includes a first cache 125a, a second cache 125b, and a third cache 125c which are respectively configured with SRAMs or the like. The first cache 125a, the second cache 125b, and the third cache 125c respectively store data supplied from the memory controller 110, a verify result detected by the sense amplifier 126, or the like. The first cache 125a, the second cache 125b, and the third cache 125c respectively hold data for one page. The definition of the page will be described below.

The fail bit counter circuit 124 counts the number of bits not programmed from the result of verification stored in the data latch circuit 125.

The column address buffer/column decoder 123 temporarily stores a column address signal input from the memory controller 110 through the input/output buffer 121. A selection signal for selecting any one bit line BL according to the column address signal is output to the sense amplifier 126.

The row decoder 128 decodes a row address signal input through the row address buffer 127 and selects and drives a word line WL and selection gate lines SGD and SGS of a memory cell array. The row decoder 128 has a part which selects a block of the memory cell array 130 and a part which selects a page.

The NAND flash memory 120 of the first embodiment has an external input/output terminal I/O (not shown), and data transfer is performed between the input/output buffer 121 and the memory controller 110 through the external input/output terminal I/O. An address signal input through the external input/output terminal I/O is output to the row decoder 128 and the column address buffer/column decoder 123 through the row address buffer 127.

The control circuit 122 performs sequence control to program and erase data and controls a read operation based on various external control signals (chip enable signal CEn, write enable signal WEn, read enable signal REn, command latch enable signal CLE, address latch enable signal ALE, and the like) and a command CMD supplied through the memory controller 110.

The control circuit 122 includes registers 122a, 122b, and 122c, and stores flag data described below and values necessary for computation in the control circuit 122, such as a value related to a value counted by the fail bit counter circuit 124.

The register 122a stores a prescribed value NCHK_PV or the like, and the register 122b stores a prescribed value NML2V_PV or the like. The register 122c stores a sample string unit described below, information (for example, eight-bit information) read from a lower page, or the like.

The control circuit 122 determines an initial program voltage for use in a program operation based on flag data stored in the register 122c.

The control circuit 122 compares the number of bits not programmed with the allowable number of fail bits set to determine whether the program operation is passed or failed. The control circuit 122 includes an internal loop counter which counts the number of program pulse applications.

Memory Cell Array

Next, the details of the configuration of the memory cell array 130 according to the first embodiment will be described referring to FIGS. 2 to 4.

Figure 2:
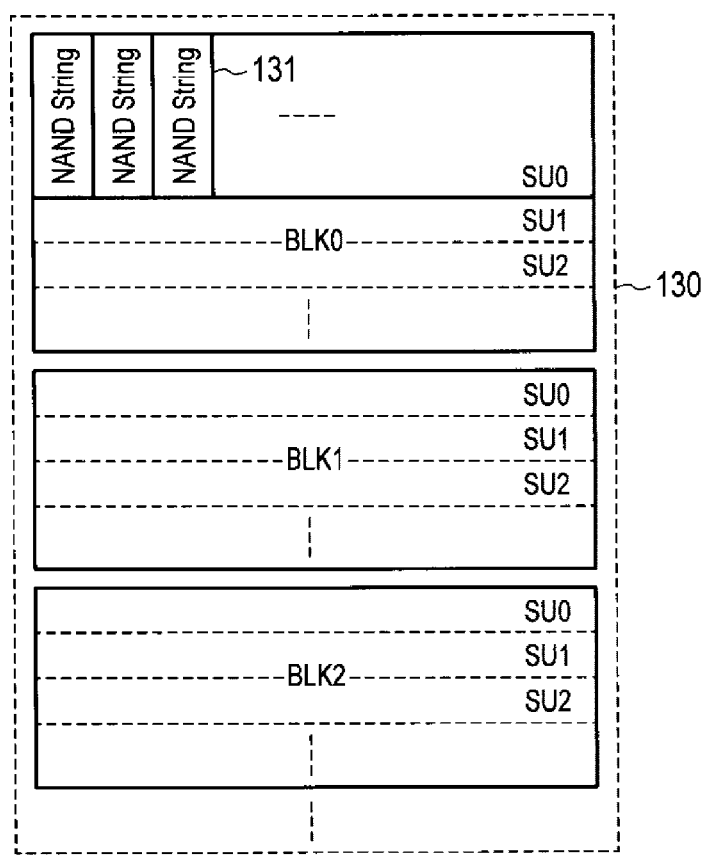
FIG. 2 is a block diagram showing a memory cell array according to the first embodiment.

As shown in FIG. 2, the memory cell array 130 includes a plurality of nonvolatile memory cell transistors, and each of the nonvolatile memory cell transistors is associated with a word line and a bit line. The memory cell array 130 includes a plurality (in FIG. 2, three) of blocks BLK (BLK0, BLK1, BLK2, . . . ) which are sets of a plurality of nonvolatile memory cell transistors.

Each of the blocks BLK includes NAND strings 131 in which memory cell transistors are connected in series. The memory cell array 130 includes a plurality of string units SU (SU0, SU1, SU2, . . . ) which are sets of NAND strings 131. Of course, the number of blocks in the memory cell array 130 or the number of string units in one 1 block BLK is arbitrary.

Figure 3:
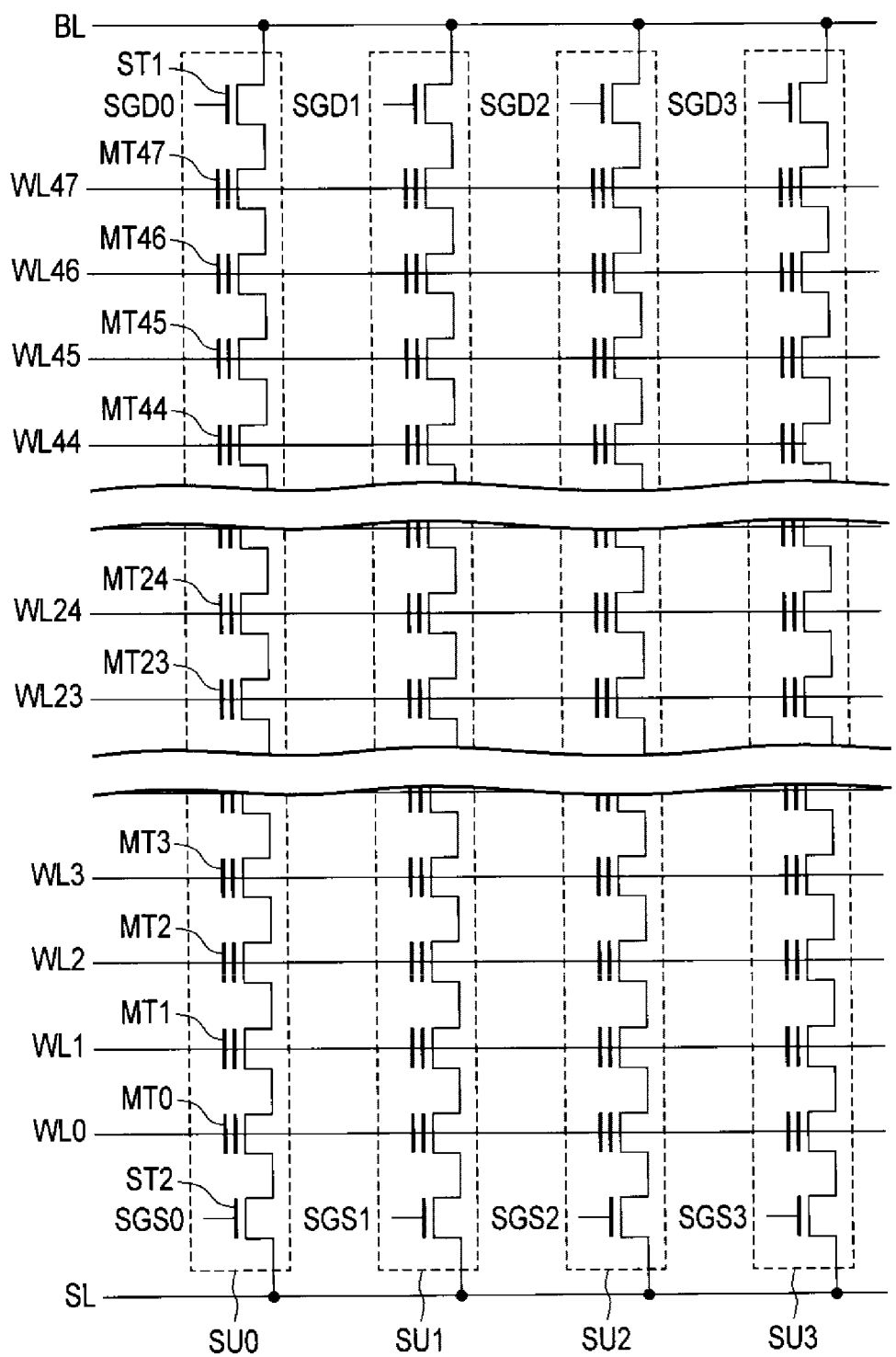
FIG. 3 is apart of a circuit diagram of a block according to the first embodiment.
Figure 4:
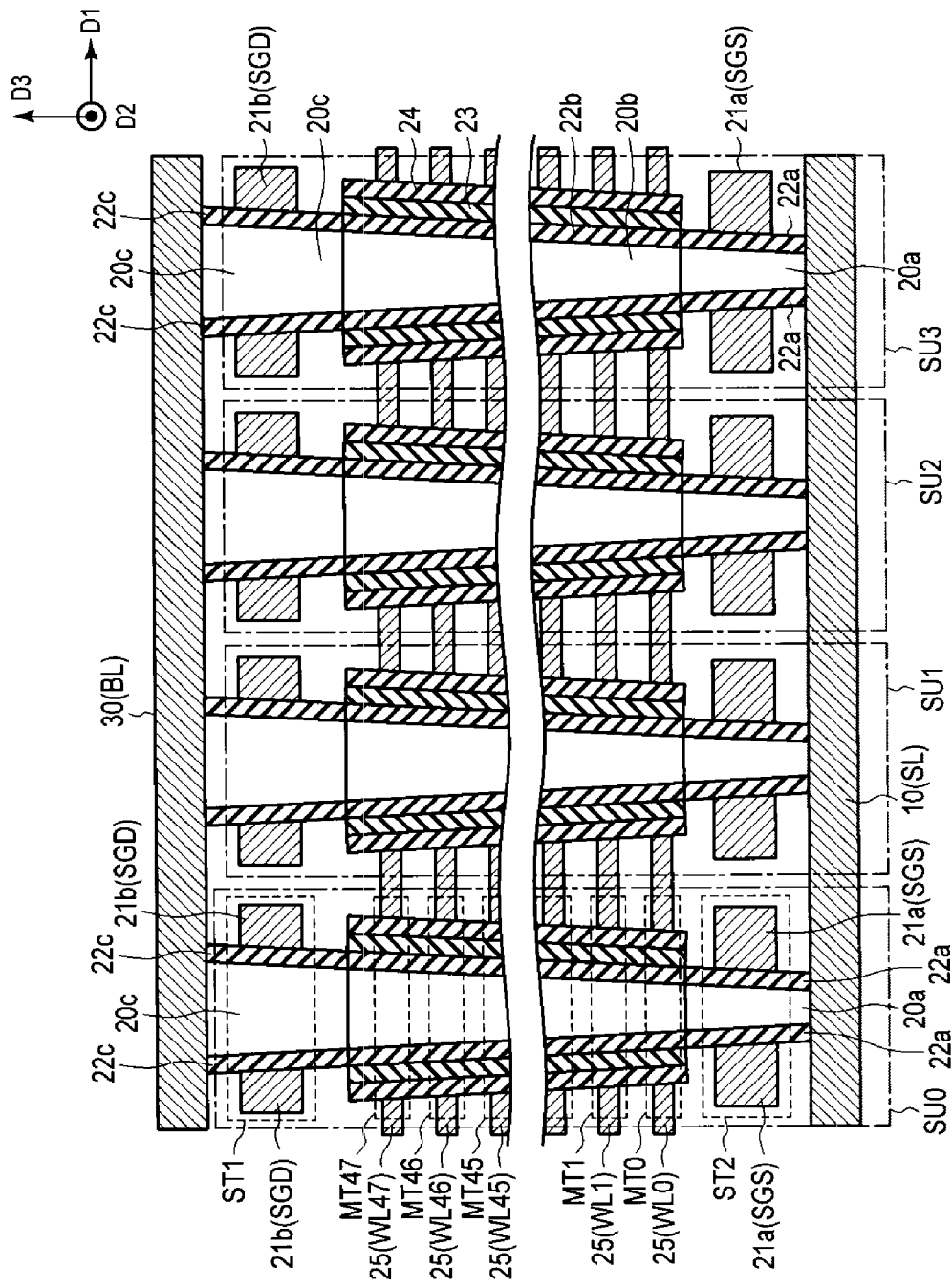
FIG. 4 is a sectional view of a NAND string according to the first embodiment.
Part (a) of FIG. 5 shows an initial state of a threshold distribution of a memory cell transistor MT according to the first embodiment. Part (b) of FIG. 5 shows the threshold distribution of the memory cell transistor MT according to the first embodiment after lower bit write is completed. Part (c) of FIG. 5 shows the threshold distribution of the memory cell transistor MT according to the first embodiment after upper bit write of a first program or a second program is completed.

In the block BLK0, a plurality of columns having the configuration shown in FIG. 3 are provided in a vertical direction of paper. In the first embodiment, the block BLK0 includes, for example, four string units SU (SU0 to SU3). Each of the string units SU includes a plurality of NAND strings 131 in the vertical direction of paper of FIG. 3. Other blocks BLK have the same configuration as the block BLK0.

Each of the NAND strings 131 includes, for example, 48 memory cell transistors MT (MT0 to MT47), and selection transistors ST1 and ST2. Each memory cell transistor MT includes a stacked gate including a control gate and a charge storage layer, and holds data in a nonvolatile manner. The number of memory cell transistors MT is not limited to 48 and may be 8, 16, 32, 64, 128, or the like, and there is no limit to the number of memory cell transistors MT. When there is no need for distinction, the memory cell transistors MT0 to MT47 are simply referred to as the memory cell transistors MT.

A plurality of memory cell transistors MT are disposed so as to be connected in series between the selection transistors ST1 and ST2.

The gates of the selection transistors ST1 of the respective string units SU0 to SU3 are respectively connected to the selection gate lines SGD0 to SGD3, and the gates of the selection transistors ST2 are respectively connected to the selection gate lines SGS0 to SGS3. Meanwhile, the control gates of the memory cell transistors MT0 to MT47 in the same block BLK0 are respectively connected in common to the word lines WL0 to WL47. When there is no need for distinction, the word lines WL0 to WL47 are simply referred to as the word lines WL.

That is, while the word lines WL0 to WL47 are connected in common among a plurality of string units SU0 to SU3 in the same block BLK0, the selection gate lines SGD and SGS are separated for each of the string units SU0 to SU3 in the same block BLK0.

Out of the NAND strings 131 disposed in a matrix in the memory cell array 130, the other end of the selection transistors ST1 of the NAND strings 131 in the same row is connected in common to either bit line BL (BL0 to BL (L−1), (L−1) is a natural number equal to or greater than 1). That is, the bit line BL connects the NAND strings 131 in common among a plurality of blocks BLK. The other end of current paths of the selection transistors ST2 is connected in common to a source line SL. The source line SL connects the NAND strings 131 in common among a plurality of blocks.

As described above, data of the memory cell transistor MT in the same block BLK is erased in a batch. Meanwhile, data is read and programmed in a batch in units of a plurality of memory cell transistors MT connected in common to either word line WL in either string unit SU of either block BLK. In this way, a unit which is written in a batch is referred to as "page".

Subsequently, an example of the sectional structure of the memory cell array 130 will be simply described referring to FIG. 4. A plurality of structures shown in FIG. 4 are disposed in a depth direction (D2 direction) of paper of FIG. 4, and these structures share the word line WL and the selection gate line SGD and SGS, whereby one string unit SU is formed.

A source line 10 is formed above a semiconductor substrate (not shown). As shown in FIG. 4, a conductive film 21a which functions as the selection gate line SGS is formed above the source line 10. A plurality of conductive films (for example, polycrystalline silicon films) 25 which function as the word line WL are formed above the conductive film (for example, a polycrystalline silicon film) 21a. A conductive film (for example, a polycrystalline silicon film) 21b which functions as the selection gate line SGD is formed above the conductive films 25. Inter-electrode insulating films are formed among the respective conductive films 21a, 21b, and 25 so as to electrically isolate the respective conductive films 21a, 21b, and 25 in a D3 direction. Specifically, the conductive films 25 and the inter-electrode insulating films are alternately stacked in the D3 direction.

Memory holes which extend in a vertical direction (D3 direction: a direction orthogonal to the D2 direction) with respect to the surface of the semiconductor substrate are formed in the conductive films 21a, 21b, 25, and the inter-electrode insulating films. In this disclosure, the diameter of a memory hole in a plane parallel to a D1 direction (D2 direction and direction orthogonal to the D3 direction) and the D2 direction is referred to as an MH diameter. In the first embodiment, memory holes are formed in a multilayer film of the conductive films 21a, 21b, 25, the inter-electrode insulating film, and the like. In this case, an upper layer area in the multilayer film is etched more than a lower layer area. For this reason, the MH diameter of the memory hole of the upper layer area is greater than the MH diameter of the memory hole of the lower layer area. The difference between the MH diameters becomes prominent when the etching distance (D3 direction) of the memory hole becomes longer.

On the inner wall of a memory hole formed in a region to be the selection transistor ST2, a gate insulating film. 22a and a semiconductor layer 20a are sequentially formed, and a columnar structure is formed.

On the inner wall of a memory hole formed in a region to be the memory cell transistor, a block insulating film 24, a charge storage layer (insulating film) 23, a gate insulating film 22b, and a semiconductor layer 20b are sequentially formed, and a columnar structure is formed.

On the inner wall of a memory hole formed in a region to be the selection transistor ST1, a gate insulating film. 22c and a semiconductor layer 20c are sequentially formed, and a columnar structure is formed.

The semiconductor layer 20b is a region where a channel is formed during the operation of the memory cell transistor MT. A bit line layer 30 is further formed on the semiconductor layer 20c.

The configuration of the memory cell array 130 may be as described in U.S. patent application Ser. No. 12/407,403 filed Mar. 19, 2009 entitled "THREE DIMENSIONAL STACKED NONVOLATILE SEMICONDUCTOR MEMORY". The configuration of the memory cell array 130 may also be as described in U.S. patent application Ser. No. 12/406,524 filed Mar. 18, 2009 entitled "THREE DIMENSIONAL STACKED NONVOLATILE SEMICONDUCTOR MEMORY", U.S. patent application Ser. No. 12/679,991 filed Mar. 25, 2010 entitled "NON-VOLATILE SEMICONDUCTOR STORAGE DEVICE AND METHOD OF MANUFACTURING THE SAME", and U.S. patent application Ser. No. 12/532,030 filed Mar. 23, 2009 entitled "SEMICONDUCTOR MEMORY AND METHOD FOR MANUFACTURING SAME". The entire disclosures of these patent applications are incorporated herein by reference.

Threshold Distribution of Memory Cell Transistor

Next, a possible threshold distribution of the memory cell transistor MT according to this embodiment will be described referring to parts (a), (b), and (c) of FIG. 5.

Figure 5:
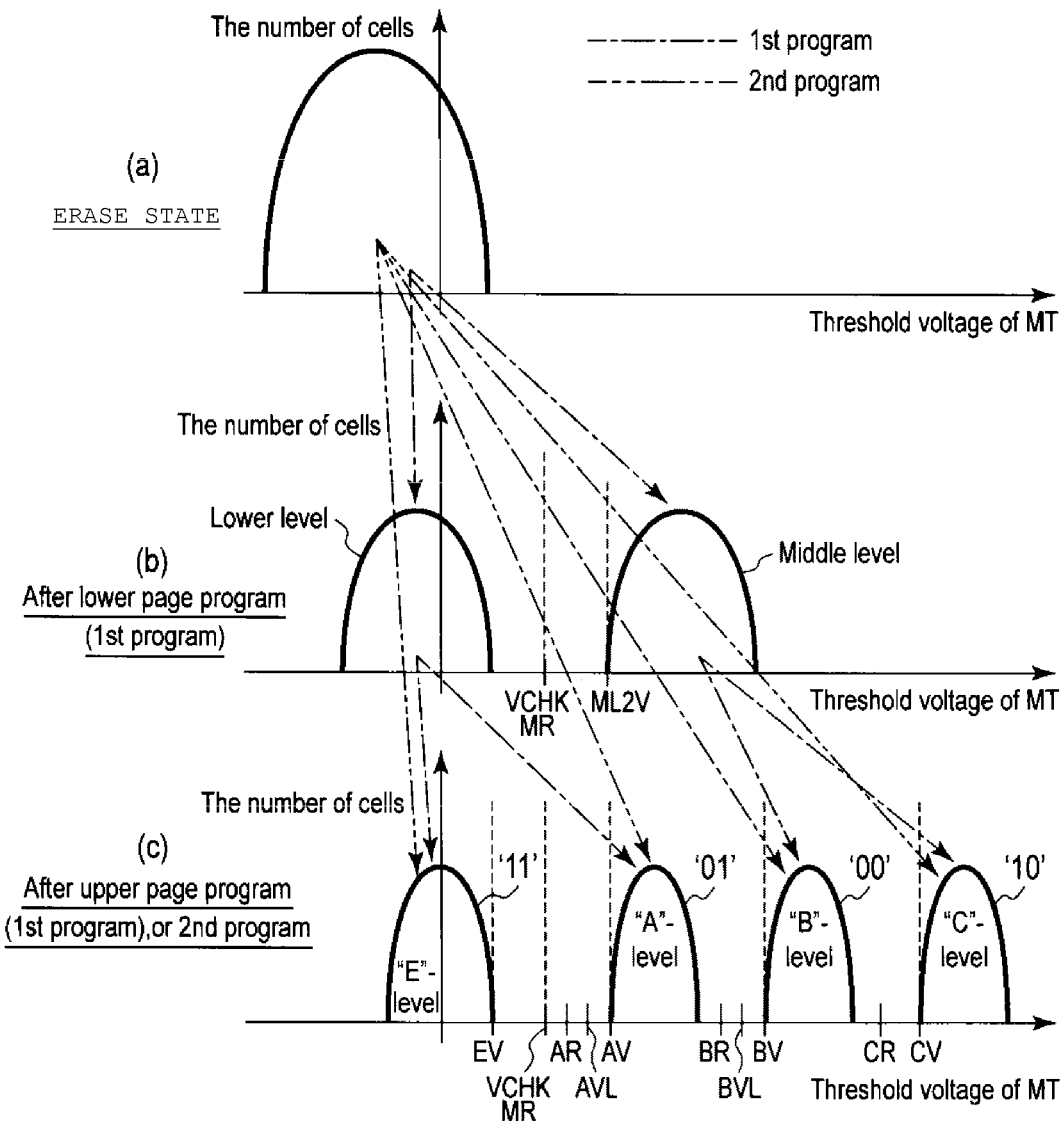

As shown in parts (a), (b), and (c) of FIG. 5, the memory cell transistor MT is able to hold, for example, two-bit data according to the threshold value. Two-bit data is "E" level, "A" level, "B" level, and "C" level in an ascending order of the threshold value. Each level has a two-bit address of an upper bit and a lower bit. For example, the "E" level is numbered "11", the "A" level is numbered "01", the "B" level is numbered "00", and the "C" level is numbered "10". In regards to "11", "01", "00", and "10", the left number is allocated to the upper bit, and the right number is allocated to the lower bit. A write unit of data of the lower bit is referred to "lower page". A write unit of data of the upper bit is referred to "upper page".

The "E" level is a threshold value in a state where data is erased, has, for example, a negative value (may have a positive value), and is lower than an erase verify voltage EV. The "A" to "C" levels are threshold values in a state where an electric charge is injected into the charge storage layer, the "A" level has a threshold value which is higher than a read level "AR" and lower than a read level "BR". The "B" level has a threshold value which is higher than the read level "BR" and lower than a read level "CR". The "C" level has a threshold value which is higher than the read level "CR".

In this way, the individual memory cell transistor MT may take four threshold levels, and may store two-bit data (four-level data).

If a lower page program (lower page program) is performed, a threshold distribution of an erase state ("E" level) shown in (a) of FIG. 5 changes to a two-value (Lower-level and Middle-level) threshold distribution shown in part (b) of FIG. 5. A voltage "MR" is supplied to a selected word line to perform a read operation, whereby it is possible to determine whether the threshold voltage of the memory cell transistor MT is higher or lower than the voltage "MR". As a result, it is possible to read data of two values (Lower-level and Middle-level).

If an upper page program (upper page program) is performed after the lower page program, as shown in part (c) of FIG. 5, the two-value threshold distribution shown in part (b) of FIG. 5 changes to a four-value threshold distribution. As described above, a method which performs a program operation of four-value data by performing the upper page program after the lower page program is referred to as a first program operation.

Data of a lower page and data of an upper page are programmed together in the memory cell transistor MT, whereby a one-value threshold distribution shown in part (a) of FIG. 5 may change to the four-value threshold distribution shown in part (c) of FIG. 5. In this way, a method which programs a plurality of two or more bits (four values) from the erase state without separately performing the lower page program and the upper page program is referred to as a second program operation.

In the first embodiment, the memory system 100 which applies a first program as a program operation to the memory cell transistor MT when the memory cell transistor MT holds four values will be described.

In parts (b) and (c) of FIG. 5, although the voltage MR and a program verify voltage VCHK described below are the same voltage, the voltage MR and the voltage VCHK are not necessarily the same voltage, and the magnitude relationship thereof may be appropriately changed.

Page

Next, a page will be described. The memory cell transistor MT according to the first embodiment holds four values. For this reason, as shown in FIG. 6, as a page according to the first embodiment, there are a lower page and an upper page.

Figure 6:
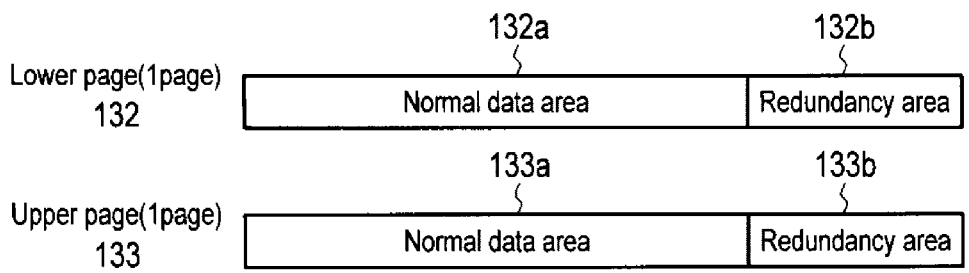
FIG. 6 is a diagram showing a page according to the first embodiment.

As shown in FIG. 6, a lower page (lower page) 132 has a normal data area 132a and a redundancy area 132b.

An upper page (upper page) 133 has a normal data area 133a and a redundancy area 133b.

For example, data supplied from the host device 200 is stored in the normal data areas 132a and 133a. For example, flag data or the like is stored in the redundancy area 132b and 133b. Flag data will be described below.

Outline of Write Operation of Data According to First Embodiment

The memory cell array 130 has a three-dimensional stacked structure, and there exist variations in program characteristic (condition) of the memory cell transistor MT due to a finish shape, such as the thickness of the word line WL, and variation in program characteristic due to the MH diameter.

However, it is considered that, in regards to the same word line in the same block, variation between the string units SU is not so large.

Accordingly, for example, one string unit of a block is referred to as "a sample string unit for acquiring (capturing) a program characteristic of the memory cell transistor MT". The program characteristic acquired from the sample string unit is applied to the string units other than the sample string unit in the same block. With this, it is possible to improve a program speed in the units other than the sample string unit.

It is desirable that each word line WL of the sample string unit is initially programmed in each block.

In this embodiment, it is assumed that a page address regarding the string unit SU0 is small compared to the page addresses regarding the string units other than the string unit SU0. For this reason, the control circuit 122 programs the memory cell transistor MT of the string unit SU0 earlier than the word lines WL of the string units other than the string unit SU0. Unless particularly specified, the control circuit 122 manages the string unit SU0 as a sample string unit.

The control circuit 122 performs a predetermined program operation on the sample string unit and derives a maximum initial program voltage VPGM, at which the memory cell transistor MT is not over-programmed. This operation is referred to as a capture operation. In the first program operation, the capture operation is performed simultaneously with a lower page program in a predetermined word line WL of the sample string unit. In the second program operation, the capture operation is performed when programming in the predetermined word line WL of the sample string unit. The detailed capture operation will be described below.

The control circuit 122 determines not only the initial program voltage of the upper page of the same word line as the predetermined word line WL of the sample string unit but also the initial program voltage of the lower page and the upper page of the same word line WL of other string units SU in the same block based on the result of the capture operation. The control circuit 122 performs the capture operation for each word line WL of the sample string unit.

The control circuit 122 performs the capture operation based on a command and an address received from the memory controller 110. What command and address are used for the control circuit 122 to perform the capture operation will be described in detail in another example described below.

Details of Write Operation of Data According to First Embodiment

Figure 7:
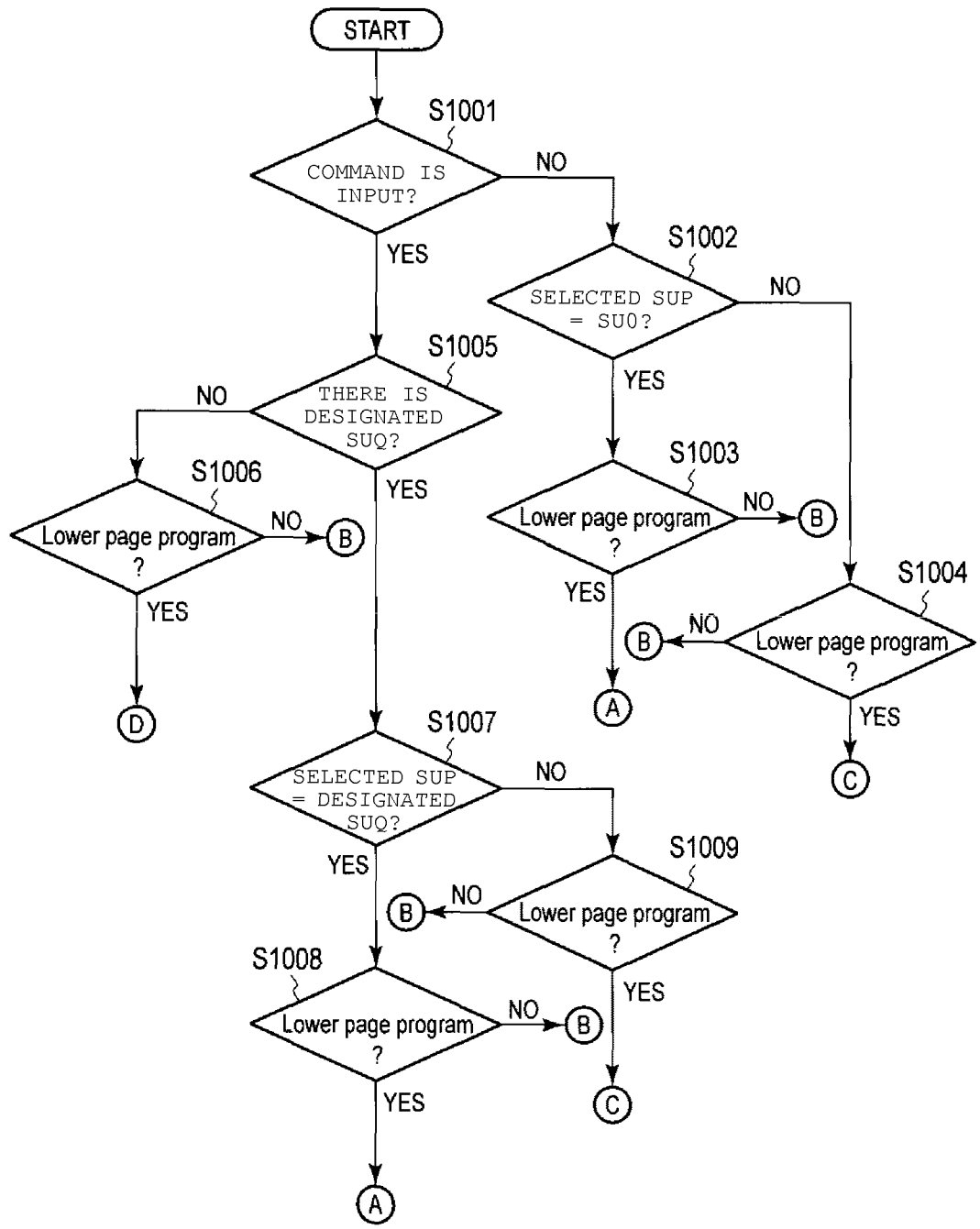
FIG. 7 is a flowchart showing a program operation of a semiconductor memory device according to the first embodiment.

Hereinafter, the first program operation according to the first embodiment will be described referring to the flowchart shown in FIG. 7. Processing described below is primarily executed under the control of the control circuit 122.

S1001

The control circuit 122 determines whether or not sample string unit designation command is received before a program command, a block address, an address (including address information of a selected string unit SUP (P: an integer equal or greater than 0)) of a page, and a program start command are received from the memory controller 110. Hereinafter, for simplification, a program command, an address, data, and a program start command are collectively referred to as "command sequence" or the like.

Command Sequence Example 1

A command sequence for lower page programming when a sample string unit designation command is not received before a program start command is received will be described referring to FIG. 8.

Figure 8:
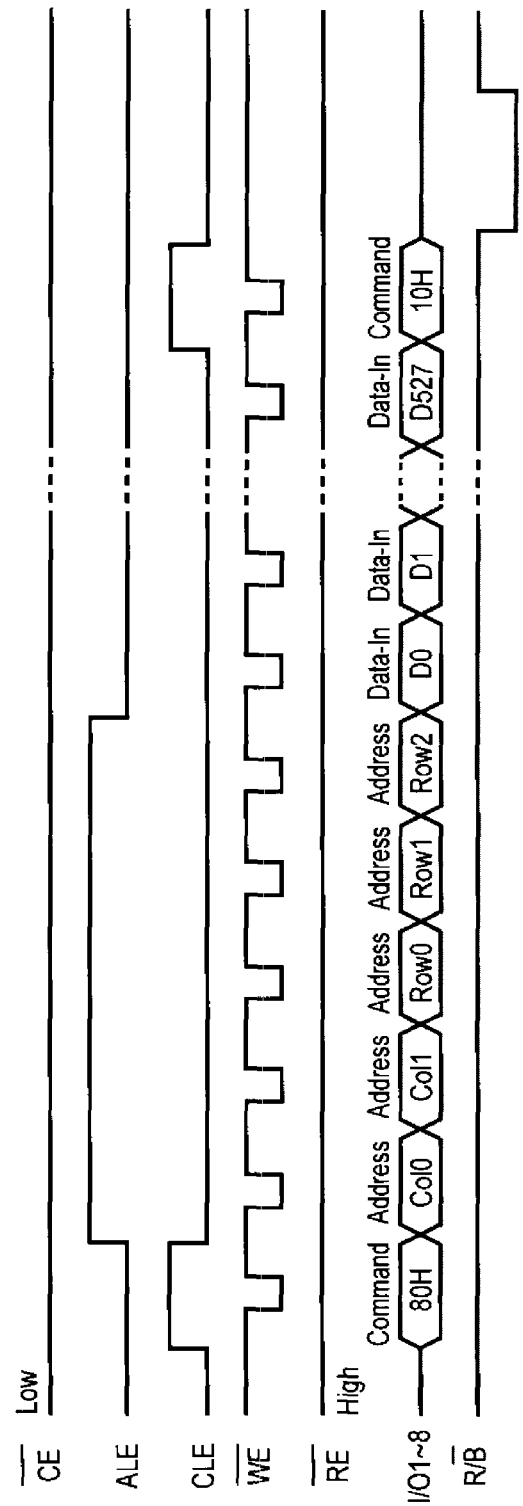
FIG. 8 is a diagram showing an example of a command sequence according to the first embodiment.

As shown in FIG. 8, before a command sequence is input from the memory controller 110 to the NAND flash memory 120, the chip enable signal CEn, the address latch enable signal ALE, and the command latch enable signal CLE are at "L (low)" level. The write enable signal WEn and the read enable signal REn are at "H (high)" level. A ready/busy signal (R/Bn) representing a ready/busy state of the data latch circuit 125 is in a "ready" state.

Subsequently, a command "80H" is input from the memory controller 110 to the NAND flash memory 120 during a period in which the command latch enable signal CLE at "H" level, and the write enable signal WEn is at "L" level.

The NAND flash memory 120 receives an address from the memory controller 110 during a period in which the address latch enable signal ALE is at "H" level. This address is the address of the lower page.

The NAND flash memory 120 receives data after the address. With this, data is stored in the first cache 125a.

A command "10H" is input from the memory controller 110 to the NAND flash memory 120 during a period in which the command latch enable signal CLE is at "H" level. With this, the lower page program is executed. An upper page program is executed with the same command sequence.

Command Sequence Example 2

A command sequence for lower page programming when the sample string unit designation command is received before the program start command is received will be described referring to FIG. 9.

Figure 9:
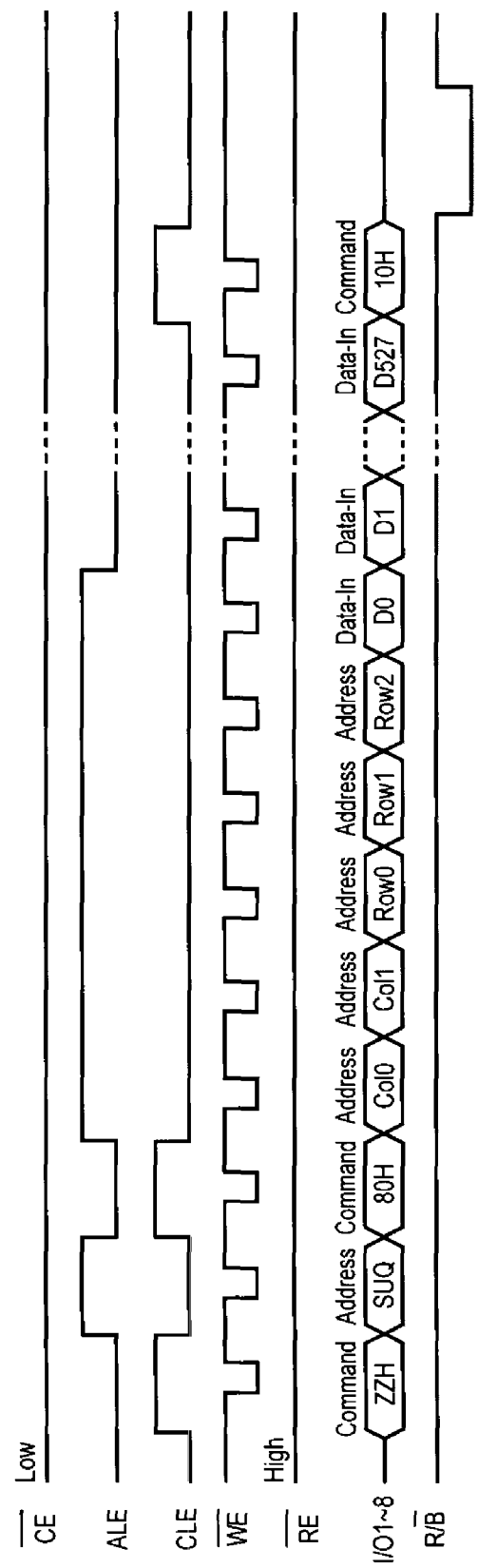
FIG. 9 is a diagram showing an example of the command sequence according to the first embodiment.

As shown in FIG. 9, a sample string unit designation command "ZZH" is input from the memory controller 110 to the NAND flash memory 120 during a period in which the command latch enable signal CLE is at "H" level.

The NAND flash memory 120 receives the address of a string unit from the memory controller 110 during a period in which the address latch enable signal ALE is at "H" level. The address is the address of a designated string unit (referred to as a designated string unit SUQ (Q: an integer equal to or greater than 0) or the like). The same operation as the operation described referring to FIG. 8 is performed. With this, the lower page program is executed. The upper page program is executed with the same command sequence.

S1002

In Step S1001, when it is determined that the sample string unit designation command is not received (S1001, NO), the control circuit 122 manages the string unit SU0 as a sample string unit. The control circuit 122 determines whether or not the selected string unit SUP is the string unit SU0. The selected string unit SUP is a string unit in which the program operation is performed.

S1003

In Step S1002, when it is determined that the selected string unit SUP is the string unit SU0 (S1002, YES), the control circuit 122 determines whether or not the received address of the page is the address of the lower page.

S1004

In Step S1002, when it is determined that the selected string unit SUP is not the string unit SU0 (S1002, NO), the control circuit 122 determines whether or not the received address of the page is the address of the lower page.

S1005

In Step S1001, when it is determined that the sample string unit designation command is received (S1001, YES), the control circuit 122 determines whether or not an address of an effective string unit is designated. In other words, the control circuit 122 determines whether or not the designated string unit SUQ is an existing string through comparison with string information stored in a register (not shown).

S1006

In Step S1005, when the designated string unit SUQ is not effective address designation (S1005, NO), the control circuit 122 determines whether or not the received address of the page is the address of the lower page.

S1007

In Step S1005, when it is determined that the designated string unit SUQ is effective address designation (S1005, YES), the control circuit 122 determines whether or not the selected string unit SUP is the same as the designated string unit SUQ. S1008

In Step S1007, when it is determined that the designated string unit SUQ is the same as the selected string unit SUP (S1007, YES), the control circuit 122 determines whether or not the received address of the page is the address of the lower page.

S1009

In Step S1007, when it is determined that the designated string unit SUQ is not the same as the selected string unit SUP (S1007, NO), the control circuit 122 determines whether or not the received address of the page is the address of the lower page.

When "YES" in Step S1003

Next, a case where, in Step S1003 of FIG. 7, the control circuit 122 determines that the received address of the page is the address of the lower page (S1003, YES) will be described referring to FIG. 10.

Programming Operation in a Lower Page of a String Unit that Contains the Flag Data A program operation example of data according to the first embodiment will be described referring to the flowchart of FIG. 10. In the following description, an operation example where the capture operation is performed as a part of lower page programming will be described.

S1101

First, the control circuit 122 stores the lower page of the received data in the third cache 125c. The control circuit 122 then performs the capture operation.

On the other hand, the control circuit 122 sets non-write data in a column address, in which flag data of the redundancy area 132b stored in the third cache 125c is stored, until the capture operation ends.

S1102

Figure 11:
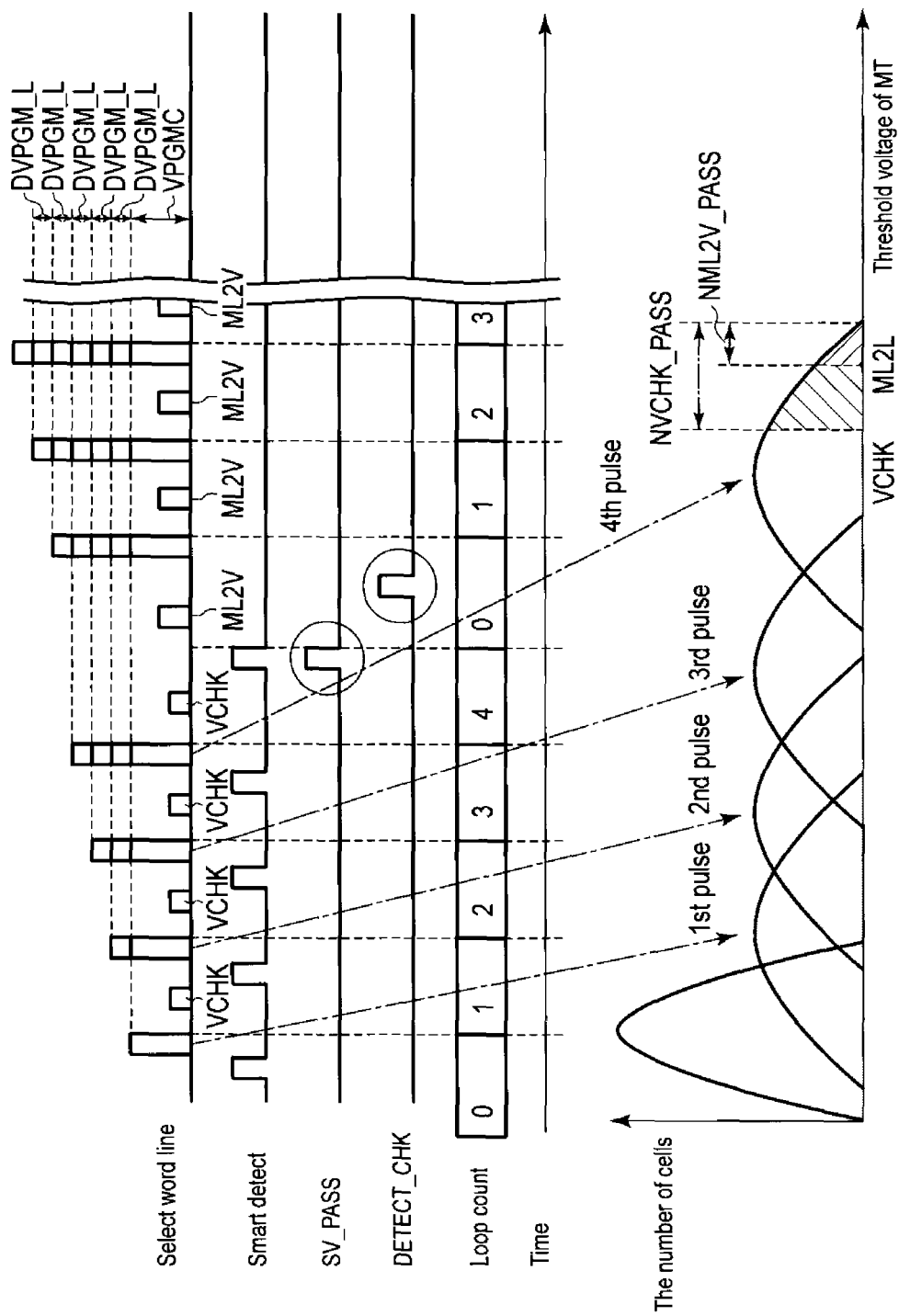
FIG. 11 is a diagram showing a capture operation according to the first embodiment.

Next, as shown in FIG. 11, the control circuit 122 starts a program operation of a lower page. Specifically, in response to the command of the control circuit 122, the row decoder 128 applies a program voltage VPGMC to a selected word line WLn (where n is an integer equal to or greater than 0) while turning on the selection transistor of the selected string unit. The sense amplifier 126 applies a voltage according to lower page data to the bit lines BL in response to the command of the control circuit 122.

With this, the control circuit 122 programs lower page data stored in the third cache 125c in the memory cell transistor MT.

S1103

Next, the row decoder 128 applies the program verify voltage VCHK for verification during the capture operation to the selected word line WLn in response to the command of the control circuit 122.

In this way, the control circuit 122 executes a first program verify operation. That is, the sense amplifier 126 reads data from a selected page according to the command of the control circuit 122. The control circuit 122 confirms whether or not the threshold value of the memory cell transistor MT increases to a desired value based on the read data.

S1104

The control circuit 122 determines whether or not the number NCHK_PASS of memory cell transistors exceeding the program verify voltage VCHK for verification during the capture operation exceeds a prescribed value NCHK_PV. The prescribed value NCHK_PV is stored in a ROM fuse block (not shown) of the memory cell array 130 and read at the time of the activation of the memory system 100. The prescribed value NCHK_PV is stored in the register 122a in advance.

S1105

In Step S1104, when the control circuit 122 determines that the number NCHK_PASS of memory cell transistors does not exceed the prescribed value NCHK_PV (S1104, NO), the control circuit 122 updates the number NWLn_loop of loops to NWLn_loop+1. The initial value of the number NWLn_loop of loops is "0".

S1106

The control circuit 122 updates the number NWLn_loop of loops and then increases a program voltage VPGM by DVPGM_L. The control circuit 122 repeats the operation of Step S1102 using the updated program voltage VPGM. The order of the operations of Steps S1105 and S1106 may be reversed.

S1107

In Step S1104, when the control circuit 122 determines that the number NCHK_PASS of memory cell transistors exceeds the prescribed value NCHK_PV (S1104, YES), the control circuit 122 raises a signal SV_PASS from "L (Low)" level to "H (High)" level. If the signal SV_PASS is raised from "L" level to "H" level, the control circuit 122 performs the program verify operation so as to determine whether or not the number NML2V_PASS of memory cell transistors exceeding a voltage ML2V exceeds the prescribed value NML2V_PV.

Specifically, the row decoder 128 applies a verify voltage ML2V to the selected word line WLn to execute a program verify operation.

S1108

Subsequently, if a program verify result is read in Step S1107, the control circuit 122 raises a signal DETECT_CHK from "L" level to "H" level. The control circuit 122 determines whether or not the number NML2V_PASS of memory cell transistors exceeding the voltage ML2V exceeds the prescribed value NML2V_PV during a period in which the signal DETECT_CHK is "H". The prescribed value NML2V_PV is stored in a ROM fuse block (not shown) of the memory cell array 130 and read at the time of the activation of the memory system 100. The control circuit 122 stores the prescribed value NML2V_PV in the register 122b.

On the other hand, as a result of the operations of Steps S1102 to S1106, there is a case where the number NML2V_PASS of memory cell transistors exceeding the voltage ML2V at a verify level of middle level exceeds the prescribed value NML2V_PV. In this case, if the program voltage VPGM resulting in a "YES" in Step S1104 is used as the initial program voltage of the lower page program, a cell voltage equal to or greater than a prescribed value reaches a verify level of middle level, and over-programming may occur. In order to suppress over-programming, the control circuit 122 performs the operations of Steps S1107 and S1108 described above and determines whether or not the number NML2V_PASS of memory cell transistors exceeds the prescribed value NML2V_PV. The above-described determination operation ends, whereby the capture operation is completed.

S1109

After the capture operation is completed, the control circuit 122 stores the result of the capture operation in the register 122c as flag data. Specifically, the control circuit 122 stores the program verify result in Steps S1107 and S1108 and the number of loops necessary until Step S1104 is passed in the register 122c of the control circuit 122 as flag data. Flag data is, for example, eight-bit. In the first embodiment, out of the eight-bit data, data for one bit is allocated to the determination result (whether or not the number NML2V_PASS of memory cell transistors exceeding the voltage ML2V exceeds the prescribed value NML2V_PV), and data for seven bits is allocated to the number of loops.

Specifically, when the number NWLn_loop of loops=4 and when the number NCHK_PASS of memory cell transistors is NCHK_PASS>NCHK_SV and NML2V_PASS<NML2V_PV, eight-bit flag data is expressed as {0_000_100}. When the number NWLn_loop of loops=4 and when the number NCHK_PASS of memory cell transistors is NCHK_PASS>NCHK_SV and NML2V_PASS>NML2V_PV, eight-bit data is expressed as {1_000_100}. In this embodiment, the most significant bit of flag data is defined as SV_OVER. That is, the format of flag data is {SV_OVER,NWLn_loop[6:0]}. When the number NML2V_PASS of memory cell transistors exceeding the voltage ML2V does not exceed the prescribed value NML2V_PV, the bit SV_OVER becomes "0", and when the number NML2V_PASS of memory cell transistors exceeding the voltage ML2V exceeds the prescribed value NML2V_PV, the bit SV_OVER becomes "1".

The control circuit 122 writes flag data stored in the register 122c in the redundancy area 132b stored in the third cache 125c and releases a program inhibit state of flag data of the redundancy area 132b. The program operation of flag data starts along with the normal data area 132a from the application of a subsequent program pulse. At this time, the control circuit 122 resets the loop counter.

S1110

Subsequently, the control circuit 122 updates the number NWLn_loop of loops to NWLn_loop+1.

S1111

The control circuit 122 updates the number NWLn_loop of loops and then increases the program voltage VPGM by DVPGM_L.

The order of the operations of Steps S1110 and S1111 may be reversed.

S1112

As in this example, when the capture operation is performed as a part of the lower page program, the control circuit 122 continues the program operation of the lower page after the capture operation.

Specifically, the row decoder 128 applies the program voltage VPGM to the selected word line WLn in response to a command of the control circuit 122 while turning on the selection transistor of the selected string unit. The sense amplifier 126 applies a voltage according to lower page data to the bit line BL in response to the command of the control circuit 122.

With this, data (normal data area 132a and redundancy area 132b) stored in the third cache 125c is programmed in the memory cell array 130.

S1113

Next, the row decoder 128 applies a program verify voltage ML2V to the selected word line WLn in response to the command of the control circuit 122.

With this, the control circuit 122 executes the program verify operation. Hereinafter, a case where the threshold value increases to the desired value is referred to that verification is "passed", and a case where the threshold value does not increase to the desired value is referred to that verification is "failed".

S1114

The control circuit 122 determines whether or not program verification is passed. If program verification is passed in the selected page (Step S1114, YES), the program operation of the page ends.

S1115

When it is determined that program verification is not passed in the selected page (Step S1114, NO), the control circuit 122 determines whether or not the number of loops of the program operation of the page reaches a maximum value. When the number of loops reaches a maximum value (Step S1115, YES), the program operation of the page ends.

S1116

In Step S1115, when the control circuit 122 determines that the number of loops does not reach the maximum value (Step S1115, NO), the control circuit 122 updates the number NWLn_loop of loops to NWLn_loop+1.

S1117

The control circuit 122 updates the number NWLn_loop of loops and then increases the program voltage VPGM by DVPGM_L. The control circuit 122 repeats the operation of Step S1112 using the updated program voltage VPGM. The order of the operations of Steps S1116 and S1117 may be reversed.

The control circuit 122 repeats the operations of Steps S1112 to S1117 until it is determined that the verify operation of Step S1114 is passed or until it is determined in Step S1115 that the number of loops is the maximum value.

When "NO" in Step S1003

Next, a case where the control circuit 122 determines that an address of a received page is not an address of a lower page in Step S1003 (S1003, NO) will be described referring to the flowchart of FIG. 12.

S1201

The control circuit 122 reads, from the memory cell array 130, data from the address of the lower page corresponding to the address of the upper page received from the memory controller 110.

Figure 13:
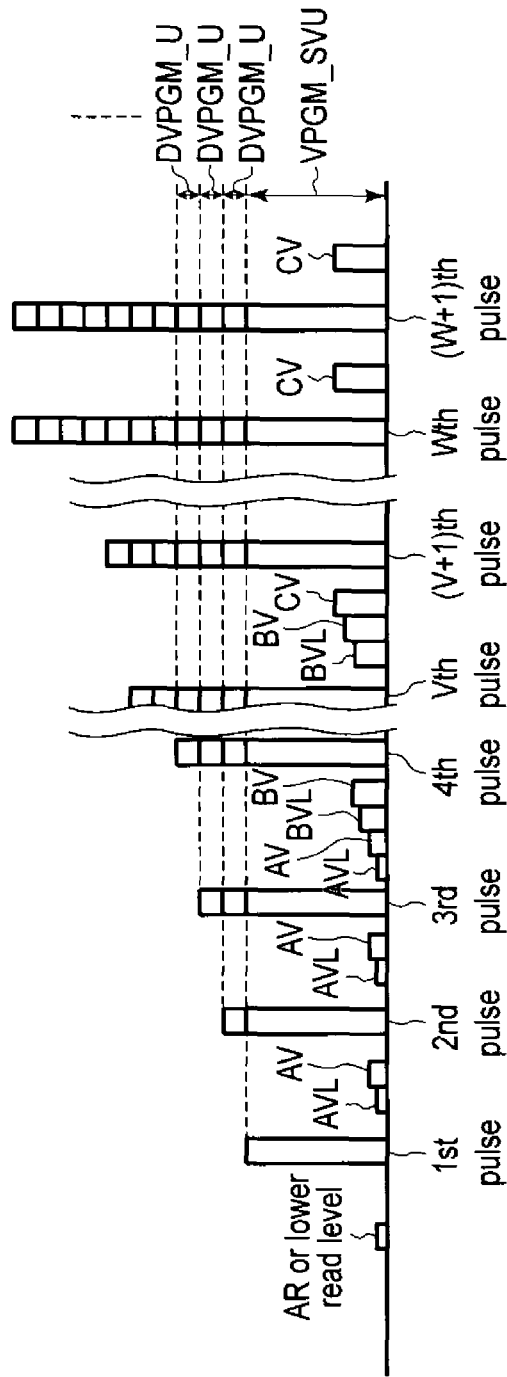
FIG. 13 is a diagram showing an upper page program operation according to the first embodiment.

Specifically, as shown in FIG. 13, the control circuit 122 applies, for example, the voltage MR to the selected word line WLn.

With this, the control circuit 122 may read data stored in the selected word line WLn.

S1202

The control circuit 122 reads data of the lower page from the memory cell array 130 and stores data of the lower page in the first cache 125a. The control circuit 122 stores flag data written in the redundancy area of the lower page in the register 122c of the control circuit 122.

The control circuit 122 stores data of the upper page in the second cache 125b.

The control circuit 122 stores the read flag data of the redundancy area 132b of the lower page 132 in the redundancy area 133b for an upper page stored in the second cache 125b as flag data for an upper page. That is, flag data of the upper page and flag data of the lower page are the same. With this, as shown in part (c) of FIG. 5, flag data after the upper page is programmed is "11(E)" data or "00(B)" data. In this way, since the threshold distributions of two-value flag data ("11(E)" data or "00(B)" data) are not adjacent, it is possible to suppress change in data with fluctuation in threshold distribution due to deterioration of the memory cell transistor MT or the like.

S1203

Next, the control circuit 122 determines an initial program voltage VPGM (VPGM=VPGM_SVU) for an upper page based on flag data stored in the register 122c.

In the following description, an initial program voltage for an upper page program will be described referring to FIGS. 14 and 15.

(i) When flag data of lower page is {SV_OVER=0, NWLn_loop=m}

A voltage (VPGMC+NWLn_loop×DVPGM_L) which is obtained by adding a voltage obtained by multiplying the number of loops (the number of program pulse applications−1) by DVPGM_L to the initial program voltage VPGMC is handled as a program voltage VPGM_BASE.

Figure 14:
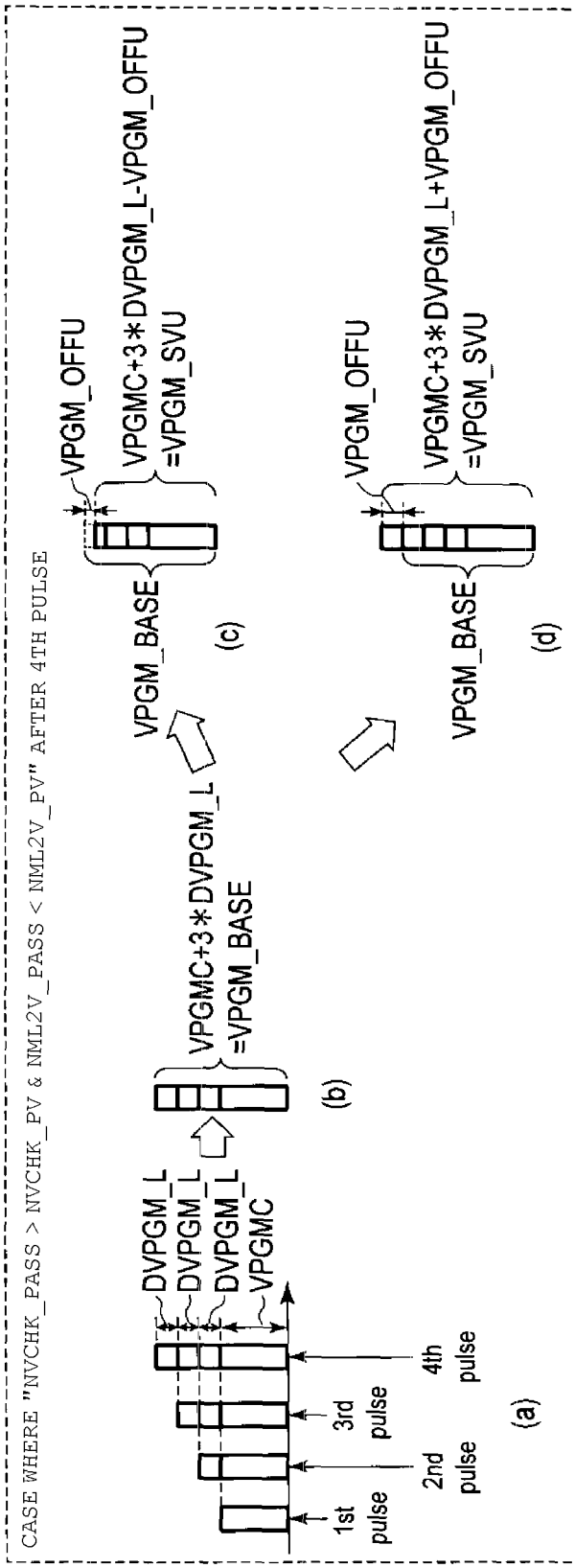
FIG. 14 is a diagram showing a method of determining an initial program voltage for an upper page program according to the first embodiment.

As shown in parts (a) and (b) of FIG. 14, in this example, the program voltage VPGM_BASE with flag data of {SV_OVER=0, NWLn_loop=3} becomes VPGMC+3× DVPGM_L.

(ii) When flag data of lower page is {SV_OVER=1, NWLn_loop=m}

A voltage VPGMC+NWLN_LOOP*DVPGM_L−1/2*DVPGM_L which is obtained by adding a voltage obtained by multiplying the number of loops by DVPGM_L to the initial program voltage VPGMC and subtracting a voltage obtained by dividing DVPGM_L by 2, from the whole is handled as a program voltage VPGM_BASE.

Figure 15:
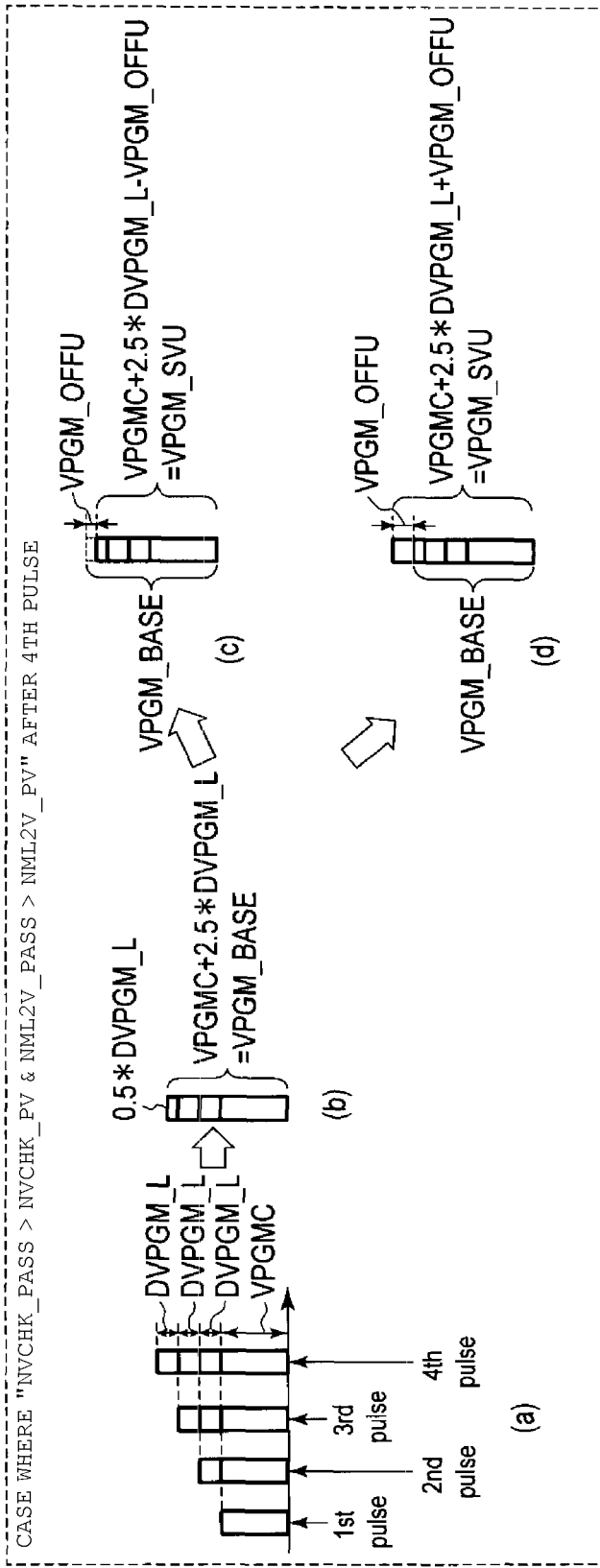
FIG. 15 is a diagram showing a method of determining an initial program voltage for upper page programming according to the first embodiment.

As shown in parts (a) and (b) of FIG. 15, in this example, the program voltage VPGM_BASE with flag data of {SV_OVER=1, NWLn_loop=3} becomes VPGMC+2.5× DVPGM_L.

(iii) Initial Program Voltage for Upper Page Program

The control circuit 122 may set the program voltage VPGM_BASE as an initial program voltage VPGM_SVU for an upper page program.

As shown in part (c) of FIG. 14 and part (c) of FIG. 15, a voltage obtained by subtracting an offset voltage VPGM_OFFU from the program voltage VPGM_BASE may be set as the initial program voltage VPGM_SVU (=VPGM_BASE−VPGM_OFFU) for an upper page program.

As shown in part (d) of FIG. 14 and part (d) of FIG. 15, a voltage obtained by adding the offset voltage VPGM_OFFU to the program voltage VPGM_BASE may be set as the initial program voltage VPGM_SVU (=VPGM_BASE+VPGM_OFFU) for an upper page program.

In this way, the control circuit 122 reflects flag data in the initial program voltage for an upper page program.

S1204

The control circuit 122 starts a program operation of an upper page using the initial program voltage VPGM_SVU for an upper page program determined in Step S1203. Specifically, the row decoder 128 applies the updated program voltage VPGM_SVU to the selected word line WLn in response to the command of the control circuit 122 while turning on the selection transistor of the selected string unit, and the sense amplifier 126 applies a voltage according to upper page data to the bit line BL.

With this, data (normal data area 132a and redundancy area 132b) stored in the third cache 125c is programmed in the memory cell array 130.

S1205

Next, as shown in FIG. 13, in response to the command of the control circuit 122, the row decoder 128 appropriately applies any of the program verify voltages AVL, AV, BVL, BV, and CV to the selected word line WLn and executes the program verify operation.

S1206

The control circuit 122 determines whether or not program verification is passed. If program verification is passed in the selected page (Step S1206, YES), the program operation of the page ends.

S1207

When it is determined that program verification is not passed in the selected page (Step S1206, NO), the control circuit 122 determines whether or not the number of loops of the program operation of the page reaches the maximum value. When the number of loops reaches the maximum value, the program operation of the page ends.

S1208

In Step S1207, when the control circuit 122 determines that the number of loops does not reach the maximum value (Step S1207, NO), the control circuit 122 updates the number NWLn_loop of loops to NWLn_loop+1.

S1209

The control circuit 122 increases the program voltage VPGM_SVU by DVPGM_U. The control circuit 122 repeats the operation of Step S1204 using the updated program voltage VPGM_SVU.

The control circuit 122 repeats the operations of Steps S1204 to S1209 until it is determined that the verify operation of Step S1206 is passed or until it is determined in Step S1207 that the number of loops is the maximum value.

When "YES" in Step S1004

Next, a case where, in Step S1004, the control circuit 122 determines that the received address of the page is the address of the lower page (S1004, YES) will be described referring to the flowchart of FIG. 16.

When the sample string unit designation command is not received before the command sequence is received and when it is determined that the selected string unit SUP is not the string unit SU0, the control circuit 122 uses the string unit SU0 as a sample string unit. That is, the control circuit 122 does not perform the capture operation in spite of the lower page programming and sets the initial program voltage of the lower page based on flag data registered in the same word line of the sample string unit.

S1301

Figure 17:
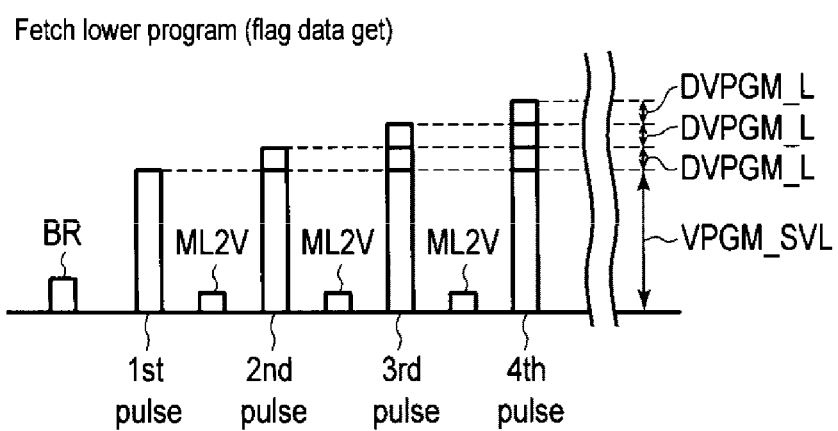
FIG. 17 is a diagram showing a lower page program operation according to the first embodiment.

First, the control circuit 122 stores data of the lower page in the first cache 125a. The control circuit 122 reads flag data from the sample string unit SU0. Specifically, as shown in FIG. 17, a B-level read voltage BR is applied to the selected word line WLn. Instead of the B-level read voltage BR, an A-level read voltage AR may be applied to the selected word line WLn. The read operation of Step S1301 is intended to read flag data. When the lower page and the upper page are programmed, as described above, flag data is data of "E" level or "B" level. For this reason, when reading flag data from the sample string unit, either B-level read or A-level read may be performed.

With this, it is possible to read data stored in the selected word line WLn.

S1302

The control circuit 122 writes the same data as flag data of the redundancy area 132b of the lower page of the read sample string unit SU0 in the redundancy area 132b stored in the first cache 125a.

The control circuit 122 stores the read flag data in the register 122c.

S1303

The control circuit 122 determines an initial program voltage VPGM (VPGM=VPGM_SVL) for a lower page program based on flag data stored in the register 122c.

In the following description, the initial program voltage for a lower page program will be described.

In the following description, the initial program voltage for a lower page program will be described referring to FIGS. 18 and 19.

(i) When flag data of lower page is {SV_OVER=0, NWLn_loop=m}

As described referring to FIG. 14, VPGMC+NWLn_loop×DVPGM_L is handled as a program voltage VPGM_BASE.

Figure 18:
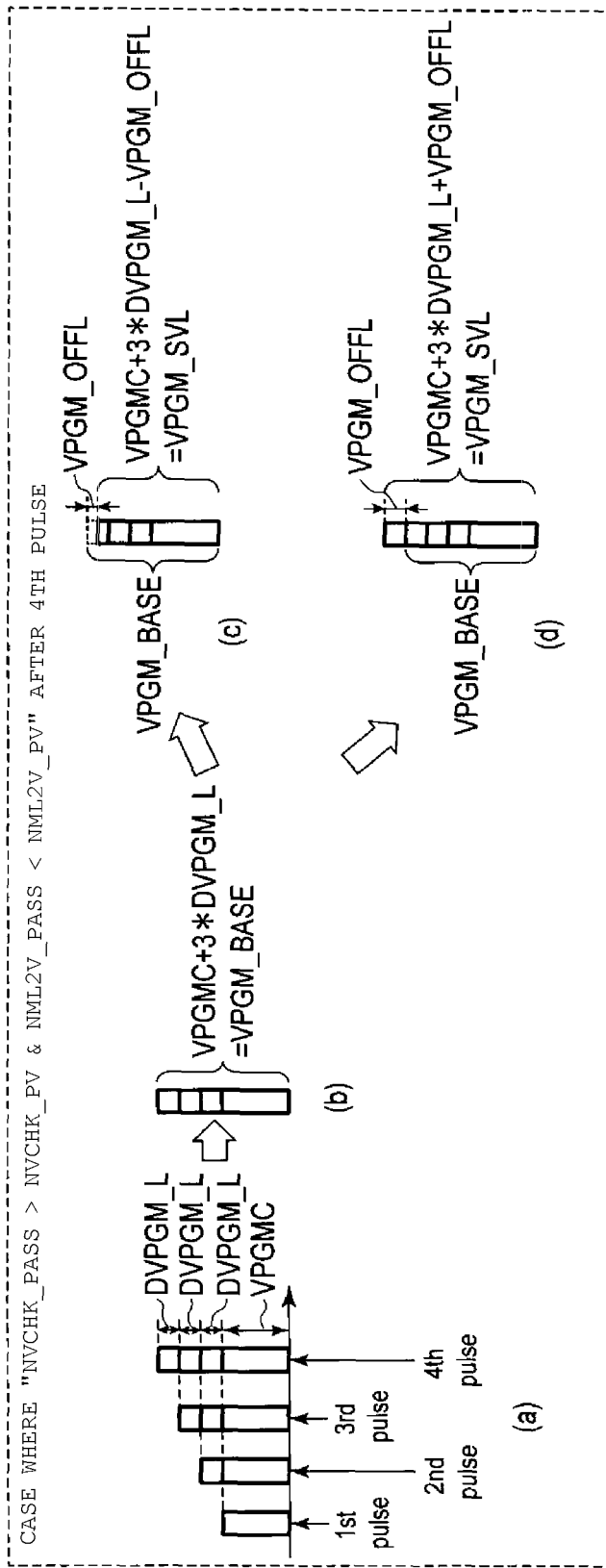
FIG. 18 is a diagram showing a method of determining an initial program voltage for lower page programming according to the first embodiment.

As shown in parts (a) and (b) of FIG. 18, in this example, the program voltage VPGM_BASE with flag data of {SV_OVER=0, NWLn_loop=3} becomes VPGMC+3× DVPGM_L.

(ii) When flag data of lower page is {SV_OVER=1, NWLn_loop=m}

As described referring to FIG. 15, VPGMC+NWLN_LOOP*DVPGM_L−1/2*DVPGM_L is handled as a program voltage VPGM_BASE.

Figure 19:
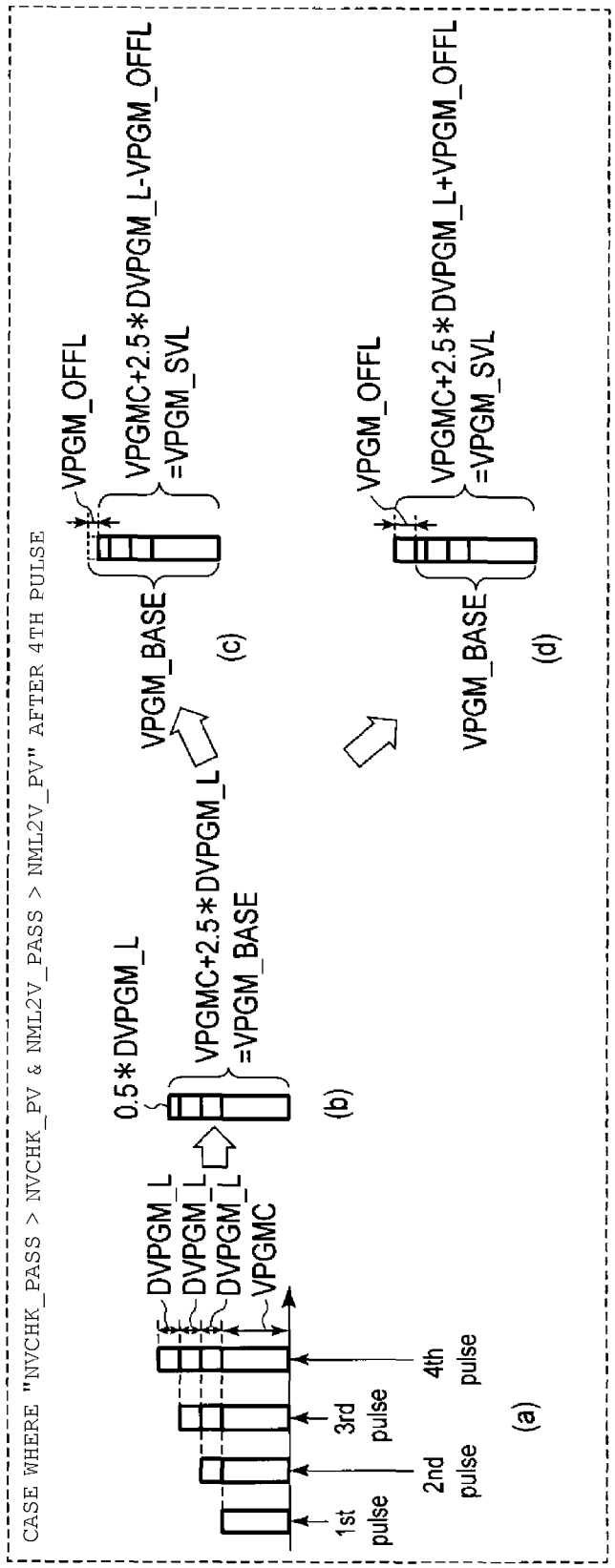
FIG. 19 is a diagram showing a method of determining an initial program voltage for lower page programming according to the first embodiment.

As shown in parts (a) and (b) of FIG. 19, in this example, the program voltage VPGM_BASE with flag data of {SV_OVER=1, NWLn_loop=3} becomes VPGMC+2.5× DVPGM_L.

(iii) Initial Program Voltage for Lower Page Program

The control circuit 122 may set the program voltage VPGM_BASE as the initial program voltage VPGM_SVL for a lower page program.

As shown in part (c) of FIG. 18 and part (c) of FIG. 19, a voltage obtained by subtracting an offset voltage VPGM_OFFL from the program voltage VPGM_BASE may be set as the initial program voltage VPGM_SVL (=VPGM_BASE−VPGM_OFFL) for a lower page program.

As shown in part (d) of FIG. 18 and part (d) of FIG. 19, a voltage obtained by adding the offset voltage VPGM_OFFL to the program voltage VPGM_BASE may be set as the initial program voltage VPGM_SVL (=VPGM_BASE+VPGM_OFFL) for a lower page program.

In this way, the control circuit 122 reflects flag data in the initial program voltage for a lower page.

S1304

As shown in FIG. 17, the control circuit 122 performs the program operation of the lower page using the program voltage VPGM_SVL. Specifically, the row decoder 128 applies the updated program voltage VPGM_SVL to the selected word line WLn in response to the command of the control circuit 122 while turning on the selection transistor of the selected string unit. The sense amplifier 126 applies a voltage according to write data to the bit line BL.

With this, data (normal data area 132a and redundancy area 132b) stored in the third cache 125c is programmed in the memory cell array 130.

S1305

Next, as shown in FIG. 17, the row decoder 128 applies a program verify voltage VML2V to the selected word line WLn in response to the command of the control circuit 122.

In this way, the control circuit 122 executes the program verify operation.

S1306

The control circuit 122 determines whether or not program verification is passed. If program verification is passed in the selected page (Step S1306, YES), the program operation of the page ends.

S1307

When it is determined that program verification is not passed in the selected page (Step S1306, NO), the control circuit 122 determines whether or not the number of loops of the program operation of the page reaches a maximum value. When the number of loops reaches the maximum value, the program operation of the page ends.

S1308

In Step S1307, when the control circuit 122 determines that the number of loops does not reach the maximum value (Step S1307, NO), the control circuit 122 updates the number NWLn_loop of loops to NWLn_loop+1.

S1309

The control circuit 122 increases the program voltage VPGM_SVL by DVPGM_L. The control circuit 122 repeats the operation of Step S1304 using the updated program voltage VPGM_SVL.

The control circuit 122 repeats the operations of Steps S1304 to S1309 until it is determined that the verify operation of Step S1306 is passed or until it is determined in Step S1307 that the number of loops is the maximum value.

When "NO" in Step S1004

Next, in Step S1004, when the control circuit 122 determines that the address of the received page is not the address of the lower page (S1004, NO), the control circuit 122 performs, on the selected string unit SU, the same operations as the operations described in Steps S1201 to S1209.

On the other hand, flag data stored in the sample string unit SU0 is stored in the redundancy area of the lower page corresponding to the upper page of the selected string unit SU. For this reason, the meaning is substantially the same as a case where the control circuit 122 determines the initial program voltage for an upper page of the selected string unit SU using flag data stored in the redundancy area of the lower page of the sample string unit SU0.

When "YES" in Step S1006

Next, a case where, in Step S1006, the control circuit 122 determines that the received address of the page is the address of the lower page (S1006, YES) will be described referring to the flowchart of FIG. 20.

When the sample string unit designation command is received before the command sequence is received and when it is determined that the designated string unit SUQ is a non-existing string unit SU (when only the string units SU0 to SU3 exist and when the designated string unit SUQ=SU4), the control circuit 122 sets the initial program voltage of the lower page using flag data stored in the register 122c.

S1401

First, the control circuit 122 stores data of the lower page in the third cache 125c. The control circuit 122 writes flag data stored in the register 122c of the control circuit 122 to the redundancy area 132b stored in the third cache 125c.

S1402 to S1407

The operations of Steps S1402 to S1407 are the same as the operations described in Steps S1303 to S1308.

When "NO" in Step S1006

Next, a case where, in Step S1006, the control circuit 122 determines that the address of the received page is not the address of the lower page (S1006, YES) will be described. The control circuit 122 performs, on the selected string unit SU, the same operations as the operations described in Steps S1201 to S1209.

On the other hand, flag data stored in the sample string unit SU0 is stored in the redundancy area of the lower page corresponding to the upper page of the selected string unit SU. For this reason, the meaning is substantially the same as a case where the control circuit 122 determines the initial program voltage for an upper page of the selected string unit SU using flag data stored in the redundancy area of the lower page of the sample string unit SU0.

When "YES" in Step S1008

Next, a case where, in Step S1008, the control circuit 122 determines that the received address of the page is the address of the lower page (S1008, YES) will be described.

When the sample string unit designation command is received before the command sequence is received, a string unit SU designated by the designated string unit SUQ exists, the designated string unit SUQ and the selected string unit SUP match each other, and it is determined to be the program operation of the lower page, the control circuit 122 performs the capture operation on the designated string unit SUQ.

There is a case where the sample string unit SU0 is unavailable due to defect. In this case, a string unit which is used as a sample string unit is designated by the designated string unit SUQ.

The memory system 100 performs, on the designated string unit SUQ, the same operations as the operations described in Steps S1101 to S1117.

When "NO" in Step S1008

Next, in Step S1008, when it is determined that the address of the received page is not the address of the lower page (S1008, NO), the memory system 100 performs, on designated string unit SUQ, the same operations as the operations of Steps S1201 to S1209 on the sample string unit SU0.

When "YES" in Step S1009

Next, a case where, in Step S1009, the control circuit 122 determines that the received address of the page is the address of the lower page (S1009, YES) will be described.

When the sample string unit designation command is received before the command sequence is received, the designated string unit SUQ is an existing string unit, the designated string unit SUQ and the selected string unit SUP do not match each other, and it is determined to be the program operation of the lower page, the control circuit 122 reads flag data from the designated string unit SUQ.

The memory system. 100 performs, on the designated string unit SUQ, the same operations as the operations of Steps S1301 to S1309 on the sample string unit SU0.

When "NO" in Step S1009

Next, in Step S1009, when it is determined that the address of the received page is not the address of the lower page (S1009, NO), the memory system 100 performs, on the designated string unit SUQ, instead of the string unit SU0, the same operations as the operations described in Steps S1201 to S1209.

In Regards to Functional Effect of Write Operation of Data According to First Embodiment According to the above-described first embodiment, the control circuit 122 determines whether or not the sample string unit designation command is received before the command sequence is received or whether or not an existing string unit is designated
(i) to perform the capture operation during lower page programming,
(ii) to read flag data from the sample string unit SU0 or the designated string unit SUQ and to determine the initial program voltage for the lower page,
(iii) to read flag data of the lower page corresponding to the upper page and to determine the initial program voltage for the upper page, or
(iv) to determine the initial program voltage for the lower page using flag data stored in the register 122c of the control circuit 122.

When successively programmed, if the memory cell transistors programmed are in the same word line belonging to different string units of the same block, the result of the capture operation is stored in the register 122c of the control circuit 122. For this reason, when successively programming the memory cell transistors which belongs to the same word line belonging to different string units of the same block, the capture operation may be performed at least once.

With this, when determining the initial program voltage for a lower page or an upper page, the memory system 100 may determine the optimum initial program voltage while suppressing the number of capture operations.

When determining the initial program voltage for a lower page using flag data stored in the register 122c of the control circuit 122, the memory system 100 does not need to perform the read operation of flag data from the sample string unit. For this reason, the memory system 100 may determine the optimum initial program voltage in a shorter time compared to a case where flag data is read from the sample string unit.

According to the above-described embodiment, the control circuit 122 receives the sample string unit designation command before the command sequence is received, thereby appropriately selecting a sample string unit. For this reason, for example, when the string unit SU0 is a defective string unit, it is possible to designate a string unit SUQ other than the string unit SU0 as a sample string unit.

As described above, according to the first embodiment, the sample string unit designation command is used, whereby the memory system 100 may appropriately select a destination of flag data for use in determining the initial program voltage for an upper page. With this, it is possible to obtain a high-quality memory system 100.

SPECIFIC EXAMPLE

Next, in order to describe some of the functional effects of the first embodiment, specific examples according to this embodiment will be described referring to FIGS. 21 and 22.

Figure 21:
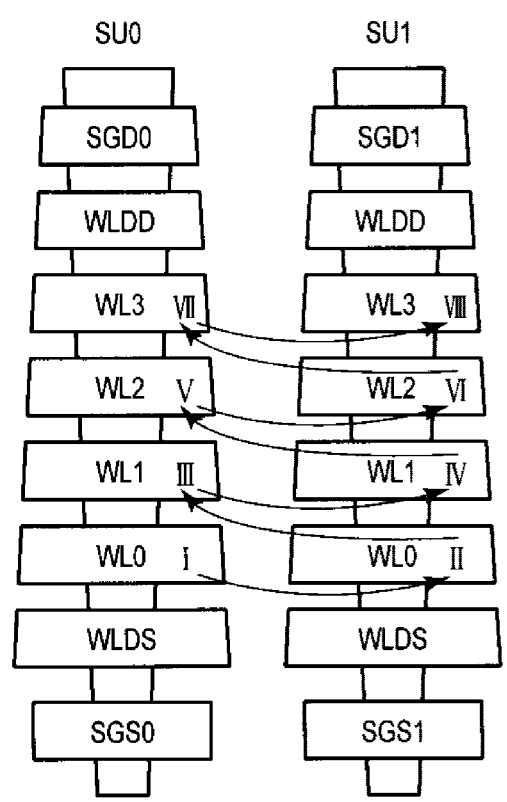
FIG. 21 is a schematic view of a string unit according to a specific example of the first embodiment.

As shown in FIG. 21, for simplification, a case where the first program operation is performed on two string units and four word lines WL will be described. For example, a sample string unit is the string unit SU0. In this specific example, the control circuit 122 programs I (SU0, WL0) to VIII (SU1, WL3) in order.

In the following description, an example where flag data stored in the register 122c of the control circuit 122 is used and an example where flag data is not used will be described.

Specific Example 1

Figure 22:
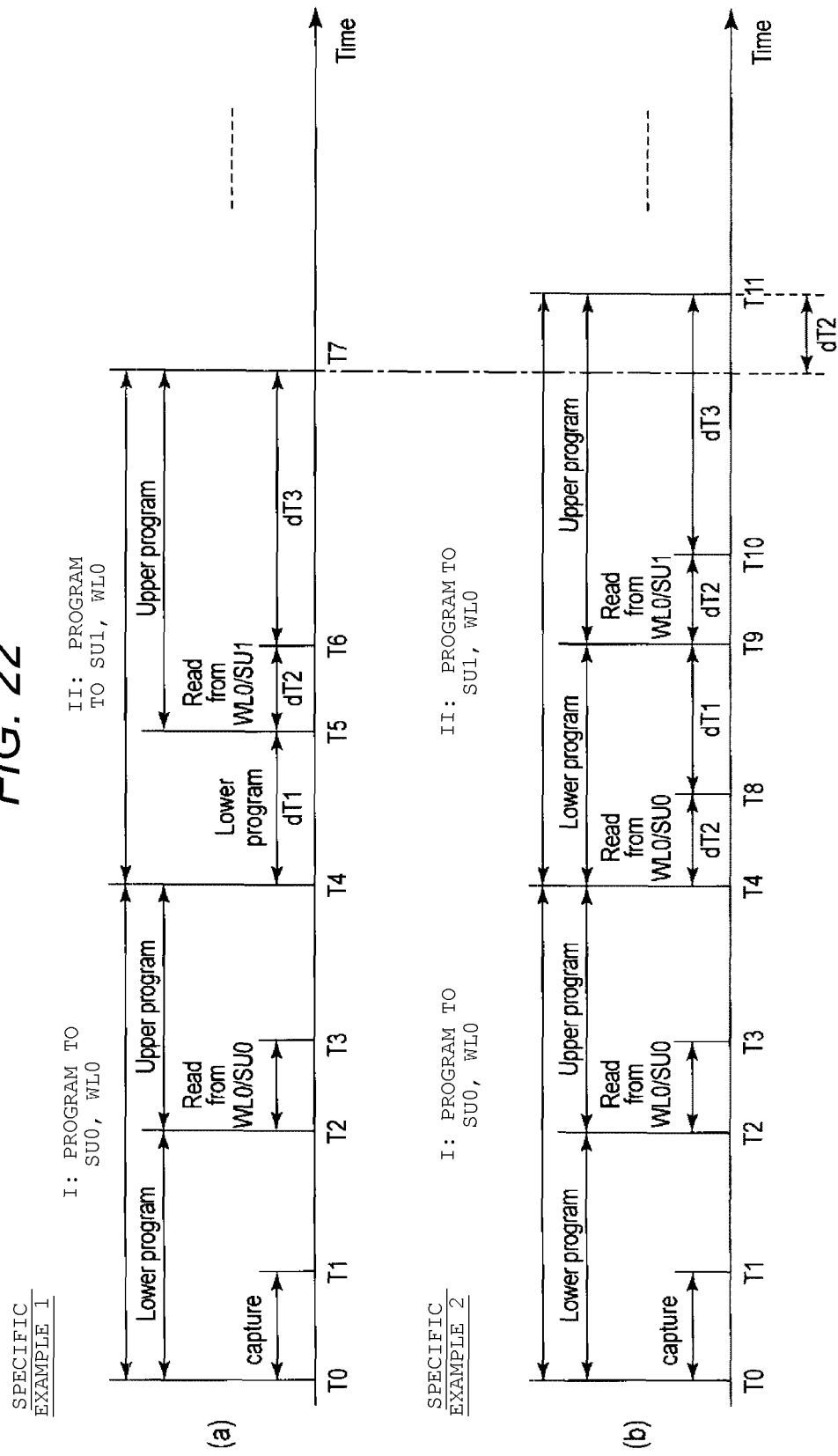
FIG. 22 is a diagram showing the time required for a program operation of specific example 1 and specific example 2 of the first embodiment.

As shown in (a) of FIG. 22, in Specific Example 1 according to this embodiment, the control circuit 122 performs the capture operation during the lower page program of the sample string unit SU0 and performs the upper page program using the result of the capture operation during the upper page program of the sample string unit SU0.

In the lower page program of the string unit SU1, the control circuit 122 reads flag data stored in the register 122c and performs the lower page program. In the upper page program of the string unit SU1, data of the corresponding lower page is read, and the upper page program is performed using flag data of the lower page.

Figure 10:
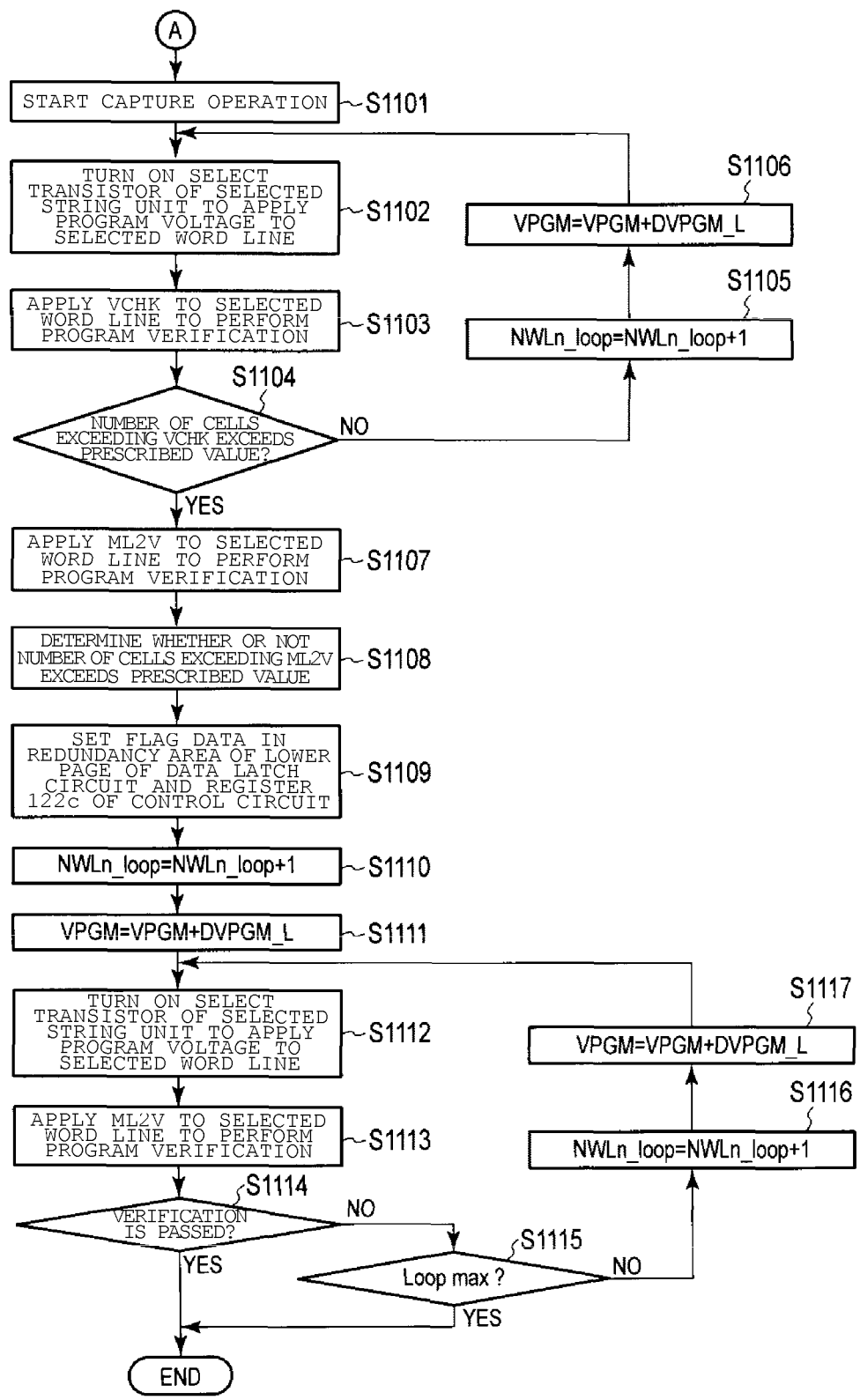
FIG. 10 is a flowchart showing the program operation of the semiconductor memory device according to the first embodiment.

Specifically, as shown in I of part (a) of FIG. 22, at the time T0, the control circuit 122 performs the capture operation during the lower page program of the sample string unit SU0 (the same operations as Steps S1101 to S1108 described referring to FIG. 10).

At the time T1, the control circuit 122 performs the lower page program based on flag data (the same operations as Steps S1109 to S1117 described referring to FIG. 10).

Subsequently, at the time T2, the control circuit 122 reads data of the lower page of the string unit SU0 and the word line WL0 so as to perform the upper page program (the same operations as Steps S1201 and S1202 referring to FIG. 12).

At the time T3, the control circuit 122 determines the initial program voltage for an upper page program based on flag data included in the lower page. The control circuit 122 performs the upper page program based on the initial program voltage (the same operations as Steps S1203 to S1209 described referring to FIG. 12).

Figure 20:
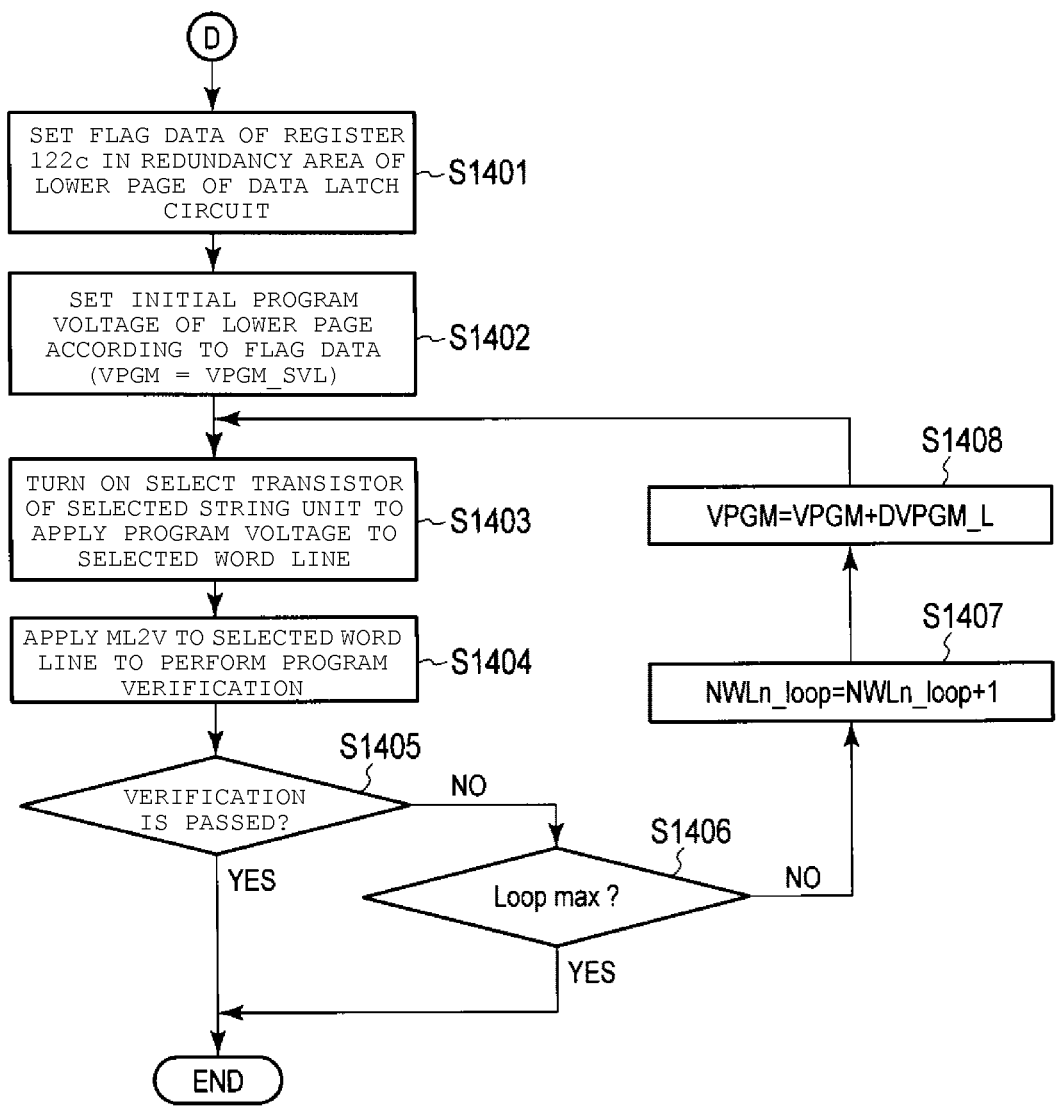
FIG. 20 is a flowchart showing the program operation of the semiconductor memory device according to the first embodiment.

As shown in II of part (a) of FIG. 22, at the time T4, the control circuit 122 reads flag data from the register 122c during the lower page program of the word line WL0 of the string unit SU1 (the same operations as Steps S1401 and S1402 described referring to FIG. 20). This operation is performed in a shorter time compared to other operations. Subsequently, the control circuit 122 determines the initial program voltage for a lower page program based on flag data and performs the lower page program (the same operations as Steps S1403 to S1408 described referring to FIG. 18). The time required from the time T4 to the time T5 is referred to as dT1.

Figure 12:
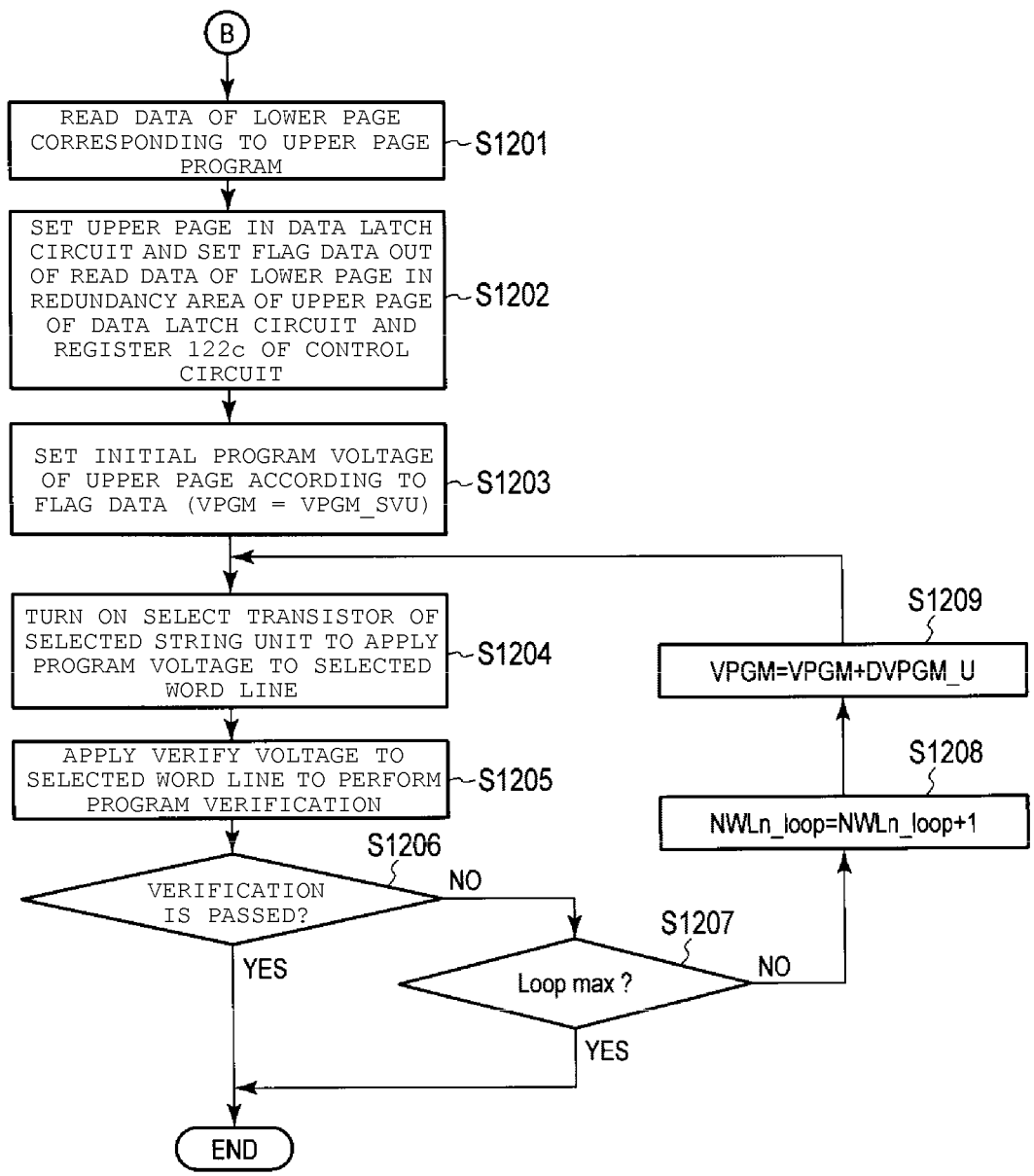
FIG. 12 is a flowchart showing the program operation of the semiconductor memory device according to the first embodiment.

At the time T5, the control circuit 122 reads data of the lower page of the string unit SU1 and the word line WL0 so as to perform the upper page program (the same operations as Steps S1201 and S1202 described referring to FIG. 12). The time required from the time T5 to the time T6 is referred to as dT2.

At the time T6, the control circuit 122 determines the initial program voltage for an upper page program based on flag data out of the read lower page data and performs the upper page program (the same operations as Steps S1203 to S1209 described referring to FIG. 12). The time required from the time T6 to the time T7 when the upper page program is completed is referred to as dT3.

As described above, the lower page program and the upper page program are performed in the word line WL0 of the string unit SU0 and the word line WL0 of the string unit SU1. In Specific Example 1, for example, the program operation is performed on the word lines WL1 to WL3 (III to VIII) of the string unit SU0 and the string unit SU1.

Specific Example 2

As shown in part (b) of FIG. 22, in Specific Example 2 of this embodiment, the control circuit 122 reads flag data from the sample string unit SU0 when performing the lower page program of the string unit SU1. The control circuit 122 sets the initial program voltage for a lower page program or an upper page program based on flag data and performs the lower page program or the upper page program.

As shown in I of part (b) of FIG. 22, the program operation of the word line WL0 of the string unit SU0 is the same operation as each operation in Specific Example 1 described referring to I of (a) of FIG. 22.

Figure 16:
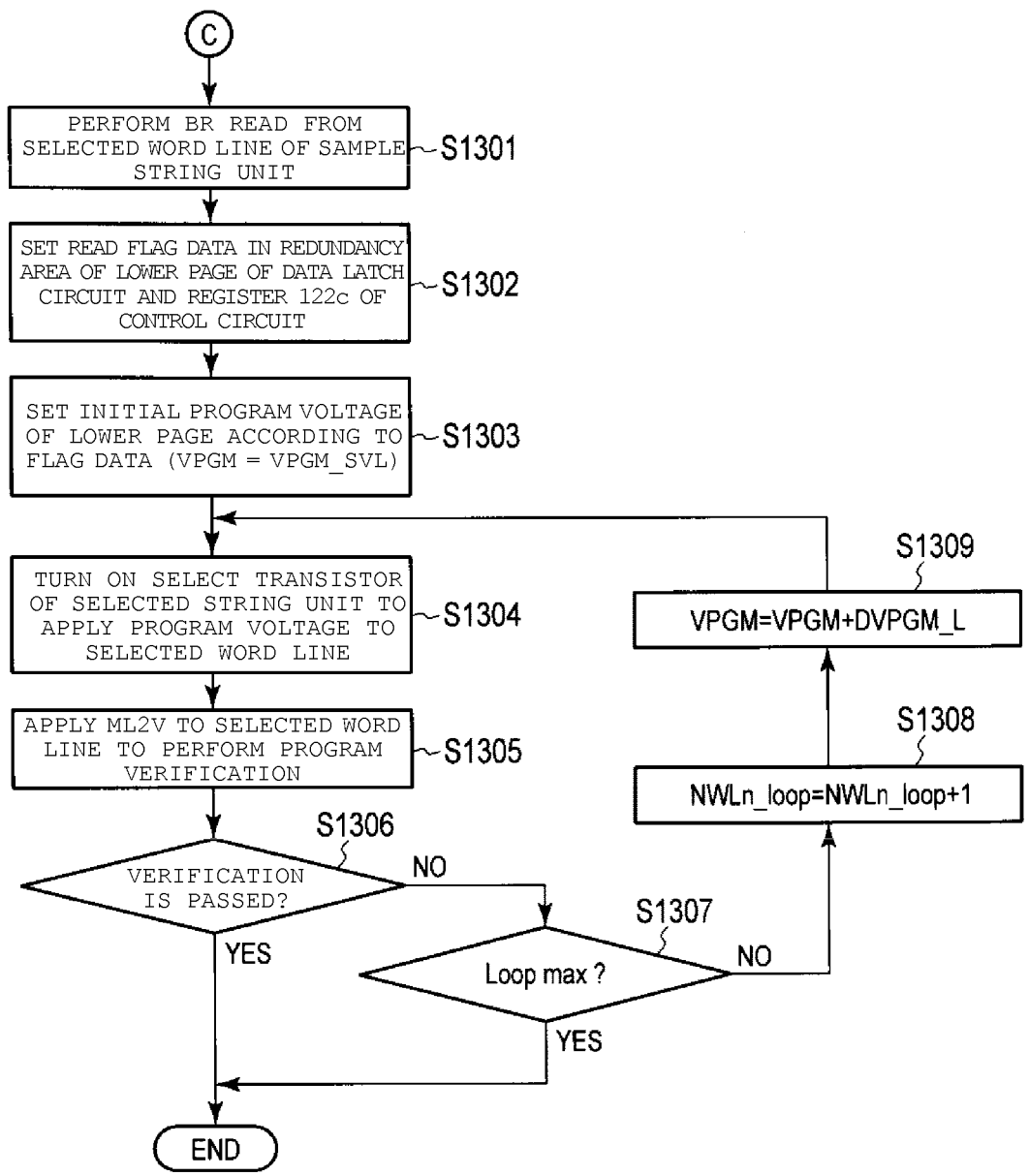
FIG. 16 is a flowchart showing the program operation of the semiconductor memory device according to the first embodiment.

As shown in II of part (b) of FIG. 22, at the time T4, the control circuit 122 reads flag data from the word line WL0 of the sample string unit SU0 during the lower page program of the word line WL0 of the string unit SU1 (the same operations as Steps S1301 and S1302 described referring to FIG. 16). The time required from the time T4 to the time T8 is referred to as dT2.

At the time T8, the control circuit 122 determines the initial program voltage for a lower page program based on flag data and performs the lower page program (the same operations as Steps S1303 to S1309 described referring to FIG. 16). The time required from the time T8 to the time T9 is referred to as dT1.

At the time T9, the control circuit 122 reads data of the lower page of the word line WL0 of the string unit SU1 so as to perform the upper page program of the word line WL0 of the string unit SU1 (the same operations as Steps S1201 and S1202 described referring to FIG. 12). The time required from the time T11 to the time T12 is referred to as dT3.

At the time T10, the control circuit 122 determines the initial program voltage for an upper page program based on flag data out of the read lower page data. The control circuit 122 performs the upper page program (the same operations as Steps S1203 to S1209 described referring to FIG. 12). The time required from the time T10 to the time T11 when the upper page program is completed is referred to as dT3.

As described above, the lower page program and the upper page program are performed in the word line WL0 of the string unit SU0 and the word line WL1 of the string unit SU0. In Specific Example 2, for example, the program operation is performed on the word lines WL1 to WL3 (III to VIII) of the string unit SU0 and the string unit SU1.

As described above, the program time dTA (dT1+dT2+dT3) of the memory cell transistor regarding the word line WL0 of the string unit SU1 in Specific Example 1 is shorter than the program time dTB (dT1+2×dT2+dT3) of the memory cell transistor regarding the word line WL0 of the string unit SU1 in Specific Example 2 by dT2.

As described above, Specific Example 1 uses flag data stored in advance in the register 122c of the control circuit 122 for a program operation in other string units, whereby it is possible to suppress the time of read operations from the sample string unit.

Second Embodiment

Subsequently, a memory system 100 according to a second embodiment will be described. The second embodiment is different from the first embodiment in that a control circuit 122 applies the second program, instead of the first program, in the program operation to the memory cell array 130. In the second embodiment, the structural elements having substantially same functions and configurations as those in the above-described first embodiment will be given the same notations, and duplicate description will be provided only when necessary.

In Regards to Write Operation of Data According to Second Embodiment

Figure 23:
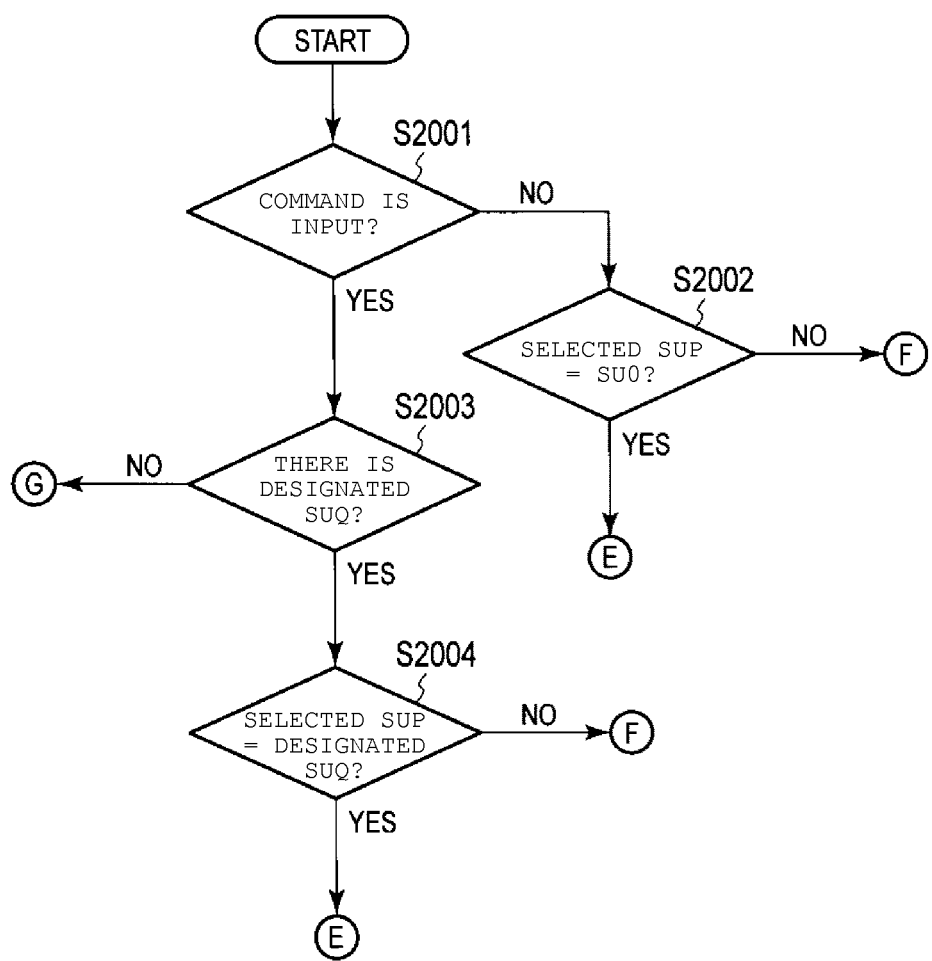
FIG. 23 is a flowchart showing a program operation of a semiconductor memory device according to a second embodiment.

Hereinafter, a second program operation according to the second embodiment will be described referring to the flowchart of FIG. 23. Processing described below is primarily executed under the control of the control circuit 122.

S2001

When the control circuit 122 applies the second program to perform a program, the NAND flash memory 120 first receives a command sequence regarding the lower page. The NAND flash memory 120 receives a command sequence regarding an upper page after the command sequence regarding the lower page. The control circuit 122 determines whether or not the sample string unit designation command is received before the program command, the block address, the address (including address information of the selected string unit SUP) of the page, data, and the program start command are received from the memory controller 110.

Command Sequence Example 3

A command sequence regarding the second program when the sample string unit designation command is not received before the program start command is received will be described referring to FIG. 24.

Figure 24:
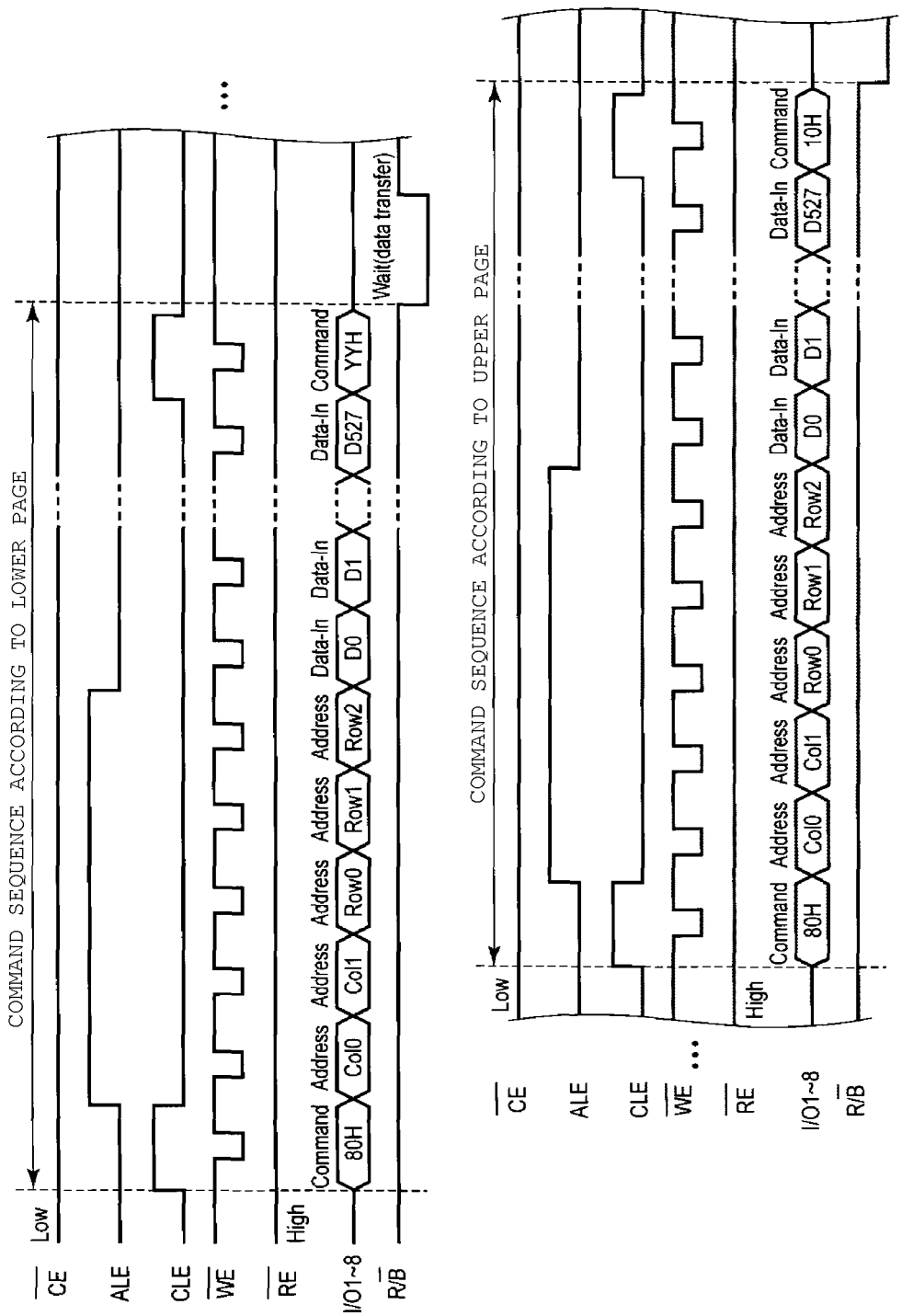
FIG. 24 is a diagram showing an example of a command sequence according to the second embodiment.

As shown in FIG. 24, the same operation as the operation described referring to FIG. 8 is performed until the input of data regarding the lower page to the NAND flash memory 120 is completed. A command "YYH" is input from the memory controller 110 to the NAND flash memory 120 during a period in which the command latch enable signal CLE is at "H" level. With this, data stored in the first cache 425a is stored in other caches. With this, the ready/busy signal (R/Bn) is in a "busy" state.

Subsequently, a command sequence regarding the upper page program is input to the NAND flash memory 120. The same operation as the operation described referring to FIG. 8 is performed until the input of data regarding the upper page is completed. A command "10H" is input from the memory controller 110 to the NAND flash memory 120 during a period in which the command latch enable signal CLE is at "H" level. With this, the control circuit 122 performs the second program using data regarding the lower page and data regarding the upper page.

Command Sequence Example 4

A command sequence regarding the second program when the sample string unit designation command is received before the program start command is received will be described referring to FIG. 25.

Figure 25:
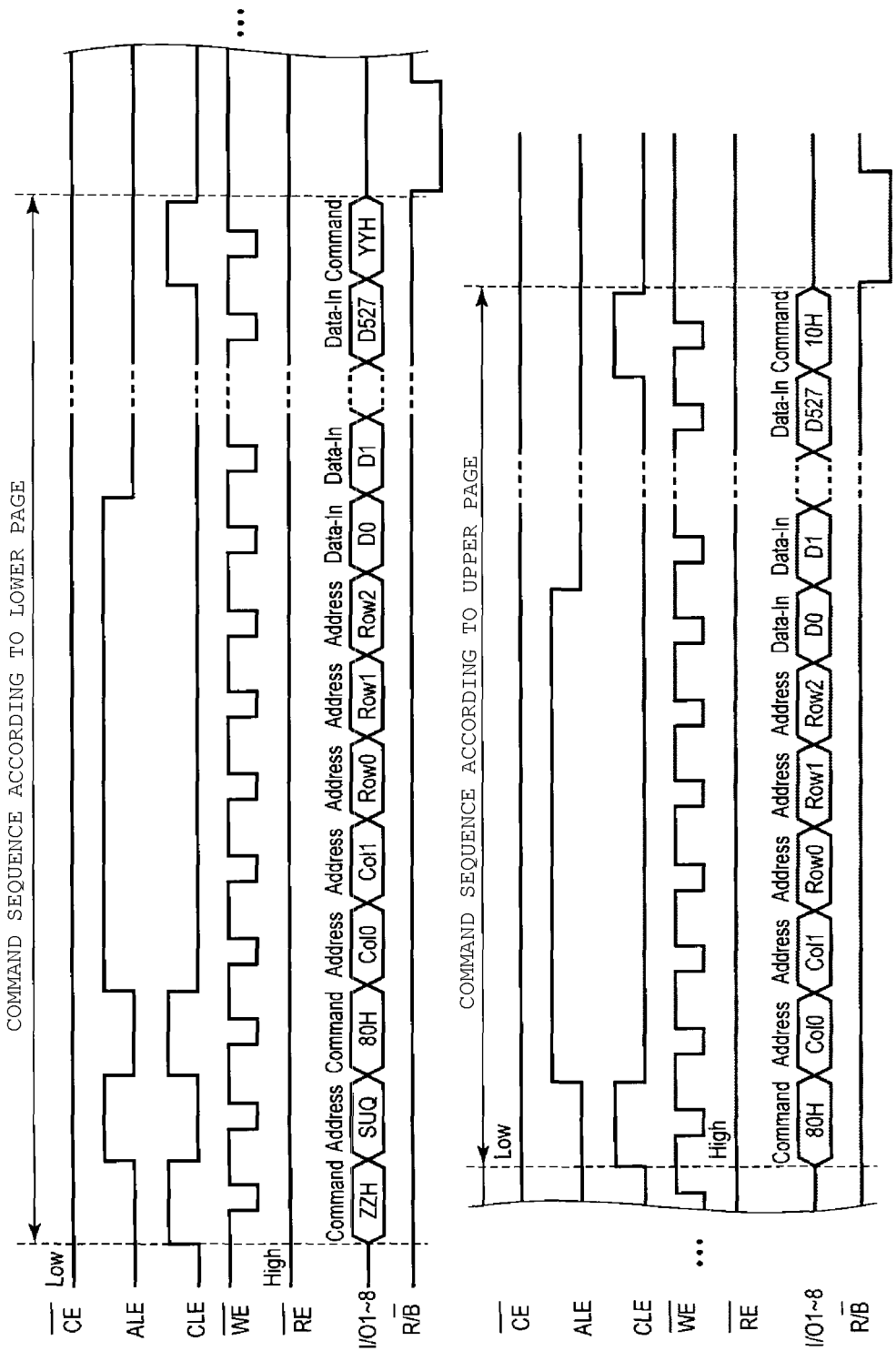
FIG. 25 is a diagram showing an example of the command sequence according to the second embodiment.

As shown in FIG. 25, the sample string unit designation command "ZZH" is input from the memory controller 110 to the NAND flash memory 120 during a period in which the command latch enable signal CLE is at "H" level.

The NAND flash memory 120 operates in the same manner as the operation described referring to FIG. 24.

S2002

In Step S2001, when it is determined that the sample string unit designation command is not received (S2001, NO), the control circuit 122 handles the string unit SU0 as a sample string unit. The control circuit 122 determines whether or not the selected string unit SUP is the string unit SU0.

S2003

In Step S2001, when it is determined that the sample string unit designation command is received (S2001, YES), the control circuit 122 determines whether or not an address of an effective string unit is designated along with the sample string unit designation command. The designated string unit is referred to as the designated string unit SUQ or the like.

S2004

In Step S2003, when it is determined that the designated string unit SUQ is an effective string unit (S2003, YES), the control circuit 122 determines whether or not the selected string unit SUP is the same as the designated string unit SUQ.

When "YES" in Step S2002

Next, a case where, in S2002, the control circuit 122 determines that the selected string unit SUP is the string unit SU0 (S2002, YES) will be described referring to FIG. 26. In the following description, an operation example where the capture operation is performed as a part of the second program operation will be described.

S2101

For example, the control circuit 122 stores data of the lower page in the third cache 125c. The control circuit 122 stores data of the upper page in the second cache 125b. The control circuit 122 performs the capture operation.

The control circuit 122 sets non-write data in a column address, in which flag data of the redundancy areas 132b and 133b is stored, until the capture operation ends.

S2102

Figure 27:
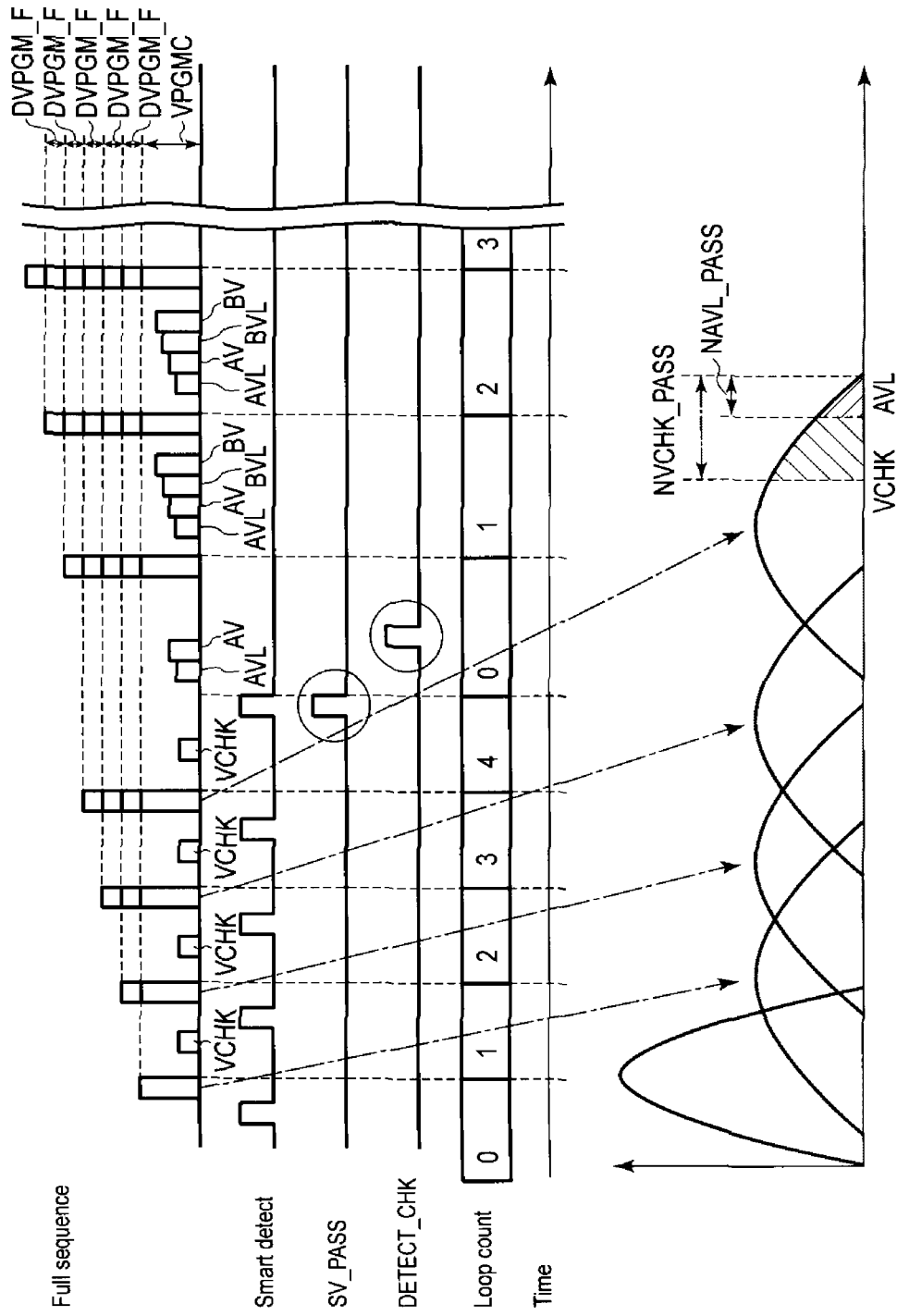
FIG. 27 is a diagram showing a capture operation according to the second embodiment.

Next, as shown in FIG. 27, if the program start command is received, the control circuit 122 starts the second program operation. Specifically, the row decoder 128 applies the program voltage VPGMC to the selected word line WLn in response to the command of the control circuit 122 while turning on the selection transistor of the selected string unit. The sense amplifier 126 applies a voltage according to program data to the bit line BL.

With this, the control circuit 122 programs data stored in the third cache 125c in the memory cell transistor MT.

S2103 to S2106

The operations of Steps S2103 to S2106 are the same as the operations of Steps S1103 to S1106.

S2107

In Step S2104, when the control circuit 122 determines the number NCHK_PASS of memory cell transistors exceeds the prescribed value NCHK_PV (S2104, YES), the control circuit 122 raises the signal SV_PASS from "L (Low)" level to "H (High)" level. If the signal SV_PASS is raised from "L" level to "H" level, the control circuit 122 performs a program verify operation so as to determine whether or not the number NAV_PASS of memory cell transistors exceeding the voltage AV or AVL exceeds the prescribed value NAV_PV. As described in Step S1108 described above, the program verify operation is performed so as to determine whether or not there is a concern about over-program when a program voltage to be "YES" in Step S2104 is set as an initial program voltage. Specifically, the row decoder 128 applies the verify voltage AV or AVL to the selected word line WLn to perform the program verify operation.

During the program verify operation, a voltage VSG (VSGD<VSG) is applied to selected selection gate line SGD_SEL and selection gate line SGS_SEL, and a ground potential VSS is applied to an unselected selection gate line SGD_USEL and an unselected selection gate line SGS_USEL. A voltage VREAD (VREAD<VPASS<VPGMC) is applied to an unselected word line WL_USEL.

S2108

If the program verify result is read in Step S2107, the control circuit 122 raises the signal DETECT_CHK from"L" level to "H" level. The control circuit 122 determines whether or not the number NAV_PASS of memory cell transistors exceeding the voltage AV or AVL exceeds the prescribed value NAV_PV during a period in which the signal DETECT_CHK is "H". The prescribed value NAV_PV is stored in the memory cell array 130 and read at the time of the activation of the memory system 100, and the control circuit 122 stores the prescribed value NAV_PV in the register 122b.

S2109

After the capture operation is completed, the control circuit 122 stores the capture result in the register 122c as flag data. Similarly to flag data described in the first embodiment, flag data is eight-bit data. In the second embodiment, out of the eight-bit data, data for one bit is allocated to the determination result (whether or not the number NAV_PASS of memory cell transistors exceeding the voltage AV exceeds the prescribed value NAV_PV), and data for seven bits is allocated to the number of loops.

Specifically, when the number NWLn_loop of loops=4 and when the number NCHK_PASS of memory cell transistors is NCHK_PASS>NCHK_SV and NAV_PASS<NAV_PV, eight-bit flag data is expressed as {0_000_100}. When the number NWLn_loop of loops=4 and when the number NCHK_PASS of memory cell transistors is NCHK_PASS>NCHK_SV and NAV_PASS>NAV_PV, eight-bit data is expressed as {1_000_100}. In this embodiment, the most significant bit of flag data is defined as SV_OVER. That is, the format of flag data is {SV_OVER,NWLn_loop[6:0]}. When the number NAV_PASS of memory cell transistors exceeding the voltage AV does not exceed the prescribed value NAV_PV, the bit SV_OVER becomes "0", and when the number NAV_PASS of memory cell transistors exceeding the voltage AV exceeds the prescribed value NAV_PV, the bit SV_OVER becomes "1".

The control circuit 122 writes flag data stored in the register 122c to the redundancy area 132b stored in the third cache 125c and releases the program inhibit state of flag data of the redundancy area 132b. The program operation of flag data starts along with the normal data area 132*a* from the application of a subsequent program pulse. At this time, the control circuit 122 resets the loop counter.

S2110, S2111

The operations of Steps S2110 and S2111 are the same as the operations of Steps S1110 and S1111 described above.

S2112

As in this example, when the capture operation is performed as a part of the second program, the control circuit 122 continues the second program operation after the capture operation.

Specifically, the row decoder 128 applies a program voltage VPGM (VPGM=VPGM_SVF) to the selected word line WLn in response to the command of the control circuit 122 while turning on the selection transistor of the selected string unit. The sense amplifier 126 applies a voltage according to lower page data and upper page data to the bit line BL in response to the command of the control circuit 122.

With this, data stored in the third cache 125*c* and the second cache 125*b* is programmed in the memory cell array 130.

S2113 to S2116

The operations of Steps S2113 to S2116 are the same as the operations of Steps S1205 to S1208.

The control circuit 122 increases the program voltage VPGM by DVPGM_F. The control circuit 122 repeats the operation of Step S2112 using the updated program voltage VPGM.

The control circuit 122 repeats the operations of Steps S2112 to S2117 until the verify operation of Step S2114 is passed or until it is determined in Step S2115 that the number of loops is the maximum value.

When "NO" in Step S2002

Next, a case where, in Step S2002, the control circuit 122 determines that the selected string unit SUP is not the string unit SU0 (S2002, NO) will be described referring to FIG. 28.

When the sample string unit designation command is not received before the command sequence is received and when it is determined that the selected string unit SUP is not the string unit SU0, the control circuit 122 uses the string unit SU0 as a sample string unit. That is, the control circuit 122 sets the initial program voltage of the lower page based on flag data registered in the same word line of the sample string unit without performing a cache operation.

S2201

In Step S2201, the control circuit 122 performs the same operation as the operation of Step S1301.

S2202

The control circuit 122 writes the same data as the read flag data in the redundancy area 132*b* of the lower page stored in the first cache 125*a* and the redundancy area 133*b* of the upper page stored in the second cache 125*b*. The control circuit 122 stores the read flag data in the register 122*c*.

S2203

Next, the control circuit 122 determines the initial program voltage VPGM (VPGM=VPGM_SVF) for a second program based on flag data stored in the register 122*c*.

In the following description, the initial program voltage for a second program will be described.

First, the control circuit 122 derives the program voltage VPGM_BASE as described referring to FIGS. 14 and 15 in the first embodiment. The control circuit 122 may set the above-described program voltage VPGM_BASE as the initial program voltage VPGM_SVF for a second program.

A voltage obtained by subtracting the offset voltage VPGM_OFFF from the program voltage VPGM_BASE may be set as the initial program voltage VPGM_SVF (=VPGM_BASE−VPGM_OFFF) for a second program.

A voltage obtained by adding the offset voltage VPGM_OFFF to the program voltage VPGM_BASE may be set as the initial program voltage VPGM_SVF (=VPGM_BASE+VPGM_OFFF) for a second program.

S2204 to S2209

The operations of Steps S2204 to S2209 are the same as the operations of Steps S2112 to S2117.

When "NO" in Step S2003

Figure 29:
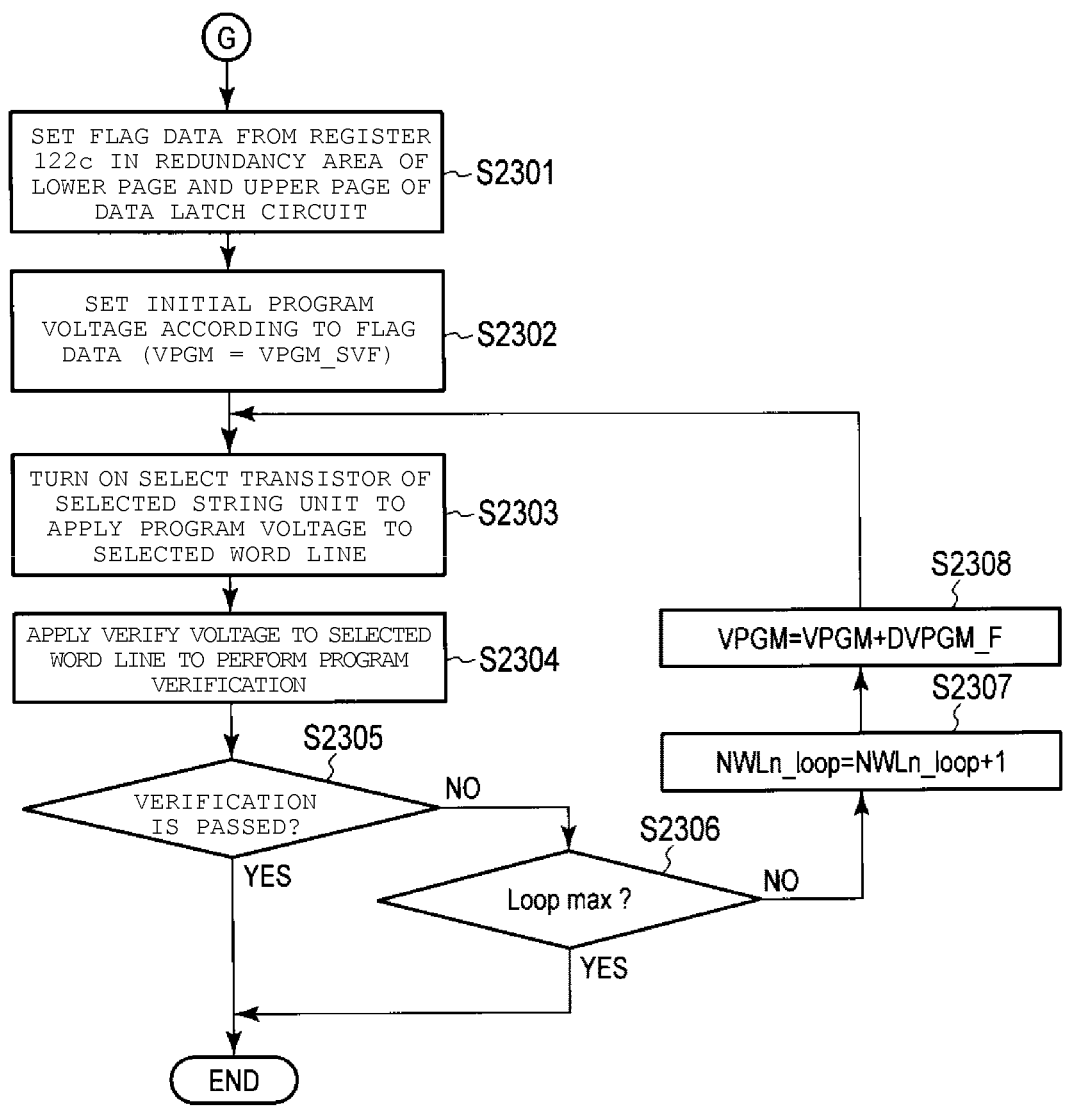
FIG. 29 is a flowchart showing the program operation of the semiconductor memory device according to the second embodiment.

Next, a case where, in Step S2003, the control circuit 122 determines that the designated string unit SUQ is not an effective string unit (S2003, NO) will be described referring to FIG. 29.

The control circuit 122 sets the initial program voltage of the second program using flag data stored in the register 122*c*.

S2301

First, the control circuit 122 stores data of the lower page in the third cache 125*c* and stores data of the upper page in the second cache 125*b*. The control circuit 122 writes flag data stored in the register 122*c* of the control circuit 122 in the redundancy area 132*b* stored in the third cache 125*c* and the redundancy area 133*b* stored in the second cache 125*b*.

S2302 to S2308

The operations of Steps S2302 to S2308 are the same as the operations of Steps S2203 to S2209.

When "YES" in Step S2004

Figure 26:
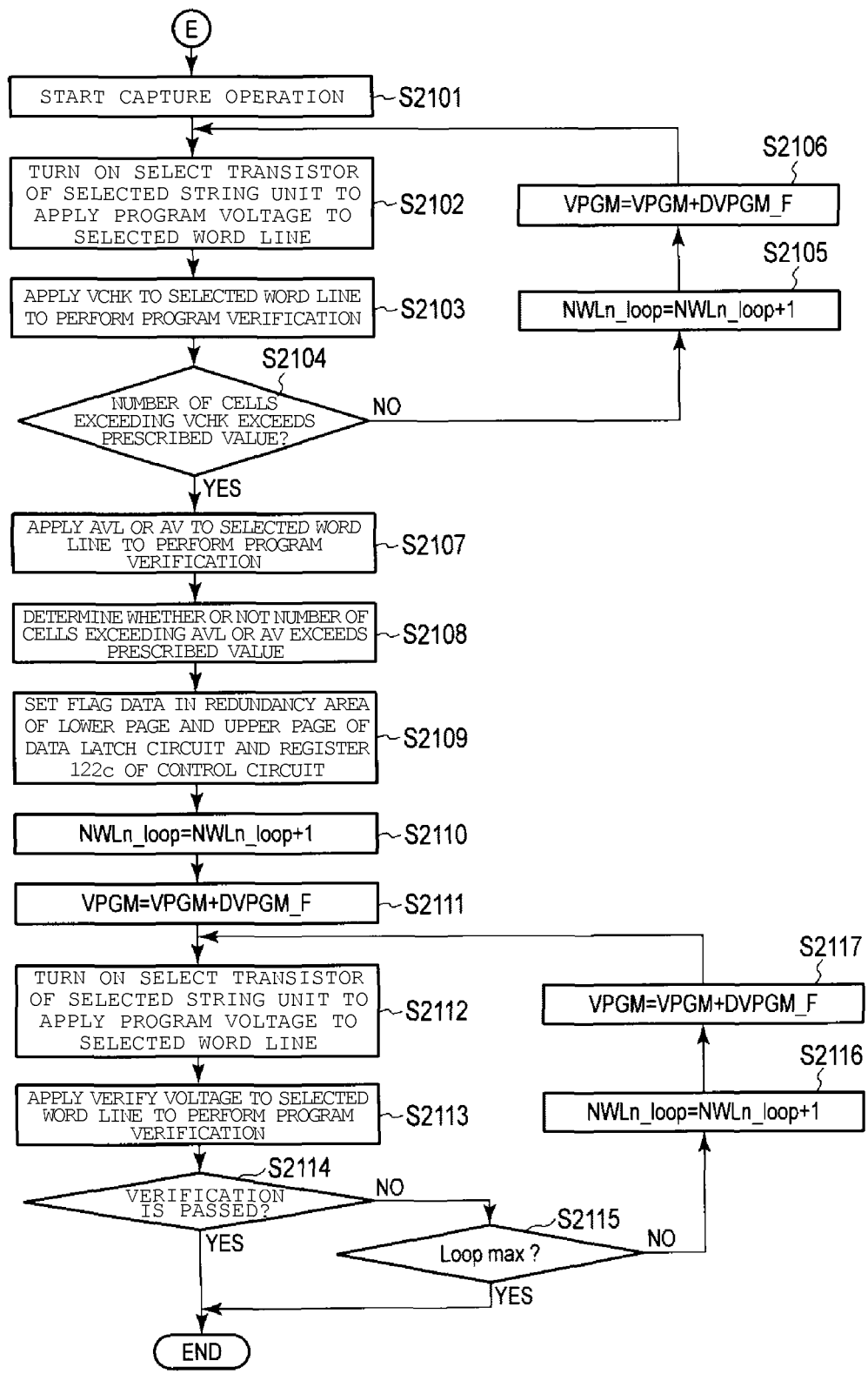
FIG. 26 is a flowchart showing the program operation of the semiconductor memory device according to the second embodiment.

In Step S2004, when the control circuit 122 determines that the designated string unit SUQ is the same as the selected string unit SUP (S2004, YES), the control circuit 122 replaces the designated string unit SUQ as a sample string unit and performs the same operation as the operation described referring to FIGS. 26 and 27.

When "NO" in Step S2004

Figure 28:
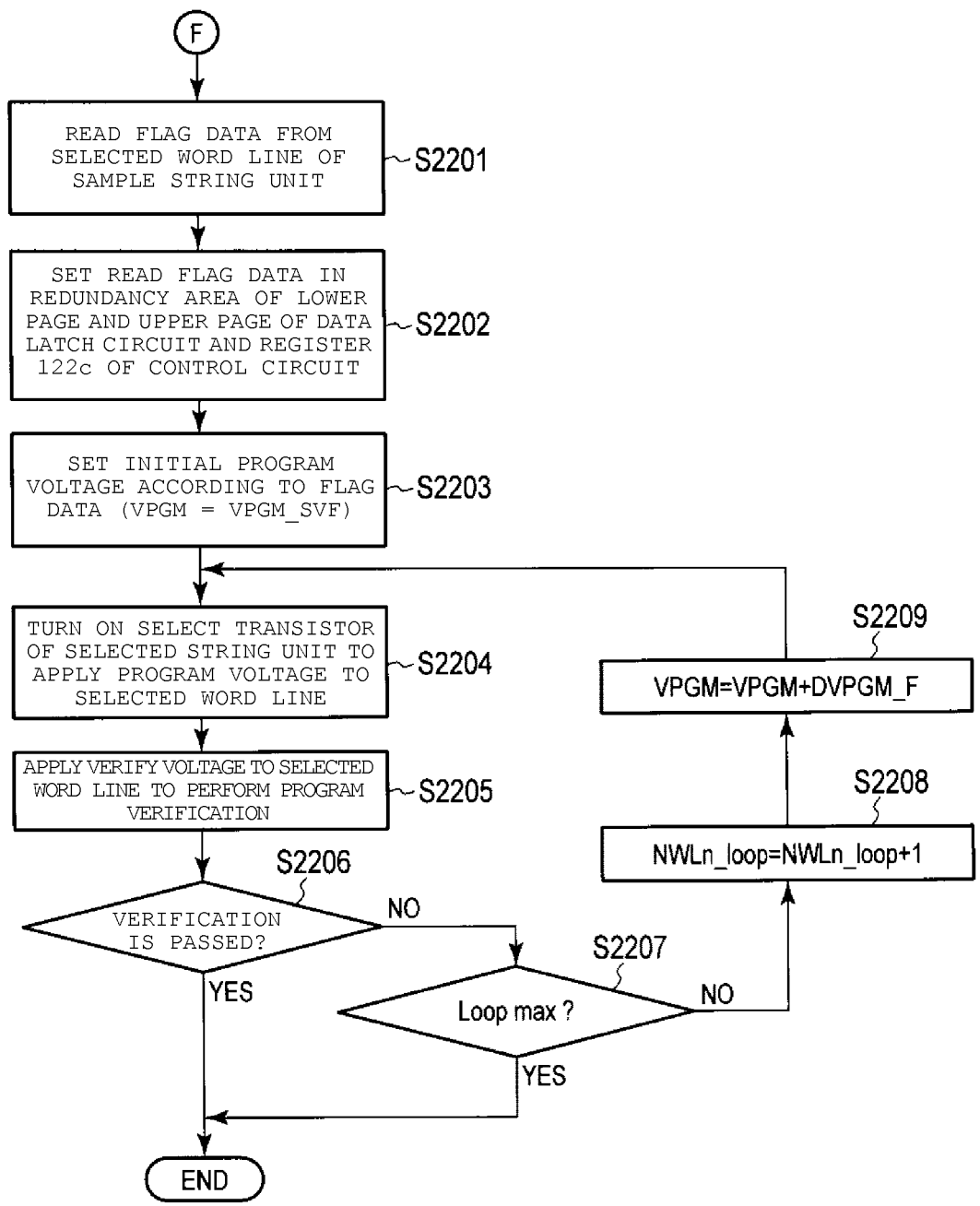
FIG. 28 is a flowchart showing the program operation of the semiconductor memory device according to the second embodiment.

In Step S2004, when the control circuit 122 determines that the designated string unit SUQ is not the same as the selected string unit SUP (S2004, NO), the control circuit 122 replaces the designated string unit SUQ as a sample string unit and performs the same operation as the operation described referring to FIG. 28.

In Regards to Functional Effects of Write Operation of Data According to Second Embodiment According to the above-described second embodiment, even when the second program operation is used, it is possible to obtain the same effects as in the first embodiment.

Third Embodiment

Subsequently, a memory system 100 according to a third embodiment will be described. The third embodiment is different from the first and second embodiments in that a multiplane structure with a plurality of memory cell arrays is provided. In the third embodiment, the structural elements having substantially same functions and configurations as those in the above-described first and second embodiments will be given the same notations, and duplicate description will be provided only when necessary.

Nonvolatile Semiconductor Memory Device According to Third Embodiment

Figure 30:
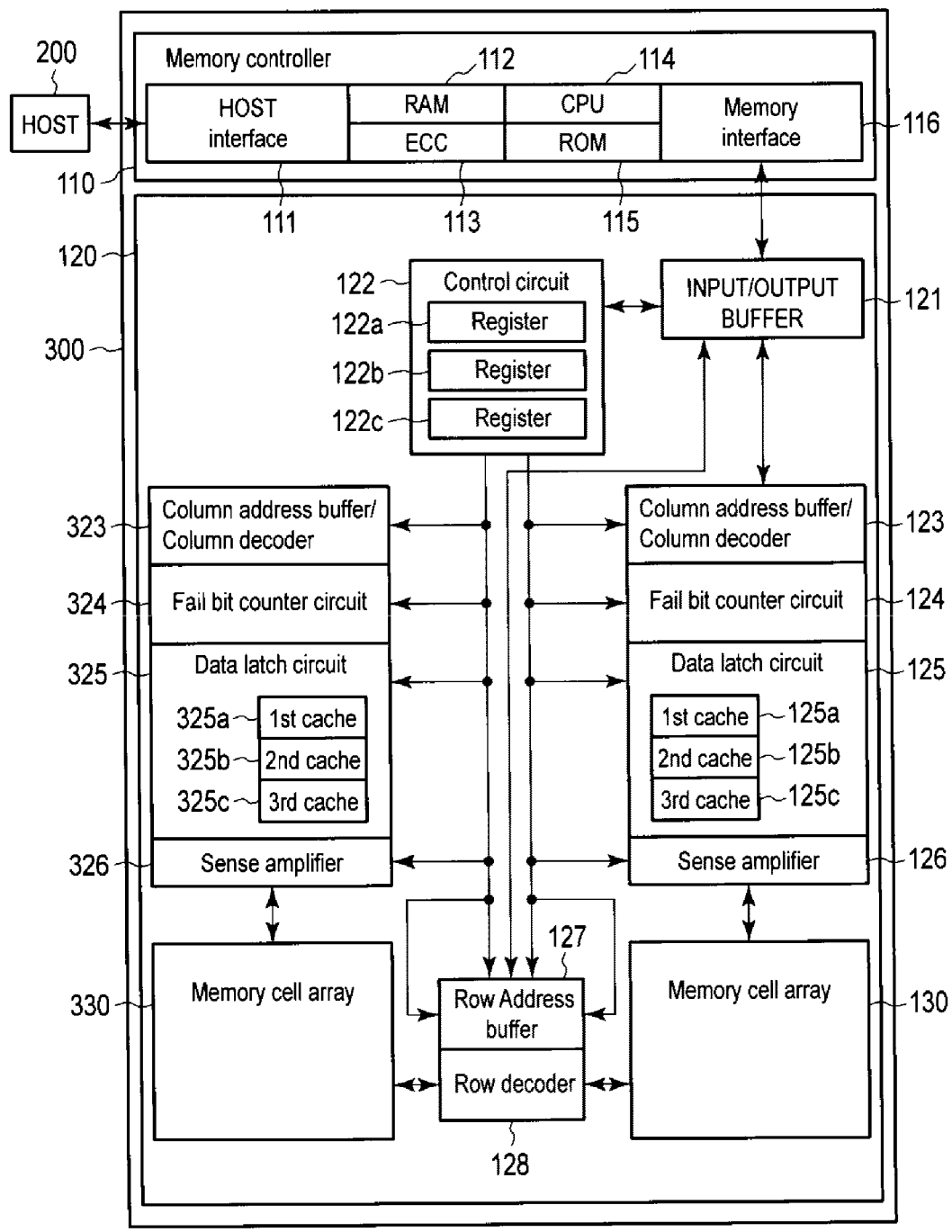
FIG. 30 is a block diagram showing a memory system according to a third embodiment.

First, a memory system 300 having a multiplane structure will be described referring to FIG. 30. A three-dimensional stacked nonvolatile semiconductor memory device according to the third embodiment will be described referring to FIG. 30.

The memory system 300 of the third embodiment has a memory controller 110 and a NAND flash memory 320.

NAND Flash Memory

The NAND flash memory 320 includes an input/output buffer 121, a control circuit 122, column address buffer/column decoders 123 and 323, fail bit counter circuits 124 and 324, data latch circuits 125 and 325, sense amplifiers 126 and 326, a row address buffer 127, a row decoder 128, and memory cell arrays 130 and 330. In this disclosure, the memory cell arrays 130 and 330 are respectively referred to as a first plane PB0 and a second plane PB1.

The column address buffer/column decoder 323, the fail bit counter circuit 324, the data latch circuit 325, the sense amplifier 326, and the memory cell array 330 respectively have the same configurations as the column address buffer/column decoder 123, the fail bit counter circuit 124, the data latch circuit 125, the sense amplifier 126, and the memory cell array 130.

The column address buffer/column decoder 323, the fail bit counter circuit 324, the data latch circuit 325, the sense amplifier 326, and the memory cell array 330 operate separately from the column address buffer/column decoder 123, the fail bit counter circuit 124, the data latch circuit 125, the sense amplifier 126, and the memory cell array 130.

The control circuit 122 is able to perform a program operation on the memory cell arrays 130 and 330 in parallel.

In Regards to Write Operation of Data According to Third Embodiment

Next, the program operation of the memory system 300 according to the third embodiment will be described referring to FIGS. 31 and 32.

It is assumed that the number of loops necessary until the capture operation on a predetermined word line WLn in the memory cell array 130 is completed (until at least the number NCHK_PASS of memory cell transistors exceeds the prescribed value NCHK_PV) is "a" (a: an integer equal to or greater than 1), and the number of loops necessary for the capture operation on the predetermined word line WLn in the memory cell array 330 is "b" (b: an integer equal to or greater than 1). When simultaneously performing the capture operation on the memory cell arrays 130 and 330, the control circuit 122 completes the capture operation of the memory cell arrays 130 and 330 when the capture operation of one of the memory cell arrays 130 and 330 ends.

For example, the control circuit 122 according to the third embodiment may receive the sample string unit designation command before the command sequence is received in the program operation to the memory cell array 130 (first plane PB0) and the memory cell array 330 (second plane PB1).

Command Sequence Example 5

A command sequence when the program operation is performed on the memory cell array 130 (first plane PB0) and the memory cell array 330 (second plane PB1) will be described referring to FIG. 31.

Figure 31:
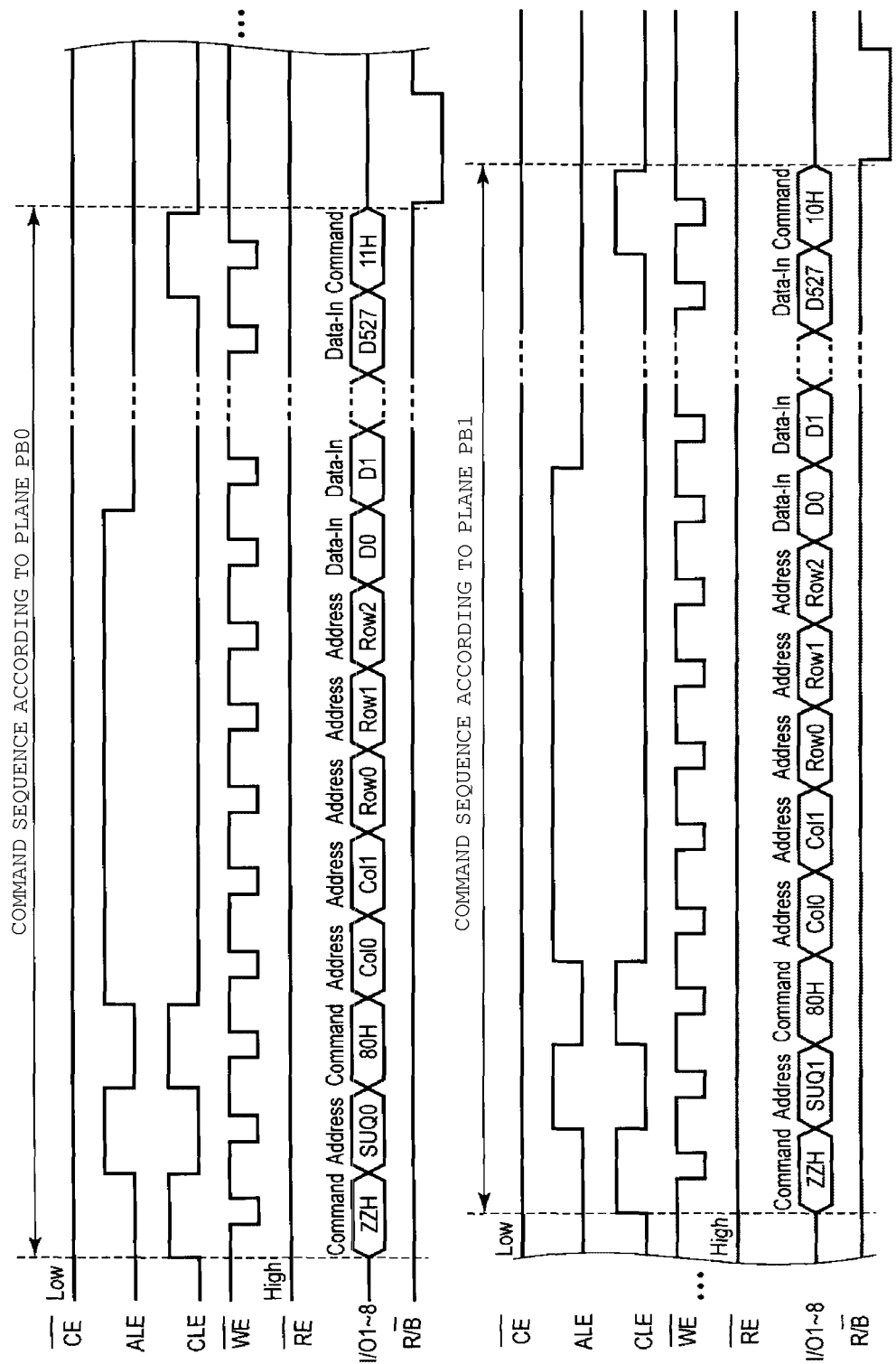
FIG. 31 is a diagram showing an example of a command sequence according to the third embodiment.

As shown in FIG. 31, before the command sequence is input from the memory controller 110 to the NAND flash memory 120, the chip enable signal CEn, the address latch enable signal ALE, and the command latch enable signal CLE are at "L (low)" level. The write enable signal WEn and the read enable signal REn are at "H (high)" level. The ready/busy signal (R/Bn) representing the ready/busy state of the data latch circuit 125 is in the "ready" state.

Subsequently, the sample string unit designation command "ZZH" is input from the memory controller 110 to the NAND flash memory 120 during a period in which the command latch enable signal CLE is at "H" level.

The NAND flash memory 120 receives an address from the memory controller 110 during a period in which the address latch enable signal ALE is at "H" level. The address includes the address of the designated string unit SUQ0, and is, for example, the address of the string unit SU0 of the memory cell array 130 (first plane PB0).

The command "80H" is input from the memory controller 110 to the NAND flash memory 120 during a period in which the command latch enable signal CLE is at "H" level, and the write enable signal WEn is at "L" level.

The NAND flash memory 120 receives an address from the memory controller 110 during a period in which the address latch enable signal ALE is at "H" level. The address includes the address of the selected string unit SUP, and is, for example, the address of the lower page of the word line WL2 of the string unit SU3 of the memory cell array 130 (first plane PB0).

The NAND flash memory 120 receives data after the address. With this, data is stored in the data latch circuit 125 associated with the memory cell array 130 (first plane PB0). A command "11H" is input from the memory controller 110 to the NAND flash memory 120 during a period in which the command latch enable signal CLE is at "H" level. With this, the memory controller 110 indicates that the input of data to be programmed in the memory cell array 130 to the data latch circuit 125 is completed.

Subsequently, the sample string unit designation command "ZZH" is input from the memory controller 110 to the NAND flash memory 120 during a period in which the command latch enable signal CLE is at "H" level.

The NAND flash memory 120 receives an address from the memory controller 110 during a period in which the address latch enable signal ALE is at "H" level. The address includes the address of the designated string unit SUQ1, and is, for example, the address of the string unit SU1 of the memory cell array 330 (second plane PB1).

The command "80H" is input from the memory controller 110 to the NAND flash memory 120 during a period in which the command latch enable signal CLE is at "H" level, and the write enable signal WEn is at "L" level.

The NAND flash memory 120 receives an address from the memory controller 110 during a period in which the address latch enable signal ALE is at "H" level. The address includes the address of the selected string unit SUP, and is, for example, the address of the lower page of the word line WL2 of the string unit SU3 of the memory cell array 330 (second plane PB1).

The NAND flash memory 120 receives data after the address. With this, data is stored in the data latch circuit 325 associated with the memory cell array 330 (second plane PB1). The command "10H" is input from the memory controller 110 to the NAND flash memory 120 during a period in which the command latch enable signal CLE is at "H" level. With this, the NAND flash memory 120 performs, on the memory cell array 130 (first plane PB0) and the memory cell array 330 (second plane PB1), the same operation as the operation described referring to the FIG. 16.

Specifically, in the memory cell array 130 (first plane PB0) and the memory cell array 330 (second plane PB1), the B-level read voltage BR is applied to the selected word line WL2, and flag data is read.

At this time, the control circuit 122 compares the read flag data (the number of loops) "a" with "b" in the memory cell array 130 (first plane PB0) and the memory cell array 330 (second plane PB1). The control circuit 122 derives a smaller value out of the numbers of loops "a" and "b". The control circuit 122 determines an initial program voltage for a program using the derived number of loops (flag data) in the memory cell array 130 (first plane PB0) and the memory cell array 330 (second plane PB1).

In Regards to Functional Effects of Write Operation of Data According to Third Embodiment According to the above-described third embodiment, in a nonvolatile semiconductor memory device using a multi-plane structure, it is possible to obtain the same effects as in the first and second embodiments.

Fourth Embodiment

Subsequently, a memory system 400 according to a fourth embodiment will be described. The fourth embodiment is different from the first and second embodiments in that a NAND flash memory is a planar NAND, instead of a three-dimensional stacked structure. In the fourth embodiment, the structural elements having substantially same functions and configurations as those in the above-described first and second embodiment will be given the same notations, and duplicate description will be provided only when necessary.

Figure 32:
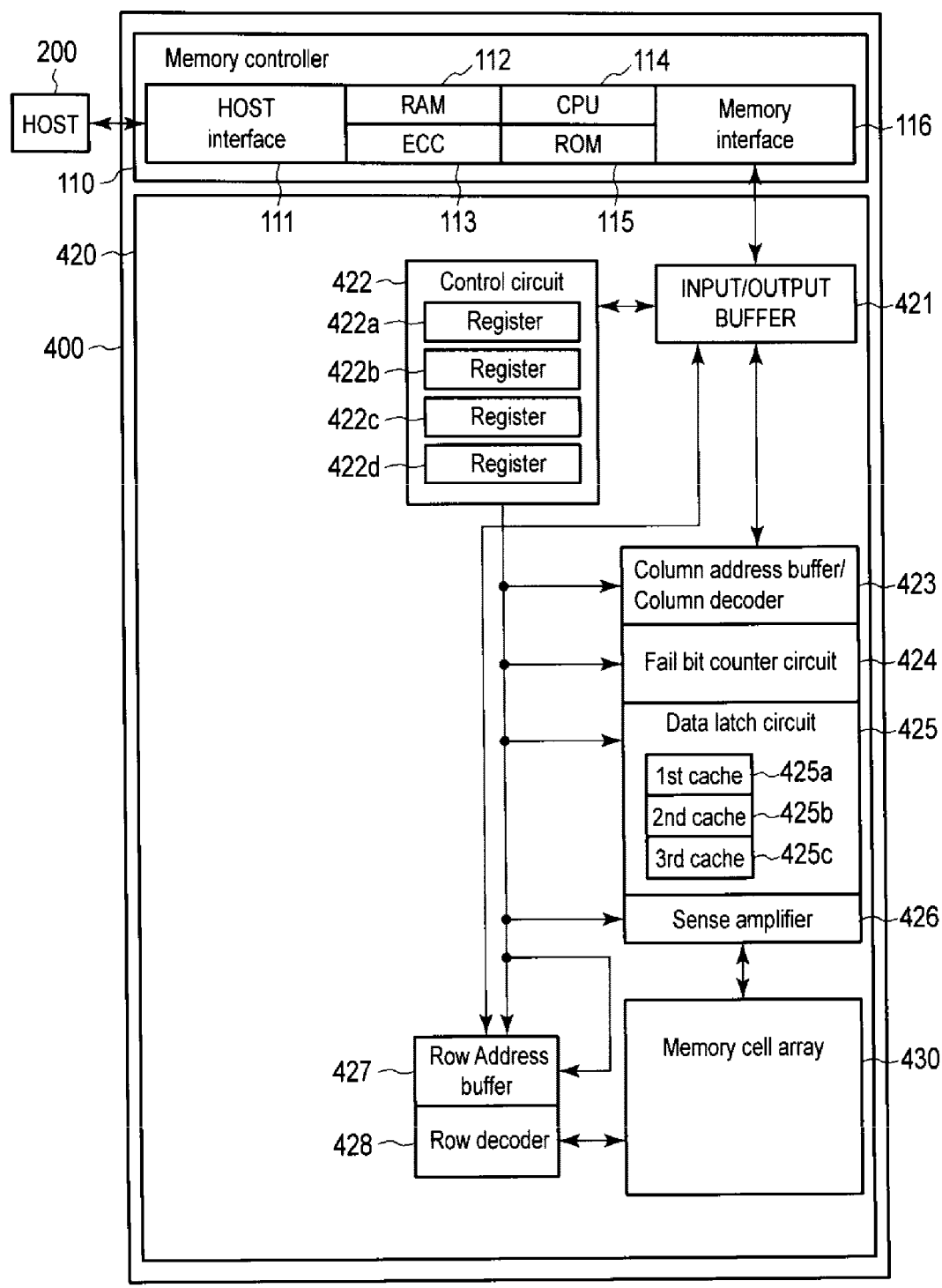
FIG. 32 is a block diagram showing a memory system according to a fourth embodiment.

The configuration of a NAND flash memory 420 according to the fourth embodiment will be schematically described referring to FIG. 32. FIG. 32 is a block diagram schematically showing the basic configuration of the NAND flash memory 420 according to the fourth embodiment.

The memory system 400 of the fourth embodiment has a memory controller 110 and a NAND flash memory (nonvolatile semiconductor memory device) 420.

NAND Flash Memory

The NAND flash memory 420 includes an input/output buffer 421, a control circuit 422, a column address buffer/column decoder 423, a fail bit counter circuit 424, a data latch circuit 425, a sense amplifier 426, a row address buffer 427, a row decoder 428, and a memory cell array 430. The input/output buffer 421, the column address buffer/column decoder 423, the fail bit counter circuit 424, the data latch circuit 425, the sense amplifier 426, the row address buffer 427, and the row decoder 428 have the same configurations as the input/output buffer 121, the column address buffer/column decoder 123, the fail bit counter circuit 124, the data latch circuit 125, the sense amplifier 126, the row address buffer 127, and the row decoder 128.

The control circuit 422 includes registers 422a, 422b, 422c, and 422d, and stores values necessary for computation in the control circuit 122.

The register 422a stores a prescribed value NCHK_PV or the like described below, and the register 422b stores a prescribed value NML2V_PV or the like. The registers 422c and 422d store a sample string unit described below or information (for example, eight-bit information) read from the lower page.

The control circuit 122 determines an initial program voltage for use during a program operation based on flag data stored in the register 122c.

The control circuit 122 compares the number of bits not programmed with the allowable number of bits set to determine whether the program operation is passed or failed.

The control circuit 122 includes an internal loop counter which counts the number of program pulse applications.

The memory cell array 430 includes a plurality of bit lines BL, a plurality of word lines WL, and a source line SL. The memory cell array 430 is configured with a plurality of blocks BLK in which electrically rewritable memory cell transistors (simply referred to as memory cells) MT are disposed in a matrix. Each memory cell transistor MT has, for example, a stacked gate including a control gate electrode and a charge storage layer (for example, a floating gate electrode), and stores multivalue data with change in the threshold value of the transistor determined by an electric charge amount injected into the floating gate electrode. The memory cell transistor MT has a metal-oxide-nitride-oxide-silicon (MONOS) structure in which an electron is trapped into a nitride film.

The memory cell array 430 may be as disclosed in U.S. patent application Ser. No. 12/397,711 filed Mar. 3, 2009 entitled "SEMICONDUCTOR MEMORY DEVICE HAVING PLURALITY OF TYPES OF MEMORIES INTEGRATED ON ONE CHIP", U.S. patent application Ser. No. 13/451,185 filed Apr. 19, 2012 entitled "SEMICONDUCTOR MEMORY DEVICE INCLUDING STACKED GATE HAVING CHARGE ACCUMULATION LAYER AND CONTROL GATE AND METHOD OF WRITING DATA TO SEMICONDUCTOR MEMORY DEVICE", U.S. patent application Ser. No. 12/405,626 filed Mar. 21, 2009 entitled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT", and U.S. patent application Ser. No. 09/956,986 filed Sep. 21, 2001 entitled "NONVOLATILE SEMICONDUCTOR MEMORY DEVICE HAVING ELEMENT ISOLATING REGION OF TRENCH TYPE AND METHOD OF MANUFACTURING THE SAME".

In this embodiment, for convenience, it is assumed that the memory cell array 430 has 128 word lines WL of word lines WL0 to WL127 per block.

Outline of Program Operation According to Fourth Embodiment

On the other hand, as a method which performs an upper page program, a method which reads a lower page corresponding to an upper page to be programmed and uses an upper page program using the read lower page data, and a method which receives the same data as data already programmed in a lower page from the outside and uses an upper page program using lower page data received from the outside are considered. However, an error may exist in data already programmed in the lower page.

Accordingly, in this embodiment, when performing the upper page program, the control circuit 422 performs a program using data of the lower page supplied from the host device 200 again without reading data of the lower page corresponding to the upper page. An initial program voltage of the upper page is determined using flag data stored in the register 422c or the 422d. In this embodiment, flag data derived from a lower page program of a predetermined word line WL is used during the program operation of the upper page of the same word line WL.

Next, the order of the program operation according to this embodiment will be described referring to FIG. 33. FIG. 33 shows the word line WL and "page number" corresponding to the lower page and the upper page. FIG. 33 shows a page which is related to flag information stored in the registers 422c and 422d during a predetermined program operation.

If flag data is acquired by the capture operation during the lower page program, the control circuit 422 copies and sets data stored in the register 422c to the register 422d. The control circuit 422 sets the acquired flag data in the register 422c. The control circuit 422 basically performs a program operation according to the page number in the drawing. In the program operation according to this embodiment, when the block address is changed in the middle of successive program operations, flag data in the registers 422c and 422d is reset to "FF" data.

Hereinafter, the details of the program operation according to this embodiment will be described.

Details of Write Operation of Data According to Fourth Embodiment

Figure 34:
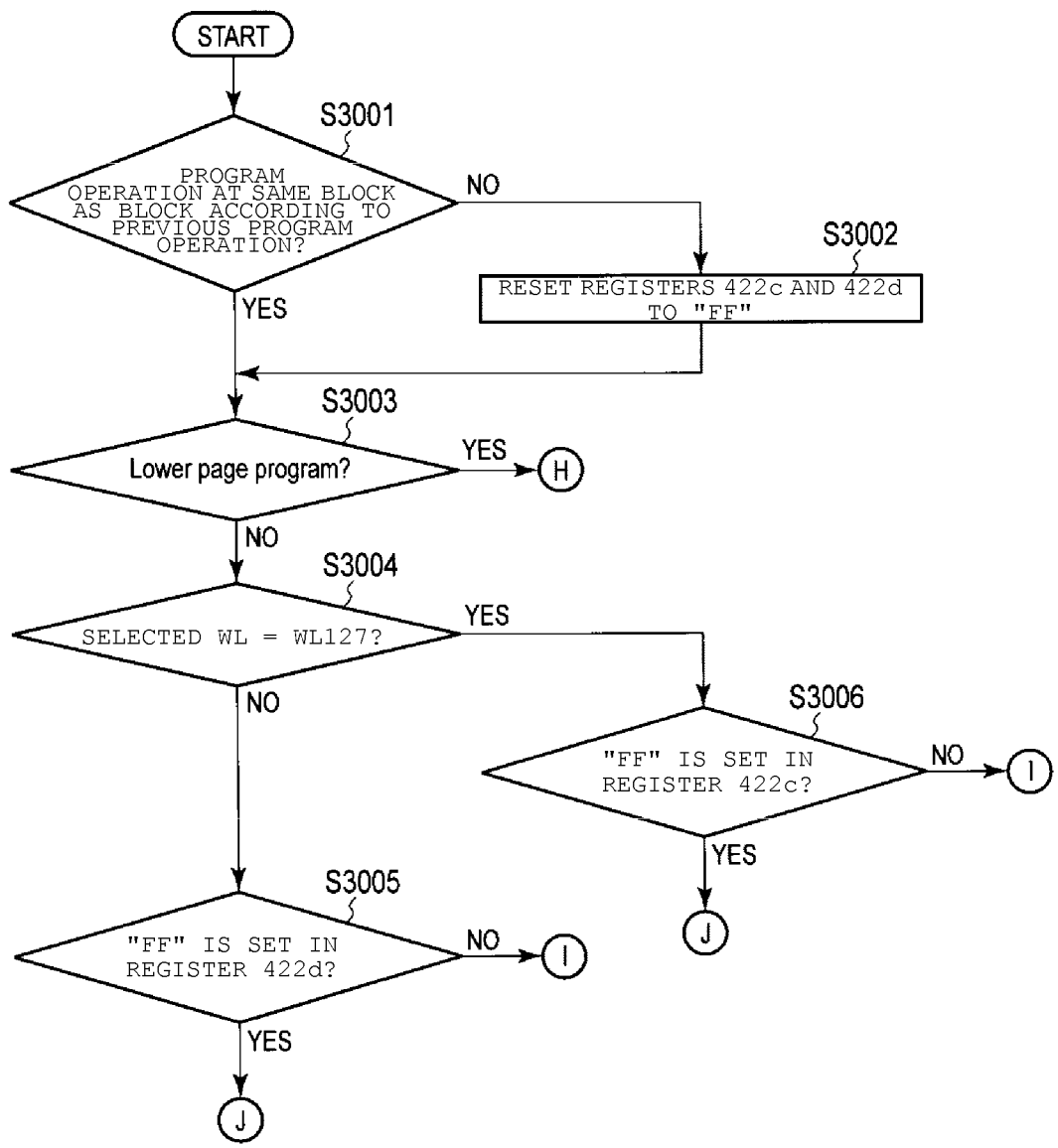
FIG. 34 is a flowchart showing a program operation of a semiconductor memory device according to the fourth embodiment.

A first program operation according to the fourth embodiment will be described referring to the flowchart shown in FIG. 34. Processing described below is primarily executed under the control of the control circuit 422.

S3001

If the program command, the block address, the address of the page, and the program start command are received from the memory controller 110, the control circuit 422 determines whether or not the block address is the same as a program address regarding to a program operation previous executed.

S3002

In Step S3001, when it is determined that the block address is not the same as the program address regarding the program operation previously executed (S3001, NO), the control circuit 422 resets flag data stored in the registers 422c and 422d to "FF".

S3003

In Step S3001, when it is determined that the block address is the same as the program address regarding the program operation previously executed (S3001, YES) or when the processing of Step S3002 is completed, the control circuit 422 determines whether or not the address of the page is the lower page.

S3004

In Step S3003, when it is determined that the address of the pages is not the lower page (S3003, NO), the control circuit 422 determines whether or not the selected word line WL is a word line to which the maximum number in the same block is allocated. In this embodiment, since there are 128 word lines WL, it is determined whether or not the selected word line WL is the word line WL127.

S3005

In Step S3004, when it is determined that the selected word line WL is not the word line WL127 (S3004, NO), control circuit 422 determines whether or not "FF" is set in the register 422d.

S3006

In Step S3004, when it is determined that the selected word line WL is the word line WL127 (S3004, YES), the control circuit 422 determines whether or not "FF" is set in the register 422c.

When "YES" in Step S3003

Figure 35:
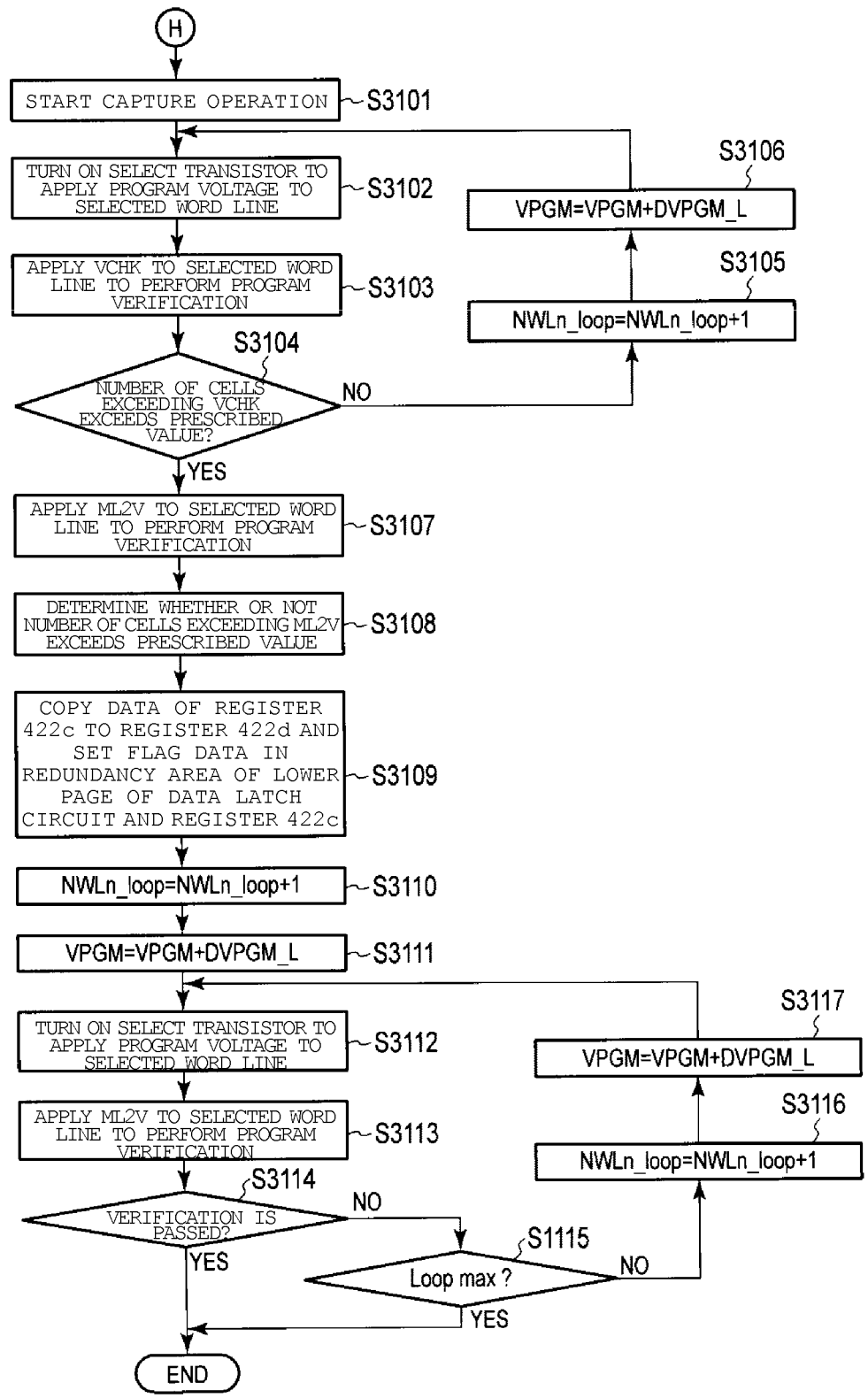
FIG. 35 is a flowchart showing the program operation of the semiconductor memory device according to the fourth embodiment.

Next, a case where, in Step S3003, the control circuit 122 determines that the received address of the page is the address of the lower page (S3003, YES) will be described referring to the flowchart shown in FIG. 35.

In this embodiment, similarly to the method described referring to FIG. 8 in the first embodiment, the capture operation is performed as a part of the lower page program.

S3101 to S3108

The operations of Steps S3101 to S3108 are the same as the operations of Steps S1101 to S1108.

S3109

Next, the operation of Step S3109 will be described referring to FIG. 33.

If flag data is acquired, the control circuit 422 copies and sets data stored in the register 422c to the register 422d. The control circuit 422 sets the acquired flag data in the register 422c.

For example, as shown in FIG. 33, during the program operation on the lower page (page 0) of the word line WL0, for example, "FF" data stored in the register 422c is copied to the register 422d. Flag data corresponding to the page "0" is written in the register 422c.

As shown in FIG. 33, during the program operation on the lower page (page 1) of the word line WL1, for example, flag data corresponding to the page "0" stored in the register 422c is copied to the register 422d. Flag data corresponding to the page "1" is written in the register 422c.

S3110 to S3117

The operations of Steps S3110 to S3117 are the same as the operations of Steps S1110 to S1117.

The control circuit 422 repeats the operations of Step S3112 to S3117 until it is determined that a verify operation of Step S3114 is passed or when it is determined in Step S3115 that the number of loops is a maximum value.

When "NO" in Step S3005

Next, a case where, in Step S3005, the control circuit 422 determines that "FF" is not stored in the register 422c (S3005, NO) will be described referring to the flowchart of FIG. 36.

In the upper page program, the control circuit 422 receives lower page data from the memory controller 110 without performing the read operation of lower page data corresponding to upper page data, and performs the upper page program. An initial program voltage for an upper page program is determined using flag data stored in the register 422d.

S3201

The control circuit 422 reads flag data from the register 422d.

The control circuit 422 receives data of the lower page corresponding to the upper page from the memory controller 110 and stores the received data in the first cache 425a. The control circuit 422 receives data of the upper page from the memory controller 110 and stores the received data in the second cache 425b. The control circuit 122 stores the read flag data in the redundancy area 132b stored in the first cache 425a and the redundancy area 133b stored in the second cache 425b.

S3202

As shown in FIG. 33, the control circuit 422 determines an initial program voltage VPGM (VPGM=VPGM_SVU) for an upper page based on flag data stored in the register 422d.

A method of determining the initial program voltage VPGM for an upper page is performed in the same manner as the method described in Step S1203 of FIG. 12 of the first embodiment.

S3203 to S3208

The operations of Steps S3203 to S3208 are the same as the operations of Steps S1204 to S1209.

The control circuit 422 repeats the operations of Step S3203 to S3208 until it is determined a verify operation of Step S3205 is passed or when it is determined in Step S3206 that the number of loops is a maximum value.

When "YES" in Step S3005

Next, a case where, in Step S3005, the control circuit 422 determines that "FF" is stored in the register 422*d* (S3005, YES) will be described referring to the flowchart of FIG. 37.

As described above, in the upper page program of this embodiment, the control circuit 422 determines the initial program voltage for an upper page program using flag data stored in the register 422*d*. However, when "FF" is stored in the register 422*d*, the control circuit 422 does not determine the initial program voltage for an upper page program using flag data "FF". "FF" means that flag data regarding a block being currently programmed is not stored in the register 422*d*. For this reason, the control circuit 422 performs the read operation of lower page data corresponding to the upper page and acquires only flag data out of the read data. The control circuit 422 stores the acquired flag data in the register 422*c*. The control circuit 422 determines the initial program voltage for an upper page program using the acquired flag data. The details will be described below.

S3301

The control circuit 422 applies the B-level read voltage BR to the selected word line WLn, thereby reading lower page data corresponding to the upper page. The control circuit 422 acquires only flag data out of the read lower page data. At this time, the read lower page data is not used for the upper page program.

S3302

The control circuit 422 stores data (the same data as data already programmed in the lower page) of the lower page received from the memory controller 110 in the first cache 425*a*. Simultaneously, the control circuit 422 stores the read flag data written in the redundancy area 132*b* of the lower page 132 in the redundancy area 132*b* of the lower page stored in the first cache 425*a*.

The control circuit 422 stores data of the upper page in the second cache 425*b*.

The control circuit 422 stores the read flag data of the redundancy area 132*b* of the lower page 132 in the redundancy area 133*b* of the upper page 133 stored in the second cache 425*b*. The control circuit 422 stores the acquired flag data in the register 422*c*.

S3303

Next, the control circuit 422 determines the initial program voltage VPGM (VPGM=VPGM_SVU) for an upper page based on the read flag data of the redundancy area 132*b* of the lower page 132.

S3304 to S3309

The operations of Steps S3304 to S3309 are the same as the operations of Steps S1204 to S1209.

The control circuit 422 repeats the operations of Steps S3304 to S3309 until it is determined that a verify operation of Step S3306 is passed or when it is determined in Step S3307 that the number of loops is a maximum value.

When "NO" in Step S3006

Next, a case where, in Step S3006, the control circuit 422 determines that "FF" is not stored in the register 422*c* (S3006, NO) will be described.

Figure 36:
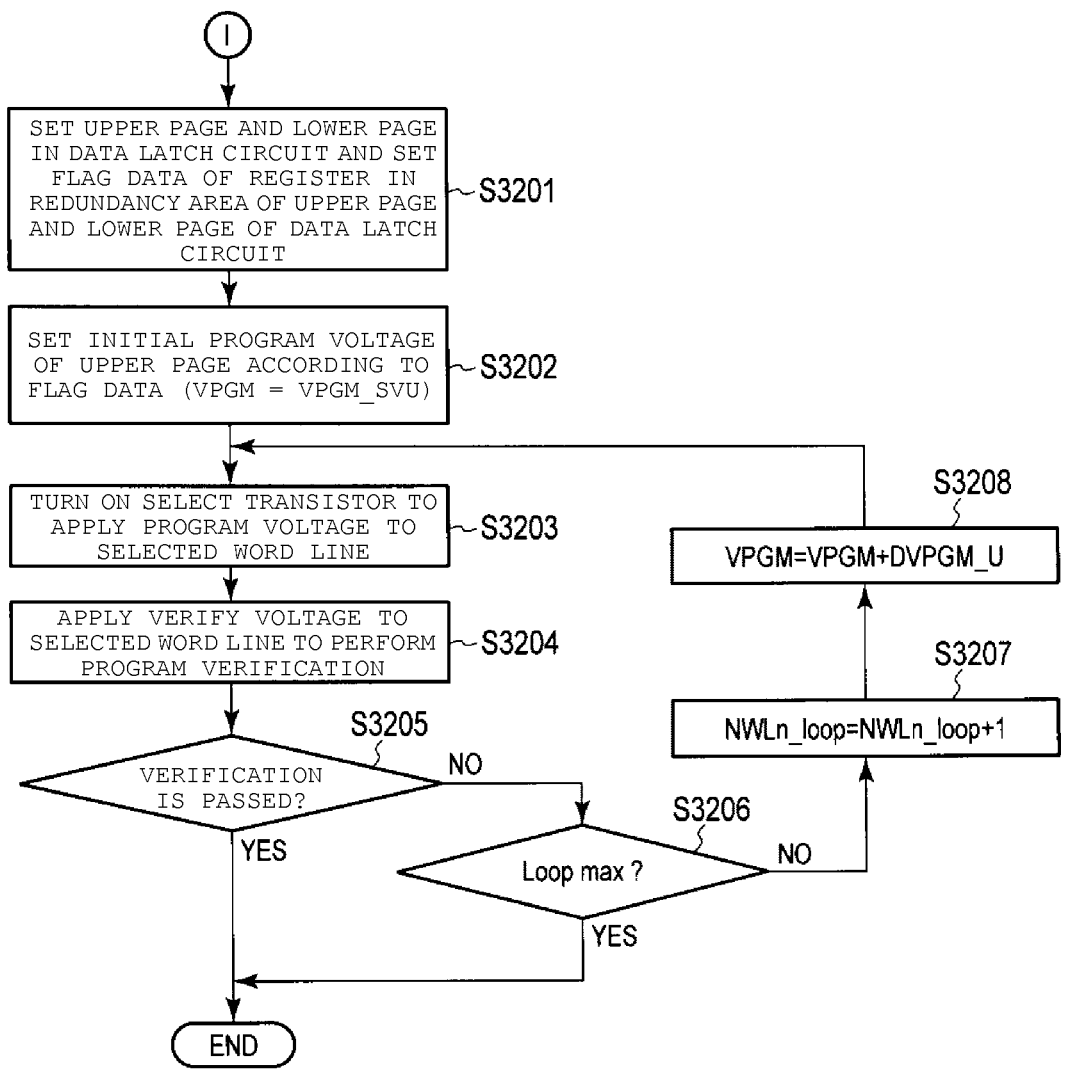
FIG. 36 is a flowchart showing the program operation of the semiconductor memory device according to the fourth embodiment.

In the upper page program, as described referring to FIG. 36, the control circuit 422 receives lower page data from the memory controller 110 without performing the read operation of lower page data corresponding to upper page data, and performs the upper page program. Since the word line WL to be subjected to the upper page program is the word line WL127, the initial program voltage for an upper page program is determined using flag data stored in the register 422*c*, instead of the register 422*d*.

The basic operation is the same as the operation described referring to FIG. 36. As shown in FIG. 33, Step S3203 is different from the operation described referring to FIG. 36 in that the control circuit 422 determines the initial program voltage VPGM (VPGM=VPGM_SVU) for an upper page based on flag data stored in the register 422*c*.

As shown in FIG. 33, in the upper page (page "255") of the word line WL127, if flag data of the register 422*d* is used, flag data regarding the lower page of the word line WL126 is referred to according to the program order of this embodiment, and inappropriate flag data is used. Accordingly, when performing the upper page program of the word line WL to which the maximum number in a predetermined block is allocated, the initial program voltage for an upper page is determined based on flag data stored in the register 422*c*.

When "YES" in Step S3006

Figure 37:
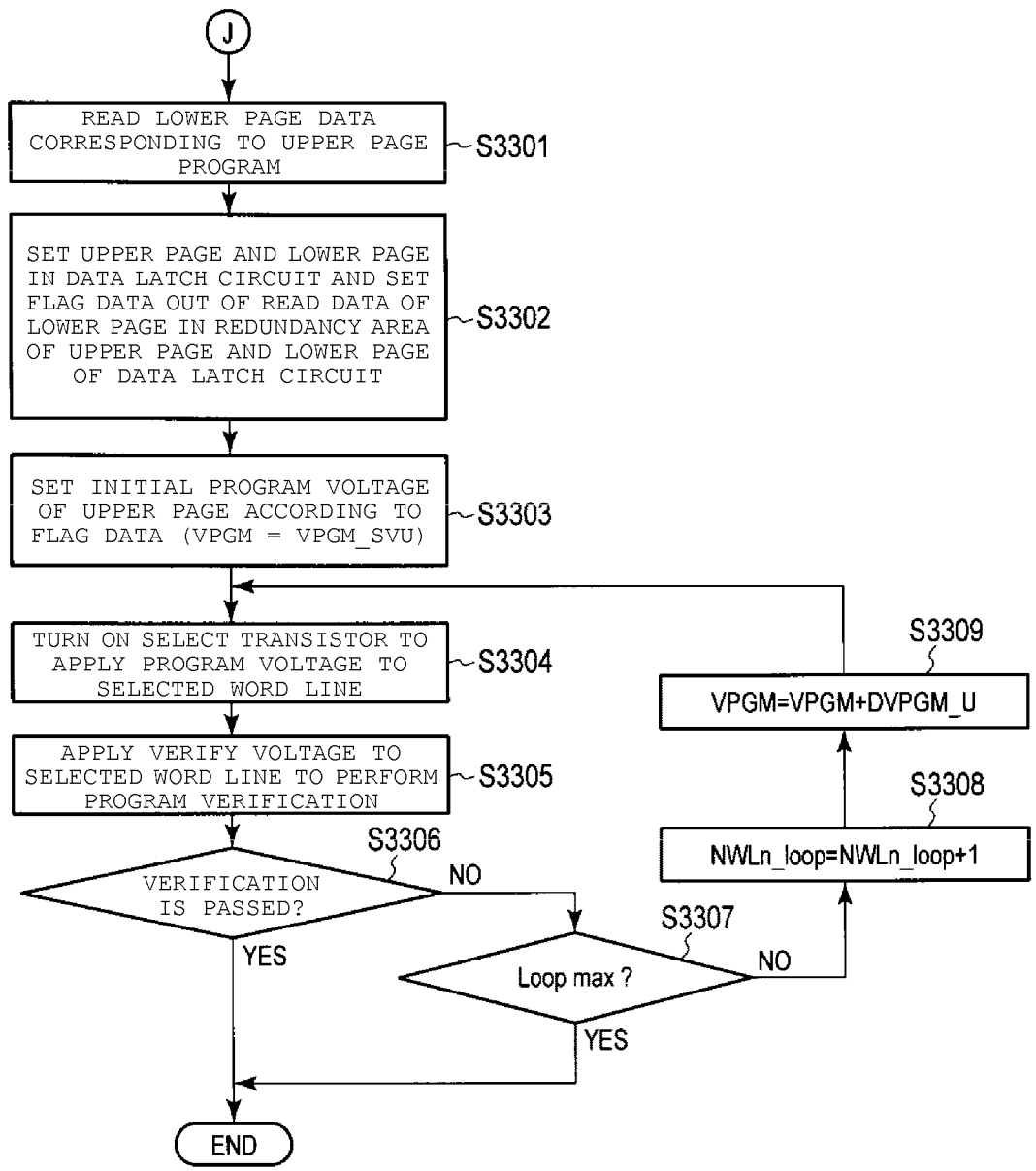
FIG. 37 is a flowchart showing the program operation of the semiconductor memory device according to the fourth embodiment.

Next, in Step S3006, when the control circuit 422 determines that "FF" is stored in the register 422*c* (S3006, YES), the control circuit 422 performs the same operation as the operation described referring to FIG. 37.

Command Sequence Example 6

Next, a command sequence regarding the upper page program will be described referring to FIG. 38.

Figure 38:
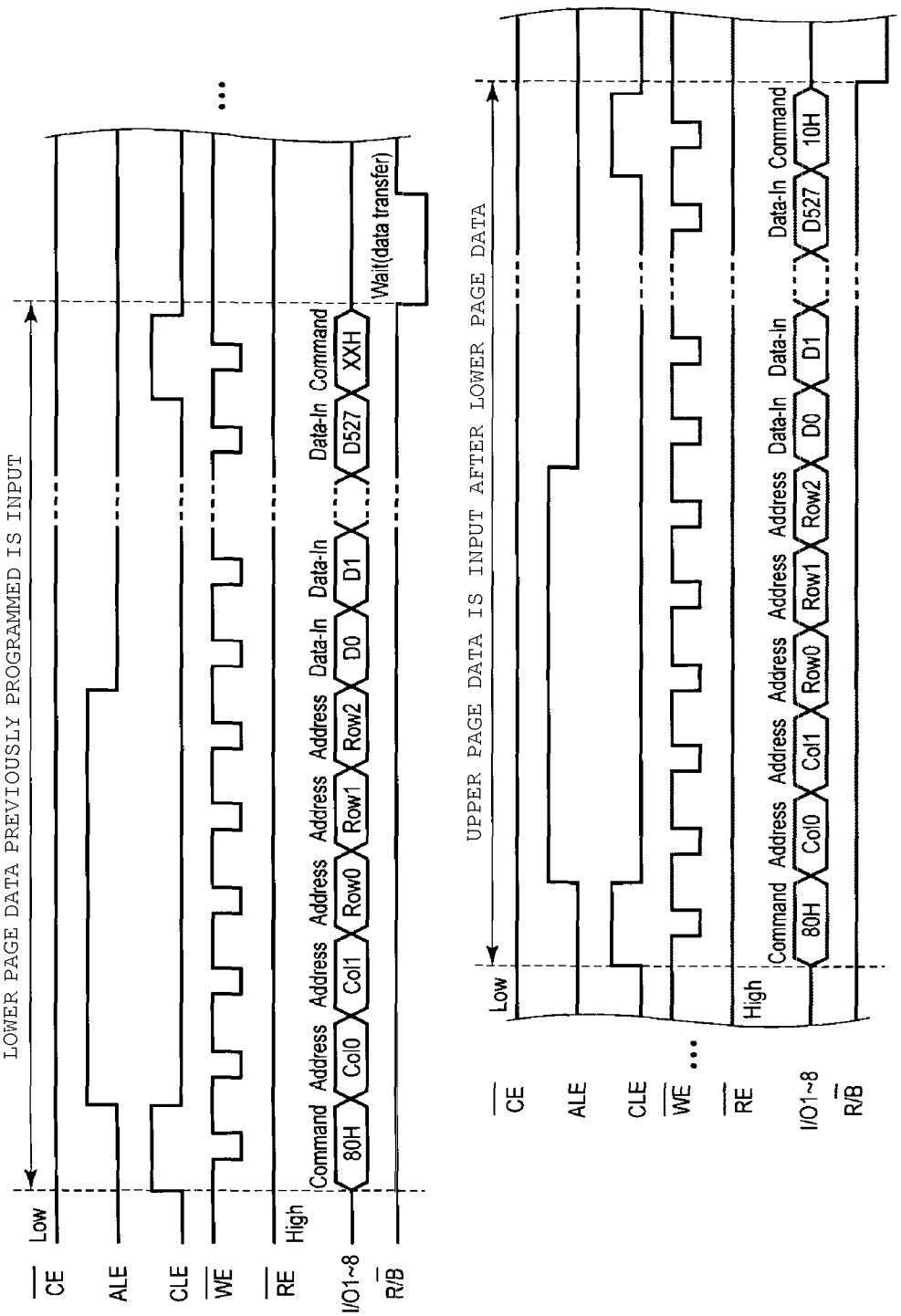
FIG. 38 is a diagram showing an example of a command sequence according to the fourth embodiment.

As described in FIG. 38, the same operation as the operation described referring to FIG. 8 is performed until the input of data to the NAND flash memory 420 is completed. A command "XXH" is input from the memory controller 110 to the NAND flash memory 420 during a period in which the command latch enable signal CLE is at "H" level. With this, data stored in the first cache 425*a* is stored in other caches. With this, the ready/busy signal (R/Bn) is in the "busy" state.

If the ready/busy signal (R/Bn) is in the "ready" state, the command sequence regarding to the upper page is input to the NAND flash memory 420 by the same method as the method described referring to FIG. 33.

In Regards to Functional Effects of Write Operation of Data According to Fourth Embodiment According to the above-described fourth embodiment, even when a planar NAND flash memory is used, it is possible to obtain the same effects as in the first embodiment.

According to the fourth embodiment, when executing the upper page program, data regarding the lower page is received from the memory controller 110. For example, when lower page data written in the memory cell transistor includes an error, it is not desirable to perform the upper page program using lower page data with an error. However, according to this embodiment, when executing the upper page program, since lower page data corresponding to the upper page is received from the memory controller 110, it is possible to suppress such problem. As a result, according to this embodiment, it is possible to provide a high-quality semiconductor memory device.

Modification Examples and the Like

According to the above-described embodiments, although, when performing the upper page program during the first program operation, the control circuit 122 reads flag data stored in the sample string unit or the register 122c to determine the initial program voltage for the upper page program, the embodiments are not limited thereto. When performing the upper page program, the control circuit 122 requires lower page data corresponding to the upper page. As will be understood from the above-described embodiments, flag data of the sample string unit has been already programmed in the lower page. For this reason, when lower page data corresponding to the upper page is read, flag data included in the lower page may be stored in the register 122c, and the initial program voltage for an upper page may be determined using flag data. With this, the control circuit 122 may suppress the read operation of flag data to the sample string unit.

In the above-described first embodiment, it is described that a voltage obtained by adding the offset voltage to the initial program voltage VPGM_SVL for a lower page program or a voltage obtained by subtracting the offset voltage from the initial program voltage VPGM_SVL may be set as the initial program voltage VPGM_SVU for an upper page program. Similarly, a voltage obtained by adding the offset voltage to the initial program voltage VPGM_SVL for a lower page program or a voltage obtained by subtracting the offset voltage from the initial program voltage VPGM_SVL may be used as the initial program voltage VPGM_SVL for a lower page program. In the above-described embodiments, although a case where the memory cell transistor MT holds two bits is described, the embodiments are not limited thereto. For example, the memory cell transistor MT may hold three or more-bit data.

In the above-described embodiments, although the data latch circuit 125 includes three caches, the embodiments are not limited thereto, and at least two caches may be provided.

The above-described embodiments may be modified as follows.

(1) In the Read Operation

A voltage which is applied to a selected word line during the read operation of the A level is, for example, 0 V to 0.55 V. The embodiments are not limited thereto, and the voltage may be in any range of 0.1 V to 0.24 V, 0.21 V to 0.31 V, 0.31 V to 0.4 V, 0.4 V to 0.5 V, and 0.5 V to 0.55 V.

A voltage which is applied to a selected word line during the read operation of the B level is, for example, 1.5 V to 2.3V. The embodiments are not limited thereto, and the voltage may be in any range of 1.65 V to 1.8 V, 1.8 V to 1.95 V, 1.95 V to 2.1 V, and 2.1 V to 2.3 V.

A voltage which is applied to a selected word line during the read operation of the C level is, for example, 3.0 V to 4.0V. The embodiments are not limited thereto, and the voltage may be in any range of 3.0 V to 3.2 V, 3.2 V to 3.4 V, 3.4 V to 3.5 V, 3.5 V to 3.6 V, and 3.6 V to 4.0 V.

The time (tR) of the read operation may be, for example, 25 μs to 38 μs, 38 μs to 70 μs, or 70 μs to 80 μs.

(2) As described above, the write operation includes the program operation and the verify operation. In the write operation, a voltage which is initially applied to a selected word line during a program operation is, for example, 13.7 V to 14.3 V. The embodiments are not limited thereto, and the voltage may be, for example, in any range of 13.7 V to 14.0 V and 14.0 V to 14.6 V.

A voltage which is initially applied to a selected word line during writing in an odd-numbered word line and a voltage which is initially applied to a selected word line during writing in an even-numbered word line may be changed.

When a program operation is performed based on an incremental step pulse program (ISPP) system, a step-up voltage is, for example, about 0.5 V.

A voltage which is applied to an unselected word line may be, for example, in a range of 6.0 V to 7.3 V. The embodiments are not limited to this case, and the voltage may be, for example, in a range of 7.3 V to 8.4 V or may be equal to or less than 6.0 V.

A path voltage may be changed according to whether an unselected word line is an odd-numbered word line or an even-numbered word line.

The time (tProg) of the write operation may be, for example, in any range of 1,700 μs to 1,800 μs, 1,800 μs to 1,900 μs, and 1,900 μs to 2,000 μs.

(3) In an Erase Operation

A voltage which s applied a well formed in the upper part of the semiconductor substrate with the memory cell disposed thereabove is, for example, 12 V to 13.6 V. The embodiments are not limited to this case, and the voltage may be, for example, in any range of 13.6 V to 14.8 V, 14.8 V to 19.0 V, 19.0 V to 19.8 V, and 19.8 V to 21 V.

The time (tErase) of the erase operation may be, for example, in any range of 3,000 μs to 4,000 μs, 4,000 μs to 5,000 μs, and 4,000 μs to 9,000 μs.

(4) A memory cell has a structure in which a charge storage layer is disposed on a semiconductor substrate (silicon substrate) through a tunnel insulating film having a thickness of 4 to 10 nm. The charge storage layer may have a stacked structure in which an insulating film, such as SiN or SiON, having a thickness of 2 to 3 nm and polysilicon having a thickness of 3 to 8 nm are stacked. A metal, such as Ru, may be added to polysilicon. An insulating film is provided on the charge storage layer. The insulating film has, for example, a silicon oxide film having a thickness of 4 to 10 nm sandwiched between a lower High-k film having a thickness of 3 to 10 nm and an upper High-k having a thickness of 3 to 10 nm. As the High-k film, HfO or the like is exemplified. The thickness of the silicon oxide film may be greater than the thickness of the High-k film. A control electrode having a thickness of 30 nm to 70 nm is formed on the insulating film through a material for work function adjustment having a thickness of 3 to 10 nm. Examples of the material for work function adjustment include a metal oxide film, such as TaO, and a metal nitride film, such as TaN. For the control electrode, W or the like may be used.

An air gap may be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a memory cell array including:
        a first memory string including a first memory cell and a second memory cell; and
        a second memory string including a third memory cell;
    a bit line connected to both one end of the first memory string and one end of the second memory string;
    a first word line connected to a gate of the first memory cell and a gate of the third memory cell;

a second word line connected to a gate of the second memory cell; and a control circuit configured to determine a program condition for a write operation for the first memory cell that has been selected, and set a program condition for a write operation for the third memory cell based on the program condition for the write operation for the first memory cell, wherein data corresponding to the program condition for the write operation for the first memory cell is stored by the control circuit in one or more memory cells of a redundancy area of the memory cell array, the one or more memory cells being connected to the first word line.

2. The device according to claim 1, wherein the control circuit is configured to determine the program condition for the write operation for the first memory cell upon receiving a first command and a first address corresponding to the first memory cell.

3. The device according to claim 1, wherein the control circuit includes a first register capable of holding the program condition for the write operation for the first memory cell.

4. The device according to claim 1, wherein the control circuit is configured to determine the program condition for the write operation for the first memory cell by successively applying increasing program voltages to the first memory cell until a predetermined minimum number of memory cells whose gates are commonly connected to the gate of the first memory cell pass program verification.

5. The device according to claim 1, wherein data to be written to the first memory cell in the write operation for the first memory cell includes a lower page data and an upper page data.

6. The device according to claim 5, wherein the program condition for writing the lower page data to the first memory cell is different from the program condition for writing the upper page data to the first memory cell.

7. The device according to claim 1, wherein the first memory string further includes a first selection transistor, the second memory string further includes a second selection transistor, and the control circuit is configured to control gates of the first and second selection transistor independently.

8. The device according to claim 1, wherein the control circuit is configured to successively perform a first write operation, a second write operation, and a third write operation, the first write operation corresponding to the write operation for the first memory cell, the second write operation corresponding to the write operation for the third memory cell, the third write operation corresponding to a write operation for the second memory cell.

9. A memory system, comprising:
a semiconductor memory device including:
  a memory cell array:
    a first memory string including a first memory cell and a second memory cell, and
    a second memory string including a third memory cell,
    a bit line connected to both one end of the first memory string and one end of the second memory string,
    a first word line connected to a gate of the first memory cell and a gate of the third memory cell,
    a second word line connected to a gate of the second memory cell, and
    a first controller configured to determine a program condition for a write operation for the first memory cell upon receiving a first command and a first address corresponding to the first memory cell, the first controller being configured to set a program condition for a write operation for the third memory cell based on the program condition for the write operation for the first memory cell; and
a second controller configured to output the first command and the first address before receiving a write command for the third memory cell, wherein data corresponding to the program condition for the write operation for the first memory cell is stored by the first controller in one or more memory cells of a redundancy area of the memory cell array, the one or more memory cells being connected to the first word line.

10. The memory system according to claim 9, wherein the first controller includes a first register capable of holding the program condition for the write operation for the first memory cell.

11. The memory system according to claim 9, wherein the first controller is configured to determine the program condition for the write operation for the first memory cell by successively applying increasing program voltages to the first memory cell until a predetermined minimum number of memory cells whose gates are commonly connected to the gate of the first memory cell pass program verification.

12. The memory system according to claim 9, wherein data to be written to the first memory cell in the write operation for the first memory cell includes a lower page data and an upper page data.

13. The memory system according to claim 12, wherein the program condition for writing the lower page data to the first memory cell is different from the program condition for writing the upper page data to the first memory cell.

14. The memory system according to claim 9, wherein the first memory string further includes a first selection transistor, the second memory string further includes a second selection transistor, and the first controller is configured to control gates of the first and second selection transistor independently.

15. The device according to claim 9, wherein the first controller is configured to successively perform a plurality of write operations including a first write operation, a second write operation, and a third write operation, the first write operation corresponding to the write operation for the first memory cell, the second write operation corresponding to the write operation for the third memory cell, the third write operation corresponding to a write operation for the second memory cell.

* * * * *